US009312392B2

(12) United States Patent
Yamazaki et al.

(10) Patent No.: US 9,312,392 B2
(45) Date of Patent: Apr. 12, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masahiko Hayakawa, Tochigi (JP); Daisuke Matsubayashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/272,867

(22) Filed: May 8, 2014

(65) Prior Publication Data
US 2014/0339542 A1 Nov. 20, 2014

(30) Foreign Application Priority Data

May 16, 2013 (JP) ................................ 2013-104583

(51) Int. Cl.
*H01L 29/10* (2006.01)
*H01L 29/12* (2006.01)
*H01L 29/786* (2006.01)

(52) U.S. Cl.
CPC ...... *H01L 29/7869* (2013.01); *H01L 29/78648* (2013.01); *H01L 29/78696* (2013.01)

(58) Field of Classification Search
CPC ..................... H01L 29/7869; H01L 29/78696; H01L 29/78648
See application file for complete search history.

(56) References Cited

U.S. PATENT DOCUMENTS

| 5,731,856 | A  | 3/1998 | Kim et al. |
| 5,744,864 | A  | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Victor A Mandala
(74) *Attorney, Agent, or Firm* — Robinson Intellectual Property Law Office; Eric J. Robinson

(57) ABSTRACT

A semiconductor device includes a dual-gate transistor in which an oxide semiconductor film is provided between a first gate electrode and a second gate electrode. In the channel width direction of the transistor, a side surface of each of the first and second gate electrodes is on the outer side of a side surface of the oxide semiconductor film. The first or second gate electrode faces the side surface of the oxide semiconductor film with the gate insulating film provided between the first or second gate electrode and the oxide semiconductor film.

22 Claims, 32 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,164,152 B2 | 4/2012 | Lee et al. |
| 8,207,531 B2 | 6/2012 | Takahashi et al. |
| 8,237,166 B2 | 8/2012 | Kumomi et al. |
| 8,274,079 B2 | 9/2012 | Yamazaki |
| 8,373,237 B2 | 2/2013 | Park et al. |
| 8,384,080 B2 | 2/2013 | Taniguchi et al. |
| 8,692,252 B2 | 4/2014 | Takata et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1* | 3/2008 | Iwasaki ............... H01L 29/7869 257/79 |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0051935 A1 | 3/2010 | Lee et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0244029 A1 | 9/2010 | Yamazaki et al. |
| 2011/0049509 A1 | 3/2011 | Takahashi et al. |
| 2011/0204368 A1 | 8/2011 | Tsubuku et al. |
| 2012/0205651 A1 | 8/2012 | Lee et al. |
| 2012/0211745 A1 | 8/2012 | Ueda et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2011-124360 | 6/2011 |
| JP | 2011-138934 | 7/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung,T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000 ° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

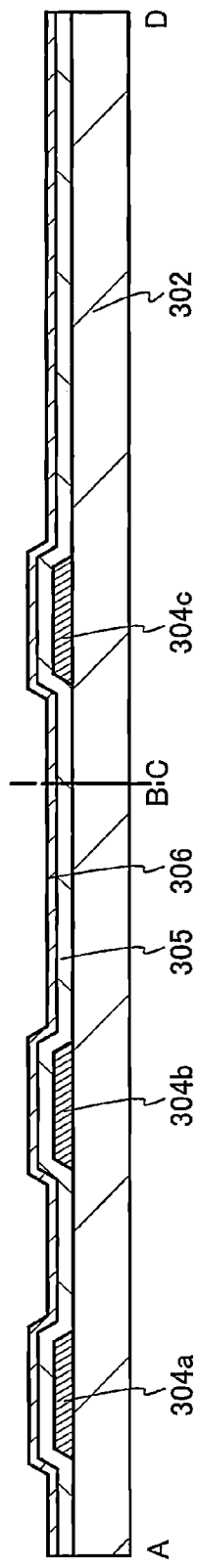
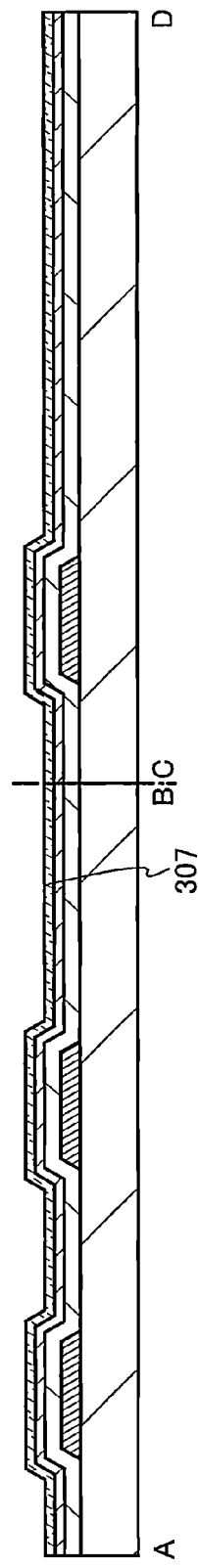
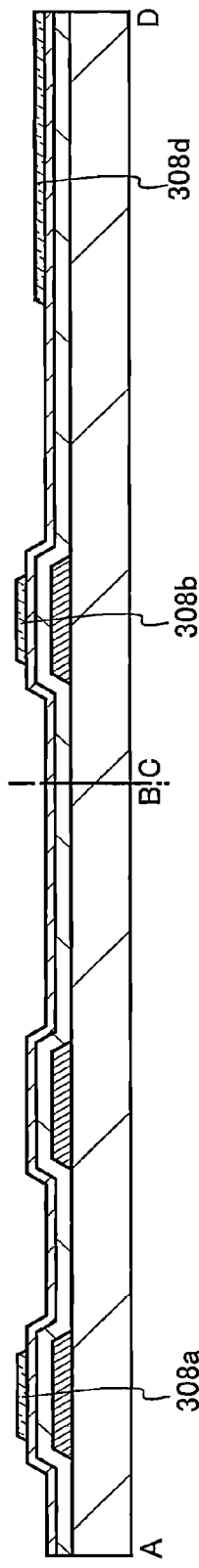
FIG. 12A
FIG. 12B
FIG. 12C

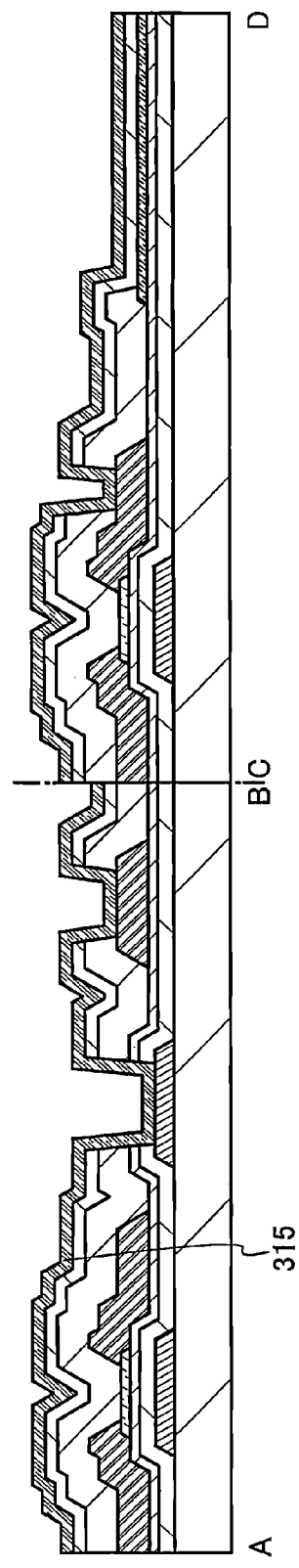
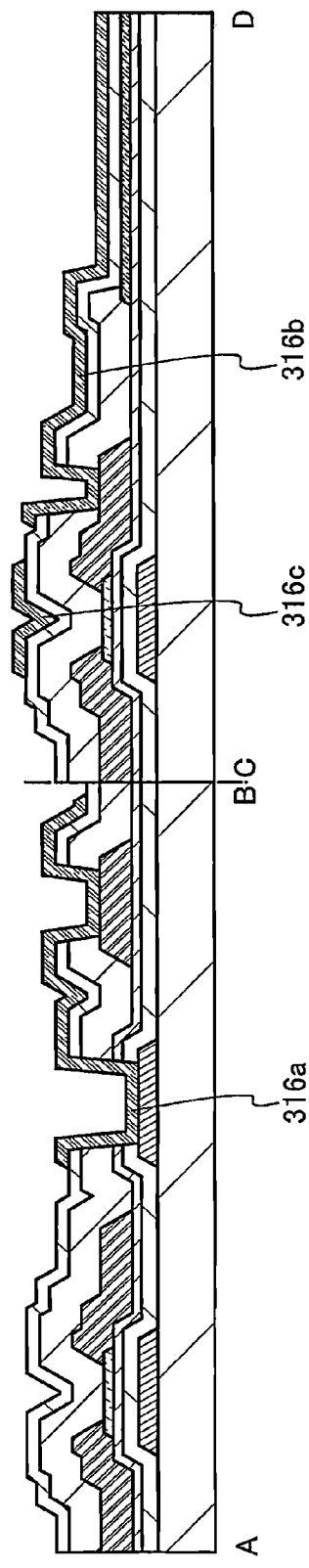
FIG. 15A
FIG. 15B

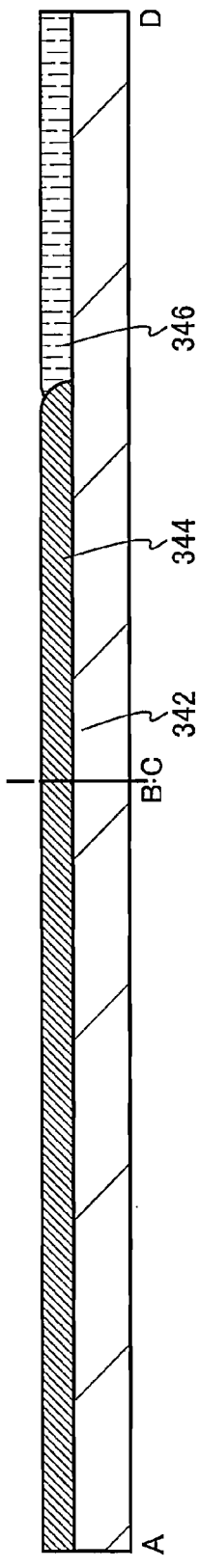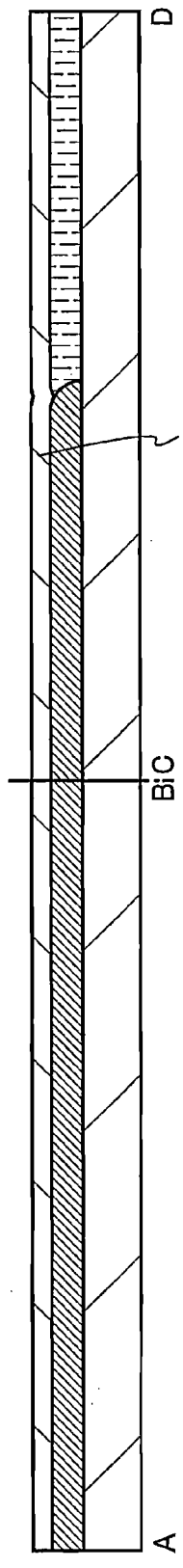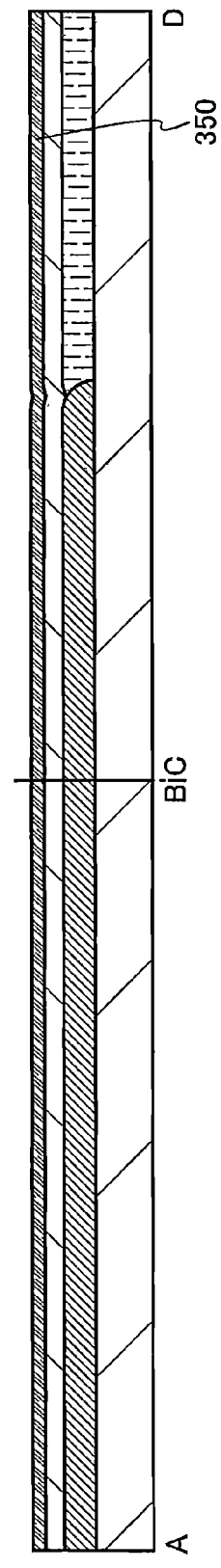

SEMICONDUCTOR DEVICE

BACKGROUND OF THE INVENTION

1. Field of the Invention

The present invention relates to a semiconductor device having a transistor including an oxide semiconductor film and a method for manufacturing the semiconductor device.

2. Description of the Related Art

Attention has been focused on a technique for forming a transistor using a semiconductor thin film formed over a substrate (also referred to as thin film transistor (TFT)). Such a transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer of the transistor is disclosed (see Patent Document 1).

Further, a technique of improving carrier mobility by forming stacked oxide semiconductor layers has been disclosed (see Patent Documents 2 and 3).

REFERENCE

Patent Document

[Patent Document 1] Japanese Published Patent Application No. 2006-165528
[Patent Document 2] Japanese Published Patent Application No. 2011-138934
[Patent Document 3] Japanese Published Patent Application No. 2011-124360

SUMMARY OF THE INVENTION

One embodiment of the present invention provides a semiconductor device including a transistor having excellent electrical characteristics (e.g., on-state current, field-effect mobility, or frequency characteristics). Another embodiment of the present invention provides a semiconductor device including a transistor with high reliability.

Another embodiment of the present invention is a semiconductor device including a dual-gate transistor in which an oxide semiconductor film is provided between a first gate electrode and a second gate electrode. In the channel width direction of the transistor, a side surface of each of the first and second gate electrodes is on the outer side of a side surface of the oxide semiconductor film.

Another embodiment of the present invention is a semiconductor device including a dual-gate transistor in which an oxide semiconductor film is provided between a first gate electrode and a second gate electrode. In a log-log graph of the amount of change in the threshold voltage of the transistor with respect to stress time, the interval of the logarithmic scale on the horizontal axis is equal to that on the vertical axis, the angle between the power approximate line of the amount of change in the threshold voltage with respect to stress time and a straight line indicating that the amount of change in the threshold voltage is 0 V is less than 30 degrees, and the amount of change in the threshold voltage when the stress time is 0.1 hours is smaller than 0.2 V. Note that the stress time means a time during which a load such as voltage or temperature is applied to the transistor.

Another embodiment of the present invention is a semiconductor device including a dual-gate transistor in which an oxide semiconductor film is provided between a first gate electrode and a second gate electrode. In a log-log graph of the amount of change in the threshold voltage of the transistor with respect to stress time, the interval of the logarithmic scale on the horizontal axis is equal to that on the vertical axis, the slope of a power approximate line of the amount of change in the threshold voltage with respect to stress time is less than or equal to 0.5, and the amount of change in the threshold voltage when the stress time is 0.1 hours is smaller than 0.2 V.

Note that the first or second gate electrode may face the side surface of the oxide semiconductor film with the gate insulating film provided between the first or second gate electrode and the oxide semiconductor film.

Alternatively, the first gate electrode may face the second gate electrode on the outer side of the oxide semiconductor film with an insulating film provided between the first and second gate electrodes.

The above-described transistor can be a channel-etched transistor. The distance between a pair of electrodes over the oxide semiconductor film can be greater than or equal to 1 µm and less than 4 µM.

The oxide semiconductor film includes an oxide containing In, M (M is Al, Ga, Y, Zr, La, Ce, or Nd), and Zn and can be formed using a sputtering target in which the proportion of In is higher than or equal to that of M in an atomic ratio.

According to one embodiment of the present invention, a semiconductor device including a transistor having excellent electrical characteristics (e.g., on-state current, field-effect mobility, or frequency characteristics) can be provided. In addition, according to one embodiment of the present invention, a semiconductor device including a transistor with high reliability can be provided.

BRIEF DESCRIPTION OF THE DRAWINGS

FIGS. 12A to 12C are cross-sectional views illustrating one embodiment of a method for manufacturing a semiconductor device.

FIGS. 15A and 15B are cross-sectional views illustrating one embodiment of a method for manufacturing a semiconductor device.

FIGS. 16A to 16C are cross-sectional views illustrating one embodiment of a method for manufacturing a semiconductor device.

DETAILED DESCRIPTION OF THE INVENTION

Figure 1:
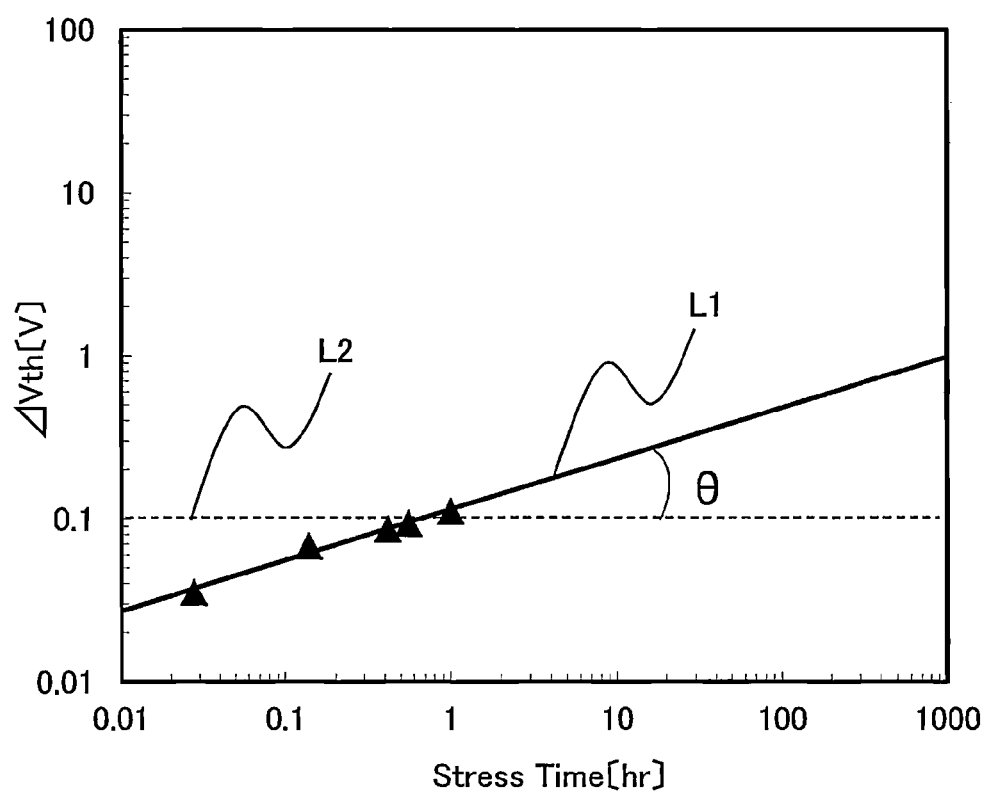
FIG. 1 is a graph for describing reliability of a transistor.

Embodiments of the present invention are described in detail below with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed.

(Embodiment 1)

In this embodiment, a semiconductor device that is one embodiment of the present invention and a manufacturing method thereof are described with reference to drawings.

Figure 2A:
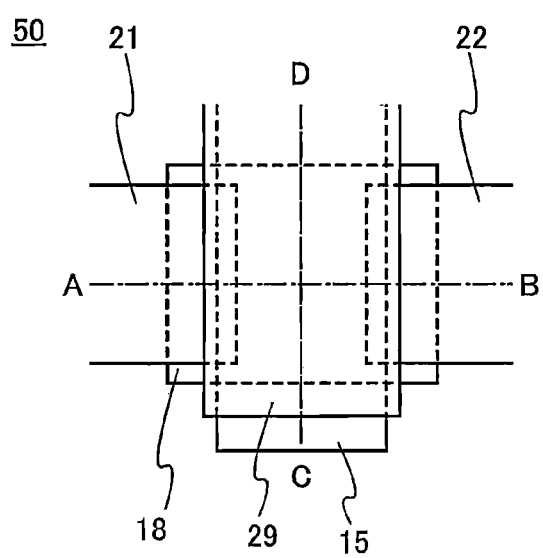
FIGS. 2A to 2D are a top view and cross-sectional views illustrating one embodiment of a transistor.
Figure 2C:
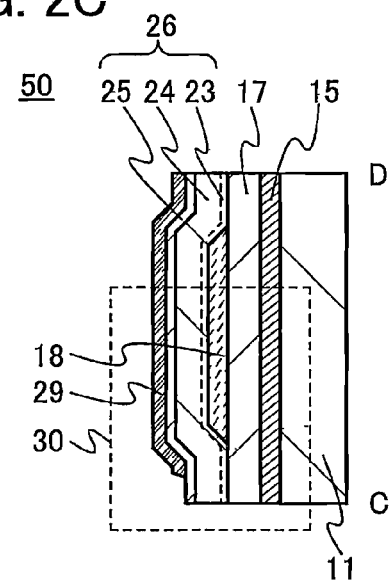
Figure 2B:
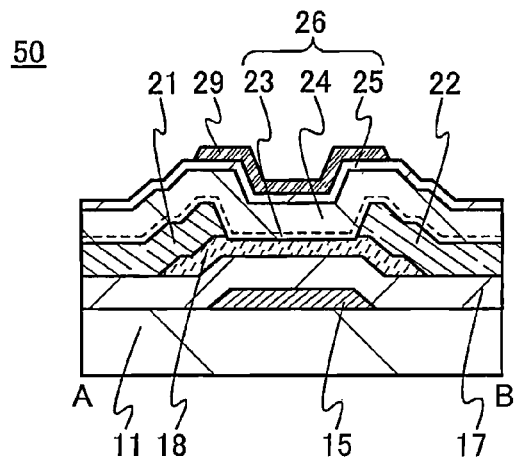

A top view and cross-sectional views of a transistor 50 included in a semiconductor device are illustrated in FIGS. 2A to 2C. The transistor 50 illustrated in FIGS. 2A to 2D is a channel-etched transistor. FIG. 2A is a top view of the transistor 50, FIG. 2B is a cross-sectional view taken along dashed-dotted line A-B in FIG. 2A, and FIG. 2C is a cross-sectional view taken along dashed-dotted line C-D in FIG. 2A. Note that in FIG. 2A, a substrate 11, a gate insulating film 17, an oxide insulating film 23, an oxide insulating film 24, a nitride insulating film 25, and the like are omitted for simplicity.

The transistor 50 illustrated in FIGS. 2B and 2C includes a gate electrode 15 over the substrate 11; the gate insulating film 17 over the substrate 11 and the gate electrode 15; an oxide semiconductor film 18 overlapping with the gate electrode 15 with the gate insulating film 17 positioned therebetween; a pair of electrodes 21 and 22 in contact with the oxide semiconductor film 18; a protective film 26 over the gate insulating film 17, the oxide semiconductor film 18, and the pair of electrodes 21 and 22; and a gate electrode 29 overlapping with the oxide semiconductor film 18 with the protective film 26 positioned therebetween. Further, the protective film 26 includes the oxide insulating film 23, the oxide insulating film 24, and the nitride insulating film 25.

The transistor 50 described in this embodiment has a dual-gate transistor in which a plurality of gate electrodes are included and the oxide semiconductor film 18 is provided between the plurality of gate electrodes. In the channel width direction in FIG. 2C, an end portion of the gate electrode 29 is positioned on the outer side of the oxide semiconductor film 18. Further, in the channel width direction, the gate electrode 29 faces a side surface of the oxide semiconductor film 18 with the protective film 26 positioned therebetween. Furthermore, in the channel width direction, the gate electrode 15 faces the gate electrode 29 on the outer side of the oxide semiconductor film 18 with the gate insulating film 17 and the protective film 26 positioned therebetween.

Figure 2D:
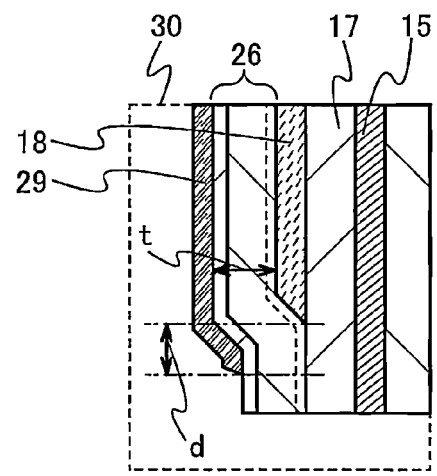

FIG. 2D is an enlarged view of a portion surrounded by a dashed line 30 in FIG. 2C. The positions of end portions of the gate electrode 15, the oxide semiconductor film 18, and the gate electrode 29 are described with reference to FIG. 2D.

As shown in FIG. 2D, when the distance between the end portion of the oxide semiconductor film 18 and the end portion of the gate electrode 29 is referred to as a distance d and the thickness of the protective film 26 is referred to as a thickness t, the distance d is preferably smaller than or equal to the thickness t. The distance d is made smaller than or equal to the thickness t, whereby an electric field of the gate electrode 29 can exert an influence on the end portion of the oxide semiconductor film 18 and thus the whole oxide semiconductor film 18 including its end portion can serve as a channel.

Defects are formed at an end portion of the oxide semiconductor film processed by etching or the like because of damage due to the processing, and the end portion of the oxide semiconductor film is polluted by attachment of impurities, or the like. Thus, when stress such as an electric field or the like is imposed, the end portion of the oxide semiconductor film is easily activated to be n-type (have low resistance). Thus, in this embodiment, end portions of the oxide semiconductor film 18 that overlap with the gate electrode 15 are likely to be n-type. When the n-type end portions are formed between the pair of electrodes 21 and 22, the n-type regions serve as carrier paths, resulting in formation of a parasitic channel. However, as illustrated in FIG. 2C, when an end portion of the gate electrode 29 is positioned on the outer side of the oxide semiconductor film 18, generation of a parasitic channel at the side surface of the oxide semiconductor film 18 and its vicinity is suppressed because of an electric field of the gate electrode 29. As a result, the transistor has excellent electrical characteristics with which drain current is drastically increased at the threshold voltage.

By providing the gate electrodes 15 and 29 and setting the potentials of the gate electrodes 15 and 29 to be the same, a region of the oxide semiconductor film 18 through which carriers flow is enlarged in the film thickness direction; thus, the number of transferred carriers is increased. As a result, the on-state current and the field-effect mobility of the transistor 50 are increased.

Further, an electric field from the outside can be blocked by the gate electrodes 15 and 29; thus, charges of charged particles and the like that are formed between the substrate 11 and the gate electrode 15 and over the gate electrode 29 do not affect the oxide semiconductor film 18. Therefore, degradation in a stress test (e.g., a negative gate bias temperature (−GBT) stress test in which negative charges are applied to a gate) can be reduced, and changes in the rising voltages of on-state current at different drain voltages can be reduced. Note that this effect causes when the gate electrodes 15 and 29 have the same potential or different potentials.

The BT stress test is one kind of accelerated test and can evaluate, in a short time, change in characteristics (i.e., change over time) of transistors, which is caused by long-term use. In particular, the amount of change in threshold voltage of the transistor between before and after the BT stress test is an important indicator when examining the reliability of the transistor. As the amount of change in the threshold voltage between before and after the BT stress test is small, the transistor has higher reliability.

By providing the gate electrodes 15 and 29 and setting the potentials of the gate electrodes 15 and 29 to be the same, the amount of change in the threshold voltage is reduced. Accordingly, variation in electrical characteristics among a plurality of transistors is also reduced.

The transistor 50 has a small amount of change in the threshold voltage between before and after a +GBT stress test in which positive charges are applied to a gate.

FIG. 1 shows a power approximate line L1 showing the amount of change in the threshold voltage ($\Delta V_{th}$) with respect to stress time between before and after a gate BT (GBT) stress test in which positive charges are applied to a gate in the transistor 50 described in this embodiment. When test time (stress time) and the amount of change in the threshold voltage are plotted on a graph, the plotted values can be approximated by a power approximate line. The power approximate line is a straight line in a log-log graph. In FIG. 1 that is a log-log graph, the horizontal axis indicates a logarithm of stress time and the vertical axis indicates a logarithm of the amount of change in the threshold voltage. The conditions of the stress test are as follows: the substrate temperature is 60° C.; the measurement environment is a dark room (dark environment); the gate voltage is +30 V; and stress is applied to a transistor for a given period, e.g., 1 hour.

Since the power approximate line L1 is a straight line in the log-log graph of FIG. 1, when the interval of the logarithmic scale on the horizontal axis is equal to that on the vertical axis, the angle θ between the power approximate line L1 of the transistor 50 described in this embodiment and a straight line indicating that the threshold voltage is not changed with respect to stress time ($\Delta V_{th}$ is 0 V), in other words, a straight line L2 indicated by a dashed line in FIG. 1 having a slope of 0 is less than 30 degrees or less than 25 degrees. Note that the description that the interval of the logarithmic scale on the horizontal axis is equal to that on the vertical axis means that, for example, the interval between 0.01 hours to 0.1 hours on the horizontal axis (stress time becomes 10 times) is the same as the interval between 0.01 V to 0.1 V on the vertical axis ($\Delta V_{th}$ becomes 10 times).

As the angle θ is smaller, a transistor has a smaller amount of change in the threshold voltage over time and higher reliability.

In FIG. 1, when the horizontal axis is x and the vertical axis is y, the power approximate line can be represented by Formula 1. Note that b and C are each a constant, and b corresponds to the slope of the power approximate line.

[Formula 1]

$$y = Cx^b \tag{1}$$

In the transistor 50 described in this embodiment, the slope b of the power approximate line L1 is less than or equal to 0.5 V/hr or less than or equal to 0.4 V/hr, and $\Delta V_{th}$ when the stress time is 0.1 hours is smaller than 0.2 V or smaller than 0.5 V.

As the slope b of the power approximate line L1 is smaller, a transistor has a smaller amount of change in the threshold voltage over time and higher reliability. As $\Delta V_{th}$ when the stress time is 0.1 hours is smaller, a transistor has higher reliability at initial operation. As a result, a transistor in which the slope b of the power approximate line L1 is less than or equal to 0.5 V/hr or less than or equal to 0.4 V/hr and $\Delta V_{th}$ when the stress time is 0.1 hours is smaller than 0.2 V or smaller than 0.5 V has high reliability.

Figure 3A:
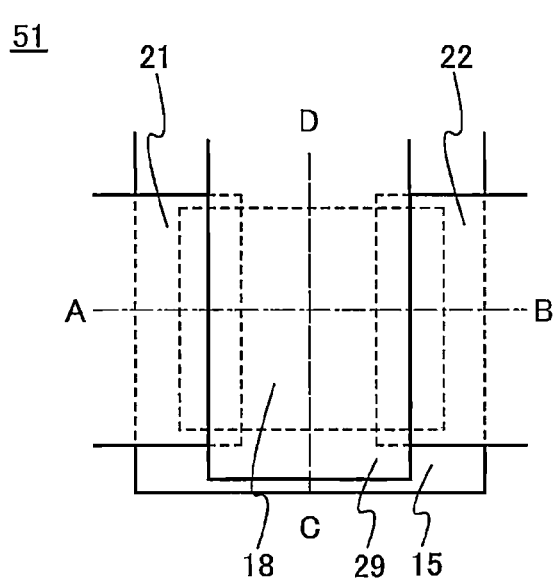
FIGS. 3A to 3C are a top view and cross-sectional views illustrating one embodiment of a transistor.
Figure 3C:
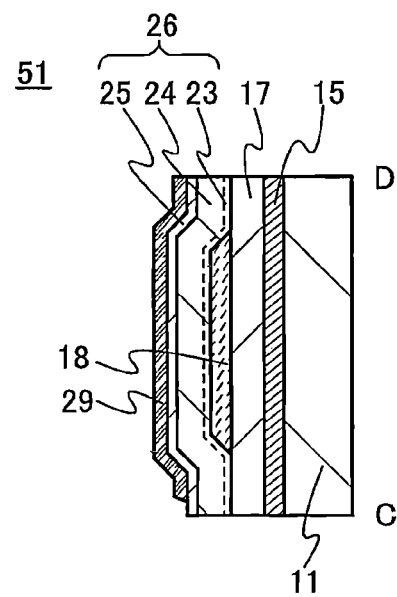
Figure 3B:
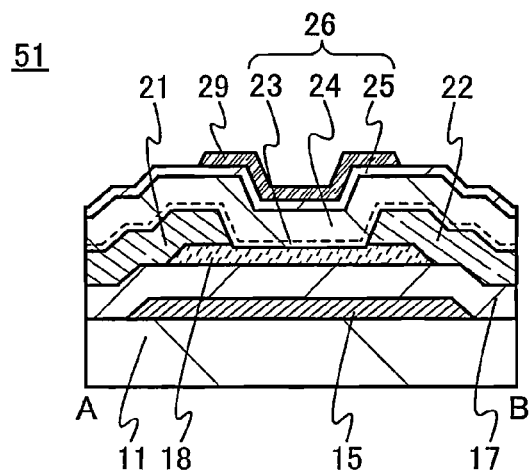

Unlike the transistor 50 in FIG. 2A having the gate electrode 15 having a smaller width than that of the oxide semiconductor film 18 in the channel length direction, a transistor 51 of FIG. 3A can have the gate electrode 15 having a larger width than that of the oxide semiconductor film 18 in the channel length direction. With such a structure, light from the substrate 11 side can be blocked by the gate electrode 15, and thus change in electrical characteristics of the transistor 51 can be suppressed. FIG. 3A is a top view of the transistor 51, FIG. 3B is a cross-sectional view taken along dashed-dotted line A-B in FIG. 3A, and FIG. 3C is a cross-sectional view taken along dashed-dotted line C-D in FIG. 3A.

Although the gate electrodes 15 and 29 are connected to each other and have the same potential in this embodiment, the gate electrodes 15 and 29 are not necessarily connected to each other and may be supplied with different potentials.

Details of other components of the transistor 50 are described below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 11. Furthermore, any of these substrates further provided with a semiconductor element may be used as the substrate 11. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 50 may be provided directly on the flexible substrate. Alternatively, a separation layer may be provided between the substrate 11 and the transistor 50. The separation layer can be used when part or the whole of a semiconductor device formed over the separation layer is separated from the substrate 11 and transferred onto another substrate. In that case, the transistor 50 can be transferred to a substrate having low heat resistance or a flexible substrate.

The gate electrode 15 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. The gate electrode 15 may have a single-layer structure or a layered structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film that contains aluminum and one or more elements selected from titanium, tantalum, tungsten, molybdenum, chromium, neodymium, and scandium may be used.

The gate electrode 15 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a layered structure formed using the above light-transmitting conductive material and the above metal element.

The gate insulating film 17 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The gate insulating film 17 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 17 is greater than or equal to 5 nm and less than or equal to 400 nm, greater than or equal to 10 nm and less than or equal to 300 nm, or greater than or equal to 50 nm and less than or equal to 250 nm.

The oxide semiconductor film 18 is typically an In—Ga oxide film, an In—Zn oxide film, or an In—M-Zn oxide film (M represents Al, Ga, Y, Zr, La, Ce, or Nd).

Note that in the case where the oxide semiconductor film 18 is an In—M-Zn oxide film, the proportions of In and M when summation of In and M is assumed to be 100 atomic % are as follows: the atomic percentage of In is greater than or equal to 25 atomic % and the atomic percentage of M is less than 75 atomic %; or the atomic percentage of In is greater than or equal to 34 atomic % and the atomic percentage of M is less than 66 atomic %.

The energy gap of the oxide semiconductor film 18 is 2 eV or more, 2.5 eV or more, or 3 eV or more. With the use of an oxide semiconductor having such a wide energy gap, the off-state current of the transistor 50 can be reduced.

The thickness of the oxide semiconductor film 18 is greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor film 18 is an In—M-Zn oxide film (M represents Al, Ga, Y, Zr, La, Ce, or Nd), it is preferable that the atomic ratio of metal elements of a sputtering target used for forming a film of the In—M-Zn oxide satisfy In M and Zn≥M. As the atomic ratio of metal elements of such a sputtering target, In:M:Zn=1:1:1 and In:M:Zn=3:1:2 are preferable. Note that the atomic ratios of metal elements in the formed oxide semiconductor film 18 vary from those in the above-described sputtering target, within a range of ±40% as an error. When the content of In in the oxide semiconductor film 18 is high, the on-state current and the field-effect mobility of the transistor are increased. Thus, when the oxide semiconductor film 18 is formed using a sputtering target of the In—M-Zn oxide having an atomic ratio of In:M:Zn=3:1:2, the transistor having excellent electrical characteristics can be fabricated.

An oxide semiconductor film with low carrier density is used as the oxide semiconductor film 18. For example, an oxide semiconductor film whose carrier density is $1\times10^{17}$/cm$^3$ or lower, $1\times10^{15}$/cm$^3$ or lower, $1\times10^{13}$/cm$^3$ or lower, or $1\times10^{11}$/cm$^3$ or lower is used as the oxide semiconductor film 18.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 18 be set to be appropriate.

Note that it is preferable to use, as the oxide semiconductor film 18, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed rarely has a negative threshold voltage (is rarely normally-on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible in the oxide semiconductor film 18. Specifically, the hydrogen concentration of the oxide semiconductor film 18, which is measured by secondary ion mass spectrometry (SIMS), is lower than or equal to $5\times10^{19}$ atoms/cm³, lower than or equal to $1\times10^{19}$ atoms/cm³, lower than or equal to $5\times10^{18}$ atoms/cm³, lower than or equal to $1\times10^{18}$ atoms/cm³, lower than or equal to $5\times10^{17}$ atoms/cm³, or lower than or equal to $1\times10^{16}$ atoms/cm³.

When silicon or carbon that is one of elements belonging to Group 14 is contained in the oxide semiconductor film 18, oxygen vacancies are increased in the oxide semiconductor film 18, and the oxide semiconductor film 18 becomes an n-type film. Thus, the concentration of silicon or carbon (the concentration is measured by SIMS) of the oxide semiconductor film 18 is lower than or equal to $2\times10^{18}$ atoms/cm³, or lower than or equal to $2\times10^{17}$ atoms/cm³.

Further, the concentration of alkali metal or alkaline earth metal of the oxide semiconductor film 18, which is measured by SIMS, is lower than or equal to $1\times10^{18}$ atoms/cm³, or lower than or equal to $2\times10^{16}$ atoms/cm³. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 18.

Further, when containing nitrogen, the oxide semiconductor film 18 easily becomes n-type by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible; the concentration of nitrogen that is measured by SIMS is preferably set to, for example, lower than or equal to $5\times10^{18}$ atoms/cm³.

The oxide semiconductor film 18 may have a non-single-crystal structure, for example. The non-single crystal structure includes a c-axis aligned crystalline oxide semiconductor (CAAC-OS) that is described later, a polycrystalline structure, a microcrystalline structure described later, or an amorphous structure, for example. Among the non-single crystal structures, the amorphous structure has the highest density of defect levels, whereas CAAC-OS has the lowest density of defect levels.

The oxide semiconductor film 18 may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and has no crystal part.

Note that the oxide semiconductor film 18 may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

The pair of electrodes 21 and 22 are formed with a single layer or a stack using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is formed over a copper-magnesium-aluminum alloy film, a two-layer structure in which a copper film is formed over a titanium film, a two-layer structure in which a copper film is formed over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The oxide insulating film 23 is an oxide insulating film through which oxygen passes. Note that the oxide insulating film 23 also serves as a film that relieves damage to the oxide semiconductor film 18 at the time of forming the oxide insulating film 24 later.

A silicon oxide film, a silicon oxynitride film, or the like with a thickness greater than or equal to 5 nm and less than or equal to 150 nm, or greater than or equal to 5 nm and less than or equal to 50 nm can be used as the oxide insulating film 23. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the oxide insulating film 23 be small, typically the spin density of a signal that appears at g=2.001 due to a dangling bond of silicon, be lower than or equal to $3\times10^{17}$ spins/cm$^3$ by ESR measurement. This is because if the density of defects in the oxide insulating film 23 is high, oxygen is bonded to the defects and the amount of oxygen that passes through the oxide insulating film 23 is decreased.

Further, it is preferable that the amount of defects at the interface between the oxide insulating film 23 and the oxide semiconductor film 18 be small, typically the spin density of a signal that appears at g=1.93 due to defects in the oxide semiconductor film 18 be lower than or equal to $1\times10^{17}$ spins/cm$^3$, more preferably lower than or equal to the lower limit of detection by ESR measurement.

Note that in the oxide insulating film 23, all oxygen entering the oxide insulating film 23 from the outside does not move to the outside of the oxide insulating film 23 and some oxygen remains in the oxide insulating film 23. Further, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film through which oxygen passes is formed as the oxide insulating film 23, oxygen released from the oxide insulating film 24 provided over the oxide insulating film 23 can be moved to the oxide semiconductor film 18 through the oxide insulating film 23.

The oxide insulating film 24 is formed in contact with the oxide insulating film 23. The oxide insulating film 24 is formed using an oxide insulating film containing a higher proportion of oxygen than that of oxygen in the stoichiometric composition. Part of oxygen is released by heating from the oxide insulating film containing a higher proportion of oxygen than that of oxygen in the stoichiometric composition. The oxide insulating film containing a higher proportion of oxygen than that of oxygen in the stoichiometric composition is an oxide insulating film of which the amount of released oxygen converted into oxygen atoms is greater than or equal to $1.0\times10^{18}$ atoms/cm$^3$, or greater than or equal to $3.0\times10^{20}$ atoms/cm$^3$ in TDS analysis.

A silicon oxide film, a silicon oxynitride film, or the like with a thickness greater than or equal to 30 nm and less than or equal to 500 nm, or greater than or equal to 50 nm and less than or equal to 400 nm can be used as the oxide insulating film 24.

Further, it is preferable that the amount of defects in the oxide insulating film 24 be small, typically the spin density of a signal that appears at g=2.001 originating from a dangling bond of silicon, be lower than $1.5\times10^{18}$ spins/cm$^3$, more preferably lower than or equal to $1\times10^{18}$ spins/cm$^3$ by ESR measurement. Note that the oxide insulating film 24 is provided more apart from the oxide semiconductor film 18 than the oxide insulating film 23 is; thus, the oxide insulating film 24 may have higher defect density than the oxide insulating film 23.

Further, it is possible to prevent outward diffusion of oxygen from the oxide semiconductor film 18 and entry of hydrogen, water, or the like into the oxide semiconductor film 18 from the outside by providing the nitride insulating film 25 having a blocking effect against oxygen, hydrogen, water, alkali metal, alkaline earth metal, and the like over the oxide insulating film 24. Examples of the nitride insulating film includes a silicon nitride film, a silicon nitride oxide film, an aluminum nitride film, an aluminum nitride oxide film, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like, may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

Note that the structure of the protective film 26 is not limited to the above-described structure. A single layer of an oxide insulating film or a nitride insulating film or a stacked layer including any of oxide insulating films and nitride insulating films can be used as appropriate. Alternatively, a stacked-layer structure of two layers, four layers, or the like can be used as appropriate.

Next, a method for manufacturing the transistor 50 illustrated in FIGS. 2A to 2D is described with reference to FIGS. 4A to 4E.

Figure 4A:
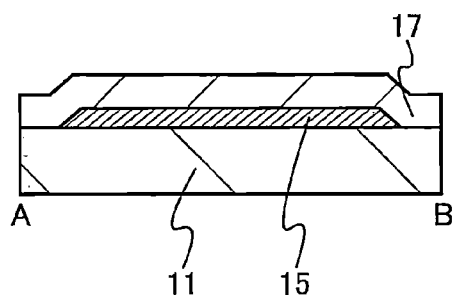
FIGS. 4A to 4E are cross-sectional views illustrating one embodiment of a method for manufacturing a transistor.

As illustrated in FIG. 4A, the gate electrode 15 is formed over the substrate 11, and the gate insulating film 17 is formed over the gate electrode 15.

Here, a glass substrate is used as the substrate 11.

A method for forming the gate electrode 15 is described below. First, a conductive film is formed by a sputtering method, a CVD method, an evaporation method, or the like. Then, a mask is formed over the conductive film by a photolithography process using a first photomask. Next, part of the conductive film is etched with the use of the mask to form the gate electrode 15. After that, the mask is removed.

Note that the gate electrode 15 may be formed by an electrolytic plating method, a printing method, an inkjet method, or the like instead of the above formation method.

Here, a 200-nm-thick tungsten film is formed by a sputtering method. Next, a mask is formed by a photolithography process, and the tungsten film is subjected to dry etching with the use of the mask to form the gate electrode 15.

The gate insulating film 17 is formed by a sputtering method, a CVD method, an evaporation method, or the like.

In the case where a silicon oxide film, a silicon oxynitride film, or a silicon nitride oxide film is formed as the gate insulating film 17, a deposition gas containing silicon and an oxidizing gas are preferred to be used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the gate insulating film 17, a metal organic chemical vapor deposition (MOCVD) method can be employed.

Here, as the gate insulating film 17, a stacked layer including a 400-nm-thick silicon nitride film and a 50-nm-thick silicon oxynitride film is formed. The silicon nitride film is formed by a plasma CVD method using silane, nitrogen, and ammonia as a source gas. The silicon oxynitride film is formed by a plasma CVD method using silane and dinitrogen monoxide as a source gas.

Figure 4B:
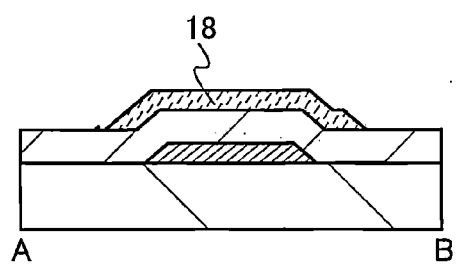

Next, as illustrated in FIG. 4B, the oxide semiconductor film 18 is formed over the gate insulating film 17.

A formation method of the oxide semiconductor film 18 is described below. An oxide semiconductor film that is to be the oxide semiconductor film 18 is formed over the gate insulating film 17. Then, after a mask is formed over the oxide semiconductor film by a photolithography process using a second photomask, the oxide semiconductor film is partly etched using the mask. Thus, the oxide semiconductor film 18 subjected to element isolation as illustrated in FIG. 4B is formed. After that, the mask is removed.

The oxide semiconductor film that is to be the oxide semiconductor film 18 can be formed by a sputtering method, a coating method, a pulsed laser deposition method, a laser ablation method, or the like.

In the case where the oxide semiconductor film is formed by a sputtering method, a power supply device for generating plasma can be an RF power supply device, an AC power supply device, a DC power supply device, or the like as appropriate.

As a sputtering gas, a mixed gas of a rare gas (typically argon) and oxygen, a rare gas, or oxygen, or the like is used as appropriate. In the case of using the mixed gas of a rare gas and oxygen, the proportion of oxygen to a rare gas is preferably increased.

Further, a target may be selected as appropriate in accordance with the composition of the oxide semiconductor film to be formed.

In order to obtain a highly purified intrinsic or substantially highly purified intrinsic oxide semiconductor film, besides the high vacuum evacuation of the chamber, a highly purification of a sputtering gas is also needed. As an oxygen gas or an argon gas used for a sputtering gas, a gas that is highly purified to have a dew point of −40° C. or lower, −80° C. or lower, −100° C. or lower, or −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=3:1:2) and using oxygen as a sputtering gas. Next, a mask is formed over the oxide semiconductor film, and part of the oxide semiconductor film is selectively etched. Thus, the oxide semiconductor film 18 is formed.

Figure 4C:
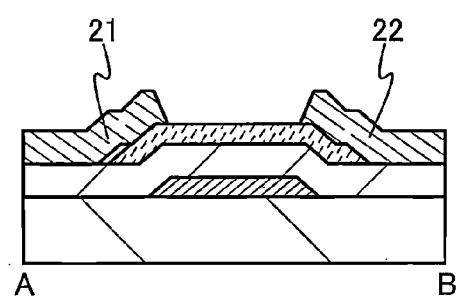

Next, as illustrated in FIG. 4C, the pair of electrodes 21 and 22 are formed.

A method for forming the pair of electrodes 21 and 22 is described below. First, a conductive film is formed by a sputtering method, a CVD method, an evaporation method, or the like. Then, a mask is formed over the conductive film by a photolithography process using a third photomask. Next, the conductive film is etched with the use of the mask to form the pair of electrodes 21 and 22. After that, the mask is removed.

Here, a 50-nm-thick tungsten film, a 400-nm-thick aluminum film, and a 200-nm-thick titanium film are sequentially stacked by a sputtering method. Next, a mask is formed over the titanium film by a photolithography process, and the tungsten film, the aluminum film, and the titanium film are dry-etched with use of the mask to form the pair of electrodes 21 and 22.

Figure 4D:
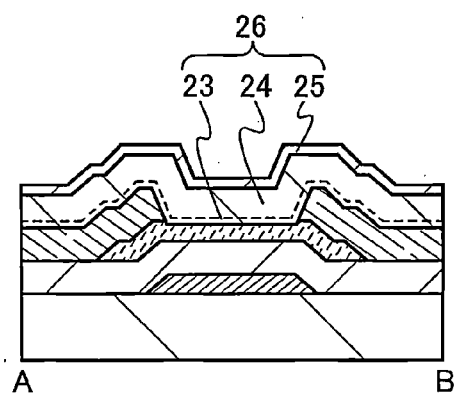

Next, as illustrated in FIG. 4D, the oxide insulating film 23 is formed over the oxide semiconductor film 18 and the pair of electrodes 21 and 22. Next, the oxide insulating film 24 is formed over the oxide insulating film 23.

Note that after the oxide insulating film 23 is formed, the oxide insulating film 24 is preferably formed in succession without exposure to the air. After the oxide insulating film 23 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating films 23 and 24 can be reduced and oxygen in the oxide insulating film 24 can be moved to the oxide semiconductor film 18; accordingly, the amount of oxygen vacancies in the oxide semiconductor film 18 can be reduced.

As the oxide insulating film 23, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, or greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 23. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film through which oxygen passes can be formed as the oxide insulating film 23. Further, by providing the oxide insulating film 23, damage to the oxide semiconductor film 18 can be reduced in a step of forming the oxide insulating film 24 that is formed later.

As the oxide insulating film 23, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong in the above substrate temperature range. Thus, as the oxide insulating film 23, a dense and hard oxide insulating film through which oxygen passes, typically, a silicon oxide film or a silicon oxynitride film of which etching using hydrofluoric acid of 0.5 wt % at 25° C. is performed at a rate of lower than or equal to 10 nm/min, or lower than or equal to 8 nm/min can be formed.

The oxide insulating film 23 is formed while heating is performed; thus, hydrogen, water, or the like contained in the oxide semiconductor film 18 can be released in the step. Hydrogen contained in the oxide semiconductor film 18 is bonded to an oxygen radical formed in plasma to form water. Since the substrate is heated in the step of forming the oxide insulating film 23, water formed by bonding of oxygen and hydrogen is released from the oxide semiconductor film. That is, when the oxide insulating film 23 is formed by a plasma CVD method, the amount of water and hydrogen contained in the oxide semiconductor film 18 can be reduced.

Further, time for heating in a state where the oxide semiconductor film 18 is exposed can be shortened because heating is performed in a step of forming the oxide insulating film 23. Thus, the amount of oxygen released from the oxide semiconductor film by heat treatment can be reduced. That is, the amount of oxygen vacancies in the oxide semiconductor film can be reduced.

Note that by setting the pressure in the treatment chamber to be greater than or equal to 100 Pa and less than or equal to 250 Pa, the amount of water contained in the oxide insulating film 23 is reduced; thus, variation in electrical characteristics of the transistor 50 can be reduced and change in threshold voltage can be inhibited.

Further, by setting the pressure in the treatment chamber to be greater than or equal to 100 Pa and less than or equal to 250 Pa, damage to the oxide semiconductor film 18 can be reduced when the oxide insulating film 23 is formed, so that the amount of oxygen vacancies contained in the oxide semiconductor film 18 can be reduced. In particular, when the film formation temperature of the oxide insulating film 23 or the oxide insulating film 24 that is formed later is set to be high, typically higher than 220° C., part of oxygen contained in the oxide semiconductor film 18 is released and oxygen vacancies are easily formed. Further, when the film formation conditions for reducing the amount of defects in the oxide insulating film 24 that is formed later are used to increase reliability of the transistor, the amount of released oxygen is easily reduced. Thus, it is difficult to reduce oxygen vacancies in the oxide semiconductor film 18 in some cases. However, by setting the pressure in the treatment chamber to be greater than or equal to 100 Pa and less than or equal to 250 Pa to reduce damage to the oxide semiconductor film 18 at the time of forming the oxide insulating film 23, oxygen vacancies in the oxide semiconductor film 18 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 23 can be reduced. Consequently, the amount of hydrogen entering the oxide semiconductor film 18 can be reduced; thus, the negative shift in the threshold voltage of the transistor can be inhibited.

Here, as the oxide insulating film 23, a 50-nm-thick silicon oxynitride film is formed by a plasma CVD method using silane and dinitrogen monoxide as a source gas. Under the above conditions, a silicon oxynitride film through which oxygen passes can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film containing a higher proportion of oxygen than that of oxygen in the stoichiometric composition and from which part of oxygen is released by heating. Further, the oxide insulating film 23 is provided over the oxide semiconductor film 18. Accordingly, in the step of forming the oxide insulating film 24, the oxide insulating film 23 serves as a protective film of the oxide semiconductor film 18. Consequently, the oxide insulating film 24 can be formed using the high-frequency power having a high power density while damage to the oxide semiconductor film 18 is reduced.

Note that in the film formation conditions of the oxide insulating film 24, the flow rate of the deposition gas containing silicon relative to the oxidizing gas can be increased, whereby the amount of defects in the oxide insulating film 24 can be reduced. Typically, it is possible to form an oxide insulating film in which the amount of defects is small, i.e., the spin density of a signal that appears at g=2.001 originating from a dangling bond of silicon is lower than $6\times10^{17}$ spins/cm$^3$, lower than or equal to $3\times10^{17}$ spins/cm$^3$, or lower than or equal to $1.5\times10^{17}$ spins/cm$^3$ by ESR measurement. As a result, the reliability of the transistor can be improved.

Here, as the oxide insulating film 24, a 400-nm-thick silicon oxynitride film is formed by a plasma CVD method using silane and dinitrogen monoxide as a source gas.

Next, heat treatment is performed. The heat treatment is performed typically at a temperature of higher than or equal to 150° C. and lower than or equal to 400° C., higher than or equal to 300° C. and lower than or equal to 400° C., or higher than or equal to 320° C. and lower than or equal to 370° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be moved to the oxide semiconductor film 18, so that the amount of oxygen vacancies contained in the oxide semiconductor film 18 can be further reduced.

Further, in the case where water, hydrogen, or the like is contained in the oxide insulating films 23 and 24, when the nitride insulating film 25 having a function of blocking water, hydrogen, and the like is formed later and heat treatment is performed, water, hydrogen, or the like contained in the oxide insulating films 23 and 24 are moved to the oxide semiconductor film 18, so that defects are generated in the oxide semiconductor film 18. However, by the heating, water, hydrogen, or the like contained in the oxide insulating films 23 and 24 can be released; thus, variation in electrical characteristics of the transistor 50 can be reduced, and change in threshold voltage can be inhibited.

Note that when the oxide insulating film 24 is formed over the oxide insulating film 23 while being heated, oxygen can be moved to the oxide semiconductor film 18 to reduce the oxygen vacancies in the oxide semiconductor film 18; thus, the heat treatment is not necessarily performed.

Here, heat treatment is performed at 350° C. for one hour in a mixed atmosphere of nitrogen and oxygen.

Further, when the pair of electrodes 21 and 22 are formed, the oxide semiconductor film 18 is damaged by the etching of the conductive film, so that oxygen vacancies are generated on the back channel side (the side of the oxide semiconductor film 18 that is opposite to the side facing to the gate electrode 15) of the oxide semiconductor film 18. However, with the use of the oxide insulating film containing a higher proportion of oxygen than that of oxygen in the stoichiometric composition as the oxide insulating film 24, the oxygen vacancies generated on the back channel side can be repaired by heat treatment. By this, defects contained in the oxide semiconductor film 18 can be reduced, and thus, the reliability of the transistor 50 can be improved.

Next, the nitride insulating film 25 is formed by a sputtering method, a CVD method, or the like.

Note that in the case where the nitride insulating film 25 is formed by a plasma CVD method, the substrate placed in the treatment chamber of the plasma CVD apparatus that is vacuum-evacuated is set to be higher than or equal to 300° C. and lower than or equal to 400° C., or higher than or equal to 320° C. and lower than or equal to 370° C., so that a dense nitride insulating film can be formed.

In the case where a silicon nitride film is formed by the plasma CVD method as the nitride insulating film 25, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen that are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in a source gas, cleavage of a deposition gas containing silicon and cleavage of nitrogen are not promoted, so that a sparse silicon nitride film in which a bond between silicon and hydrogen remains and defects are increased is formed. Therefore, in a source gas, a flow ratio of the nitrogen to the ammonia is set to be greater than or equal to 5 and less than or equal to 50, preferably greater than or equal to 10 and less than or equal to 50.

Here, a 100-nm-thick silicon nitride film is formed by a plasma CVD method using silane, nitrogen, and ammonia as a source gas.

By the above-described steps, the protective film 26 including the oxide insulating film 23, the oxide insulating film 24, and the nitride insulating film 25 can be formed.

Next, heat treatment may be performed. The heat treatment is performed typically at a temperature of higher than or equal to 150° C. and lower than or equal to 400° C., higher than or equal to 300° C. and lower than or equal to 400° C., or higher than or equal to 320° C. and lower than or equal to 370° C.

In the case where the gate electrode 15 and the gate electrode 29 to be formed later are connected to each other, an opening is formed in the gate insulating film 17, the oxide insulating film 23, the oxide insulating film 24, and the nitride insulating film 25 at this step.

Figure 4E:
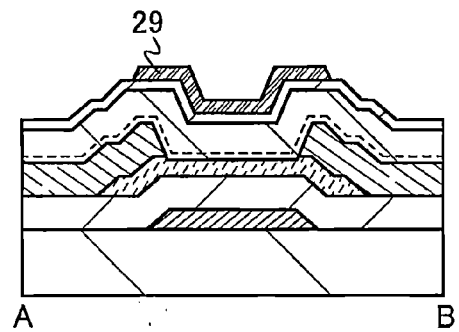

Next, as illustrated in FIG. 4E, the gate electrode 29 is formed. A method for forming the gate electrode 29 is described below. First, a conductive film is formed by a sputtering method, a CVD method, an evaporation method, or the like. Then, a mask is formed over the conductive film by a photolithography process using a fourth photomask. Next, part of the conductive film is etched with the use of the mask to form the gate electrode 29. After that, the mask is removed.

As illustrated in FIG. 3C, the gate electrode 29 is formed so that, in the channel width direction, an end portion of the gate electrode 29 is positioned on the outer side of the oxide semiconductor film 18.

Here, a 100-nm-thick film of indium tin oxide (hereinafter, ITO) including silicon oxide is formed by a sputtering method. Next, a mask is formed by a photolithography process, and the film of ITO including silicon oxide is wet etched using the mask to form the gate electrode 29. After that, heat treatment may be performed.

Through the above process, the transistor 50 can be manufactured.

The transistor 50 is a dual-gate transistor in which the oxide semiconductor film is positioned between the first gate electrode and the second gate electrode, and in the channel width direction of the transistor, a side surface of each of the first and second gate electrodes is on the outer side of a side surface of the oxide semiconductor film, so that an electric field of the gate electrode 29 can exert an influence on the end portion of the oxide semiconductor film 18 and thus the whole oxide semiconductor film 18 including its end portion can serve as a channel. As a result, the amount of on-state current and the field-effect mobility of the transistor can be increased.

Further, since the transistor described in this embodiment includes the first and second gate electrodes, an electric field from the outside can be blocked by the first and second gate electrodes. As a result, degradation in a stress test and changes in the rising voltages of on-state current at different drain voltages can be reduced. Thus, a semiconductor device having excellent electrical characteristics can be obtained. Further, a highly reliable semiconductor device can be obtained.

MODIFICATION EXAMPLE 1

Base Insulating Film

In the transistor 50 described in this embodiment, a base insulating film can be provided between the substrate 11 and the gate electrode 15 as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor film 18 from the substrate 11.

The base insulating film can be formed by a sputtering method, a CVD method, or the like.

MODIFICATION EXAMPLE 2

Gate Insulating Film

In the transistor 50 described in this embodiment, the gate insulating film 17 can have a stacked-layer structure as necessary. Here, structures of the gate insulating film 17 are described with reference to FIGS. 5A to 5C.

Figure 5A:
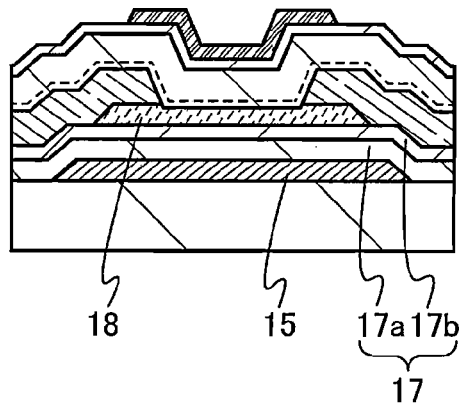
FIGS. 5A to 5C are each a cross-sectional view illustrating one embodiment of a transistor.

As illustrated in FIG. 5A, the gate insulating film 17 can have a stacked-layer structure in which a nitride insulating film 17a and an oxide insulating film 17b are stacked in that order from the gate electrode 15 side. When the nitride insulating film 17a is provided on the gate electrode 15 side, an impurity, typically hydrogen, nitrogen, alkali metal, alkaline earth metal, or the like, can be prevented from moving from the gate electrode 15 to the oxide semiconductor film 18.

Further, when the oxide insulating film 17b is provided on the oxide semiconductor film 18 side, density of defect states at the interface between the gate insulating film 17 and the oxide semiconductor film 18 can be reduced. Consequently, a transistor whose electrical characteristics are hardly degraded can be obtained. Note that it is preferable to form, as the oxide insulating film 17b, an oxide insulating film containing a higher proportion of oxygen than that of oxygen in the stoichiometric composition like the oxide insulating film 24. This is because density of defect states at the interface between the gate insulating film 17 and the oxide semiconductor film 18 can be further reduced.

Figure 5B:
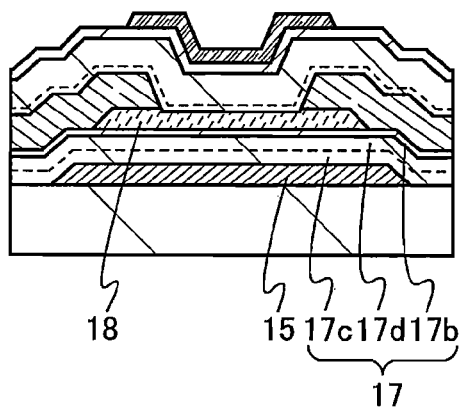

As illustrated in FIG. 5B, the gate insulating film 17 can have a stacked-layer structure in which a nitride insulating film 17c with few defects, a nitride insulating film 17d with a high blocking property against hydrogen, and the oxide insulating film 17b are stacked in that order from the gate electrode 15 side. When the nitride insulating film 17c with few defects is provided in the gate insulating film 17, the withstand voltage of the gate insulating film 17 can be improved. Further, when the nitride insulating film 17d with a high blocking property against hydrogen is provided, hydrogen can be prevented from moving from the gate electrode 15 and the nitride insulating film 17c to the oxide semiconductor film 18.

An example of a method for forming the nitride insulating films 17c and 17d illustrated in FIG. 5B is described below. First, as the nitride insulating film 17c, a silicon nitride film with few defects is formed by a plasma CVD method in which a mixed gas of silane, nitrogen, and ammonia is used as a source gas. Then, as the nitride insulating film 17d, a silicon nitride film in which the hydrogen concentration is low and hydrogen can be blocked is formed by switching the source gas to a mixed gas of silane and nitrogen. By such a formation method, the gate insulating film 17 having a stacked-layer structure of nitride insulating films with few defects and a blocking property against hydrogen can be formed.

Figure 5C:
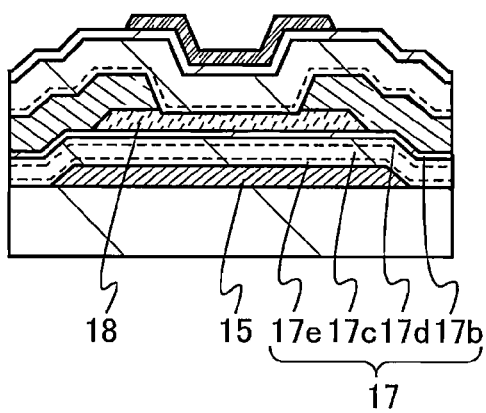

As illustrated in FIG. 5C, the gate insulating film 17 can have a stacked-layer structure in which a nitride insulating film 17e with a high blocking property against an impurity, the nitride insulating film 17c with few defects, the nitride insulating film 17d with a high blocking property against hydrogen, and the oxide insulating film 17b are stacked in that order from the gate electrode 15 side. When the nitride insulating film 17e with a high blocking property against an impurity is provided in the gate insulating film 17, an impurity, typically hydrogen, nitrogen, alkali metal, alkaline earth metal, or the like, can be prevented from moving from the gate electrode 15 to the oxide semiconductor film 18.

An example of a method for forming the nitride insulating films 17e, 17c, and 17d illustrated in FIG. 5C is described below. First, as the nitride insulating film 17e, a silicon nitride film with a high blocking property against an impurity is formed by a plasma CVD method in which a mixed gas of silane, nitrogen, and ammonia is used as a source gas. Then, a silicon nitride film with few defects is formed as the nitride insulating film 17c by increasing the flow rate of ammonia. Then, as the nitride insulating film 17d, a silicon nitride film in which the hydrogen concentration is low and hydrogen can be blocked is formed by switching the source gas to a mixed gas of silane and nitrogen. By such a formation method, the gate insulating film 17 having a stacked-layer structure of nitride insulating films with few defects and a blocking property against an impurity can be formed.

MODIFICATION EXAMPLE 3

Pair of Electrodes

Figure 6:
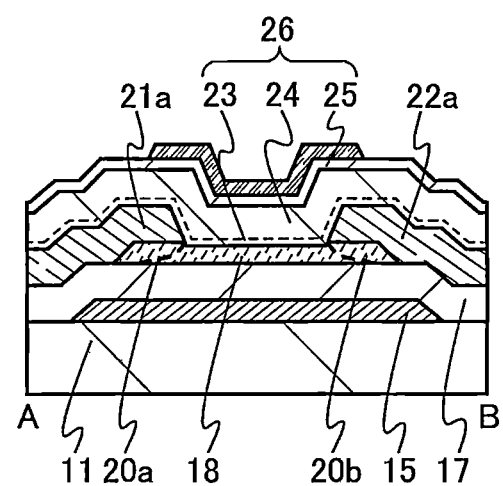
FIG. 6 is a cross-sectional view illustrating one embodiment of a transistor.

For the pair of electrodes 21 and 22 provided in the transistor 50 described in this embodiment, it is possible to use a conductive material that is easily bonded to oxygen, such as tungsten, titanium, aluminum, copper, molybdenum, chromium, or tantalum, or an alloy thereof. Thus, oxygen contained in the oxide semiconductor film 18 and the conductive material contained in the pair of electrodes 21 and 22 are bonded to each other, so that an oxygen defect region is formed in the oxide semiconductor film 18. Further, in some cases, part of constituent elements of the conductive material that forms the pair of electrodes 21 and 22 is mixed into the oxide semiconductor film 18. Consequently, as illustrated in FIG. 6, low-resistance regions 20a and 20b are formed in the vicinity of regions of the oxide semiconductor film 18 that are in contact with the pair of electrodes 21 and 22. The low-resistance regions 20a and 20b are formed between the gate insulating film 17 and the pair of electrodes 21 and 22 so as to be in contact with the pair of electrodes 21 and 22. Since the low-resistance regions 20a and 20b have high conductivity, contact resistance between the oxide semiconductor film 18 and the pair of electrodes 21 and 22 can be reduced, and thus, the on-state current of the transistor can be increased.

Further, the pair of electrodes 21 and 22 may each have a stacked-layer structure of the conductive material that is easily bonded to oxygen and a conductive material that is not easily bonded to oxygen, such as titanium nitride, tantalum nitride, or ruthenium. With such a stacked-layer structure, oxidization of the pair of electrodes 21 and 22 can be prevented at the interface between the pair of electrodes 21 and 22 and the oxide insulating film 23, so that the increase of the resistance of the pair of electrodes 21 and 22 can be inhibited.

MODIFICATION EXAMPLE 4

Oxide Semiconductor Film

In the method for manufacturing the transistor 50 described in this embodiment, after the pair of electrodes 21 and 22 are formed, the oxide semiconductor film 18 may be exposed to plasma generated in an oxygen atmosphere, so that oxygen may be supplied to the oxide semiconductor film 18. Atmospheres of oxygen, ozone, dinitrogen monoxide, nitrogen dioxide, and the like can be given as examples of oxidizing atmospheres. Further, in the plasma treatment, the oxide semiconductor film 18 is preferably exposed to plasma generated with no bias applied to the substrate 11 side. Consequently, the oxide semiconductor film 18 can be supplied with oxygen without being damaged; accordingly, the amount of oxygen vacancies in the oxide semiconductor film 18 can be reduced. Moreover, impurities, e.g., halogen such as fluorine or chlorine remaining on the surface of the oxide semiconductor film 18 due to the etching treatment can be removed. The plasma treatment is preferably performed while heating is performed at a temperature higher than or equal to 300° C. Oxygen in the plasma is bonded to hydrogen contained in the oxide semiconductor film 18 to form water. Since the substrate is heated, the water is released from the oxide semiconductor film 18. Consequently, the amount of hydrogen and water in the oxide semiconductor film 18 can be reduced.

MODIFICATION EXAMPLE 5

In the transistor 50 described in this embodiment, the oxide insulating film 23 is formed while a substrate is kept at a temperature of higher than or equal to 280° C. and lower than or equal to 400° C., whereby hydrogen, water, or the like contained in the oxide semiconductor film 18 can be released. Alternatively, after the oxide semiconductor film 18 illustrated in FIG. 4B is formed, heat treatment may be performed, and then the oxide insulating film 23 may be formed while the substrate is kept at a temperature of higher than or equal to 180° C. and lower than or equal to 260° C. Note that the temperature of the heat treatment is higher than or equal to 150° C. and lower than the strain point of the substrate, higher than or equal to 200° C. and lower than or equal to 450° C., or higher than or equal to 300° C. and lower than or equal to 450° C. As a result, the amount of hydrogen, water, or the like contained in the oxide semiconductor film 18 can be further reduced, and a transistor having better electrical characteristics can be manufactured.

Note that the structures, methods, and the like described in this embodiment can be used as appropriate in combination with any of the structures, methods, and the like described in the other embodiments and examples.

(Embodiment 2)

In this embodiment, a semiconductor device having a transistor in which the amount of defects in an oxide semiconductor film can be further reduced as compared to Embodiment 1 is described with reference to drawings. The transistor described in this embodiment is different from that in Embodiment 1 in that a multilayer film in which oxide semiconductor films are stacked is provided.

Figure 7A:
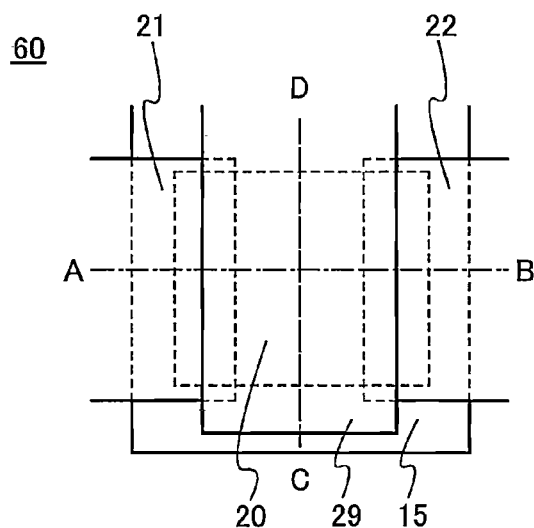
FIGS. 7A to 7D are a top view and cross-sectional views illustrating one embodiment of a transistor.
Figure 7C:
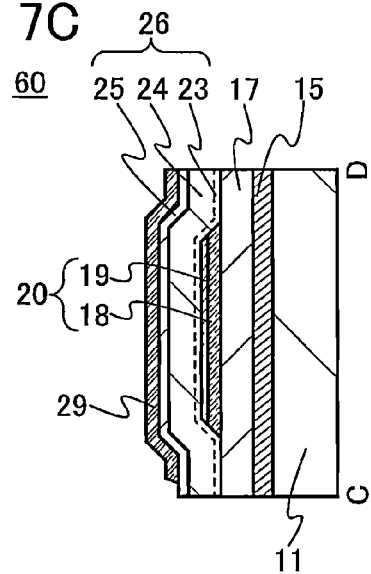
Figure 7B:
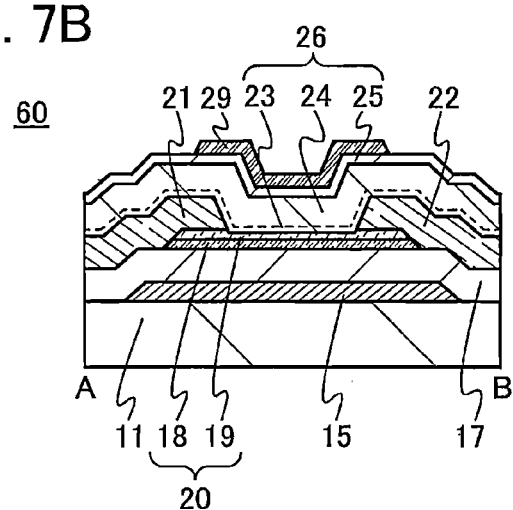

FIGS. 7A to 7C are a top view and cross-sectional views of a transistor 60 included in the semiconductor device. FIG. 7A is a top view of the transistor 60, FIG. 7B is a cross-sectional view taken along dashed-dotted line A-B of FIG. 7A, and FIG. 7C is a cross-sectional view taken along dashed-dotted line C-D of FIG. 7A. Note that in FIG. 7A, the substrate 11, the gate insulating film 17, the oxide insulating film 23, the oxide insulating film 24, the nitride insulating film 25, and the like are not illustrated for clarity.

The transistor 60 illustrated in FIGS. 7A to 7C includes the gate electrode 15 over the substrate 11; the gate insulating film 17; a multilayer film 20 overlapping with the gate electrode 15 with the gate insulating film 17 positioned therebetween; a pair of electrodes 21 and 22 in contact with the multilayer film 20; the protective film 26 over the gate insulating film 17, the multilayer film 20, and the pair of electrodes 21 and 22; and the gate electrode 29 over the protective film 26. Further, the protective film 26 includes the oxide insulating film 23, the oxide insulating film 24, and the nitride insulating film 25. Note that the protective film 26 serves as a gate insulating film.

In the transistor 60 described in this embodiment, the multilayer film 20 includes the oxide semiconductor film 18 and an oxide semiconductor film 19. That is, the multilayer film 20 has a two-layer structure. Further, part of the oxide semiconductor film 18 serves as a channel region. Furthermore, the oxide insulating film 23 is formed in contact with the multilayer film 20. The oxide semiconductor film 19 is provided between the oxide semiconductor film 18 and the oxide insulating film 23. The oxide insulating film 24 is formed in contact with the oxide insulating film 23.

The oxide semiconductor film 19 is an oxide film containing one or more elements that form the oxide semiconductor film 18. Thus, interface scattering is unlikely to occur at the interface between the oxide semiconductor films 18 and 19. Thus, the transistor can have a high field-effect mobility because the movement of carriers is not hindered at the interface.

The oxide semiconductor film 19 is typically an In—Ga oxide film, an In—Zn oxide film, or an In—M-Zn oxide film (M represents Al, Ga, Y, Zr, La, Ce, or Nd). The energy of the bottom of the conduction band of the oxide semiconductor film 19 is closer to a vacuum level than that of the oxide semiconductor film 18 is, and typically, the difference between the energy of the bottom of the conduction band of the oxide semiconductor film 19 and the energy of the bottom of the conduction band of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide semiconductor film 19 and the electron affinity of the oxide semiconductor film 18 is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide semiconductor film 19 preferably contains In because carrier mobility (electron mobility) can be increased.

When the oxide semiconductor film 19 contains a larger amount of Al, Ga, Y, Zr, La, Ce, or Nd in an atomic ratio than the amount of In in an atomic ratio, any of the following effects may be obtained: (1) the energy gap of the oxide semiconductor film 19 is widened; (2) the electron affinity of the oxide semiconductor film 19 decreases; (3) an impurity from the outside is blocked; (4) an insulating property of the oxide semiconductor film 19 increases as compared to that of the oxide semiconductor film 18; and (5) oxygen vacancies are less likely to be generated because Al, Ga, Y, Zr, La, Ce, or Nd is a metal element that is strongly bonded to oxygen.

In the case where the oxide semiconductor film 19 is an In—M-Zn oxide film, the proportions of In and M when summation of In and M is assumed to be 100 atomic % are as follows: the atomic percentage of In is less than 50 atomic % and the atomic percentage of M is greater than or equal to 50 atomic %; or the atomic percentage of In is less than 25 atomic % and the atomic percentage of M is greater than or equal to 75 atomic %.

Further, in the case where each of the oxide semiconductor films 18 and 19 is an In—M-Zn oxide film (M represents Al, Ga, Y, Zr, La, Ce, or Nd), the proportion of M atoms (M represents Al, Ga, Y, Zr, La, Ce, or Nd) in the oxide semiconductor film 19 is higher than that in the oxide semiconductor film 18. Typically, the proportion of M in the oxide semiconductor film 19 is 1.5 or more times, twice or more, or three or more times as high as that in the oxide semiconductor film 18.

Furthermore, in the case where each of the oxide semiconductor films 18 and 19 is an In—M-Zn-based oxide film (M represents Al, Ga, Y, Zr, La, Ce, or Nd), when $In:M:Zn=x_1:y_1:z_1$ [atomic ratio] is satisfied in the oxide semiconductor film 19 and $In:M:Zn=x_2:y_2:z_2$ [atomic ratio] is satisfied in the oxide semiconductor film 18, $y_1/x_1$ is higher than $y_2/x_2$. Alternatively, $y_1/x_1$ is 1.5 or more times as high as $y_2/x_2$. Further alternatively, $y_1/x_1$ is twice or more as high as $y_2/x_2$. Still further alternatively, $y_1/x_1$ is three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 18 is an In—M-Zn oxide film (M is Al, Ga, Y, Zr, La, Ce, or Nd) and a target having the atomic ratio of metal elements of $In:M:Zn=x_1:y_1:z_1$ is used for forming the oxide semiconductor film 18, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the oxide semiconductor film 18. Typical examples of the atomic ratio of the metal elements of the target are In:M:Zn=1:1:1, In:M:Zn=1:1:1.2, In:M:Zn=3:1:2, and the like.

In the case where the oxide semiconductor film 19 is an In—M-Zn oxide film (M is Al, Ga, Y, Zr, La, Ce, or Nd) and a target having the atomic ratio of metal elements of In:M:Zn=$x_2$:$y_2$:$z_2$ is used for forming the oxide semiconductor film 19, $x_2/y_2$ is less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed as the oxide semiconductor film 19. Typical examples of the atomic ratio of the metal elements of the target are In:M:Zn=1:3:2, In:M:Zn=1:3:4, In:M:Zn=1:3:6, In:M:Zn=1:3:8, and the like.

Note that a proportion of each atom in the atomic ratio of the oxide semiconductor films 18 and 19 varies within a range of ±40% as an error.

The oxide semiconductor film 19 also serves as a film that relieves damage to the oxide semiconductor film 18 at the time of forming the oxide insulating film 24 later.

The thickness of the oxide semiconductor film 19 is greater than or equal to 3 nm and less than or equal to 100 nm, or greater than or equal to 3 nm and less than or equal to 50 nm.

The oxide semiconductor film 19 may have a non-single-crystal structure, for example, like the oxide semiconductor film 18. The non-single crystal structure includes a CAAC-OS described later, a polycrystalline structure, a microcrystalline structure described later, or an amorphous structure, for example.

The oxide semiconductor film 19 may have an amorphous structure, for example. An amorphous oxide semiconductor film, for example, has disordered atomic arrangement and no crystalline component. Alternatively, an amorphous oxide film is, for example, absolutely amorphous and has no crystal part.

Note that the oxide semiconductor films 18 and 19 may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including two or more of a region having an amorphous structure, a region having a microcrystalline structure, a region having a polycrystalline structure, a CAAC-OS region, and a region having a single-crystal structure in some cases.

Here, the oxide semiconductor film 19 is provided between the oxide semiconductor film 18 and the oxide insulating film 23. Hence, if trap states are formed between the oxide semiconductor films 19 and the oxide insulating film 23 owing to impurities and defects, electrons flowing in the oxide semiconductor film 18 are less likely to be captured by the trap states because there is a distance between the trap states and the oxide semiconductor film 18. Accordingly, the amount of on-state current and the field-effect mobility of the transistor can be increased. When the electrons are captured by the trap states, the electrons become negative fixed charges. As a result, a threshold voltage of the transistor varies. However, by the distance between the oxide semiconductor film 18 and the trap states, capture of the electrons by the trap states can be reduced, and accordingly a fluctuation of the threshold voltage can be reduced.

Further, impurities from the outside can be blocked by the oxide semiconductor film 19, and accordingly, the amount of impurities that move from the outside to the oxide semiconductor film 18 can be reduced. Further, an oxygen vacancy is less likely to be formed in the oxide semiconductor film 19. Consequently, the impurity concentration and the amount of oxygen vacancies in the oxide semiconductor film 18 can be reduced.

Note that the oxide semiconductor films 18 and 19 are not formed by simply stacking each film, but are formed to form a continuous junction (here, in particular, a structure in which the energy of the bottom of the conduction band is changed continuously between each film). In other words, a stacked-layer structure in which there exist no impurity that forms a defect level such as a trap center or a recombination center at each interface is provided. If an impurity exists between the oxide semiconductor films 18 and 19 that are stacked, a continuity of the energy band is damaged, and the carrier is captured or recombined at the interface and then disappears.

In order to form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

Figure 7D:
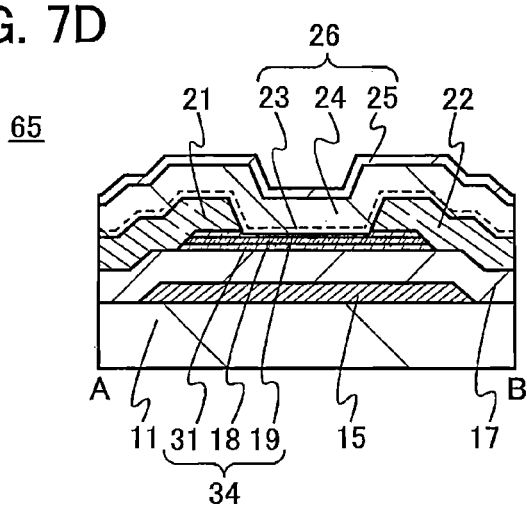

Note that a multilayer film 34 may be included instead of the multilayer film 20 as in the case of a transistor 65 in FIG. 7D.

The multilayer film 34 includes an oxide semiconductor film 31, the oxide semiconductor film 18, and the oxide semiconductor film 19. That is, the multilayer film 34 has a three-layer structure. The oxide semiconductor film 18 serves as a channel region.

Further, the gate insulating film 17 and the oxide semiconductor film 31 are in contact with each other. That is, the oxide semiconductor film 31 is provided between the gate insulating film 17 and the oxide semiconductor film 18.

The multilayer film 34 and the oxide insulating film 23 are in contact with each other. The oxide semiconductor film 19 and the oxide insulating film 23 are in contact with each other. That is, the oxide semiconductor film 19 is provided between the oxide semiconductor film 18 and the oxide insulating film 23.

The oxide semiconductor film 31 can be formed using a material and a formation method of the oxide semiconductor film 19.

It is preferable that the thickness of the oxide semiconductor film 31 be smaller than that of the oxide semiconductor film 18. When the thickness of the oxide semiconductor film 31 is greater than or equal to 1 nm and less than or equal to 5 nm, or greater than or equal to 1 nm and less than or equal to 3 nm, the amount of change in threshold voltage of the transistor can be reduced.

In the transistor described in this embodiment, the oxide semiconductor film 19 is provided between the oxide semiconductor film 18 and the oxide insulating film 23. Hence, if trap states are formed between the oxide semiconductor films 19 and the oxide insulating film 23 owing to impurities and defects, electrons flowing in the oxide semiconductor film 18 are less likely to be captured by the trap states because there is a distance between the trap states and the oxide semiconductor film 18. Accordingly, the amount of on-state current and the field-effect mobility of the transistor can be increased. When the electrons are captured by the trap states, the electrons become negative fixed charges. As a result, a threshold voltage of the transistor varies. However, by the distance between the oxide semiconductor film 18 and the trap states, capture of the electrons by the trap states can be reduced, and accordingly a fluctuation of the threshold voltage can be reduced.

Further, impurities from the outside can be blocked by the oxide semiconductor film 19, and accordingly, the amount of impurities that move from the outside to the oxide semiconductor film 18 can be reduced. Further, an oxygen vacancy is less likely to be formed in the oxide semiconductor film 19. Consequently, the impurity concentration and the amount of oxygen vacancies in the oxide semiconductor film 18 can be reduced.

Further, the oxide semiconductor film 31 is provided between the gate insulating film 17 and the oxide semiconductor film 18, and the oxide semiconductor film 19 is provided between the oxide semiconductor film 18 and the oxide insulating film 23. Thus, it is possible to reduce the concentration of silicon or carbon in the vicinity of the interface between the oxide semiconductor film 31 and the oxide semiconductor film 18, the concentration of silicon or carbon in the oxide semiconductor film 18, or the concentration of silicon or carbon in the vicinity of the interface between the oxide semiconductor film 19 and the oxide semiconductor film 18. Consequently, in the multilayer film 34, the absorption coefficient derived from a constant photocurrent method is lower than $1 \times 10^{-3}$/cm, or lower than $1 \times 10^{-4}$/cm, and thus density of localized levels is extremely low.

Since the transistor 65 having such a structure includes very few defects in the multilayer film 34 including an oxide semiconductor film 18, the electrical characteristics of the transistor can be improved, and typically, the on-state current can be increased and the field-effect mobility can be improved. Further, in a BT stress test and a BT photostress test that are examples of a stress test, the amount of change in threshold voltage is small, and thus, reliability is high.

<Band Structure of Transistor>

Next, a band structure of the multilayer film 20 provided in the transistor 60 illustrated in FIG. 7A and a band structure of the multilayer film 34 provided in the transistor 65 illustrated in FIG. 7D are described with reference to FIGS. 8A to 8C.

Here, for example, In—Ga—Zn oxide having an energy gap of 3.15 eV is used as the oxide semiconductor film 18, and In—Ga—Zn oxide having an energy gap of 3.5 eV is used as the oxide semiconductor film 19. The energy gaps can be measured using a spectroscopic ellipsometer (UT-300 manufactured by HORIBA JOBIN YVON SAS.).

The energy difference between the vacuum level and the top of the valence band (also called ionization potential) of the oxide semiconductor film 18 and the energy difference between the vacuum level and the top of the valence band of the oxide semiconductor film 19 were 8 eV and 8.2 eV, respectively. Note that the energy difference between the vacuum level and the valence band top can be measured using an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 18 and the energy gap therebetween of the oxide semiconductor film 19 were 4.85 eV and 4.7 eV, respectively.

Figure 8A:
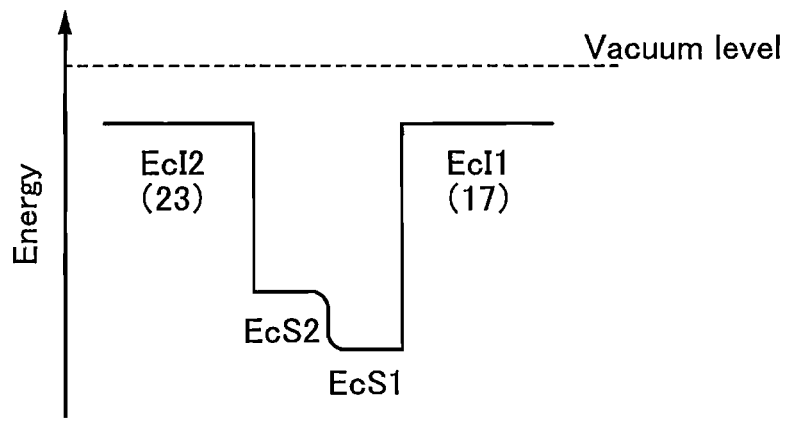
FIGS. 8A to 8C are each a diagram illustrating the band structure of a transistor.

FIG. 8A schematically illustrates a part of the band structure of the multilayer film 20. Here, the case where a silicon oxide film is provided in contact with the multilayer film 20 is described. In FIG. 8A, EcI1 denotes the energy of the bottom of the conduction band in the silicon oxide film; EcS1 denotes the energy of the bottom of the conduction band in the oxide semiconductor film 18; EcS2 denotes the energy of the bottom of the conduction band in the oxide semiconductor film 19; and EcI2 denotes the energy of the bottom of the conduction band in the silicon oxide film. Further, EcI1 and EcI2 correspond to the gate insulating film 17 and the oxide insulating film 23 in FIG. 7B, respectively.

As illustrated in FIG. 8A, there is no energy barrier between the oxide semiconductor films 18 and 19, and the energy level of the bottom of the conduction band gradually changes therebetween. In other words, the energy level of the bottom of the conduction band is continuously changed. This is because the multilayer film 20 contains an element contained in the oxide semiconductor film 18 and oxygen is transferred between the oxide semiconductor films 18 and 19, so that a mixed layer is formed.

As shown in FIG. 8A, the oxide semiconductor film 18 in the multilayer film 20 serves as a well and a channel region of the transistor including the multilayer film 20 is formed in the oxide semiconductor film 18. Note that since the energy of the bottom of the conduction band of the multilayer film 20 is continuously changed, it can be said that the oxide semiconductor films 18 and 19 are continuous.

Although trap states due to impurities or defects might be formed in the vicinity of the interface between the oxide semiconductor films 19 and the oxide insulating film 23 as shown in FIG. 8A, the oxide semiconductor film 18 can be distanced from the trap states owing to existence of the oxide semiconductor film 19. However, when the energy difference between EcS1 and EcS2 is small, an electron in the oxide semiconductor film 18 might reach the trap state across the energy difference. When the electron is captured by the trap state, a negative fixed charge is generated at the interface with the oxide insulating film, whereby the threshold voltage of the transistor is shifted in the positive direction. Therefore, it is preferable that the energy difference between EcS1 and EcS2 be 0.1 eV or more or 0.15 eV or more, because a change in the threshold voltage of the transistor is reduced and stable electrical characteristics are obtained.

Figure 8B:
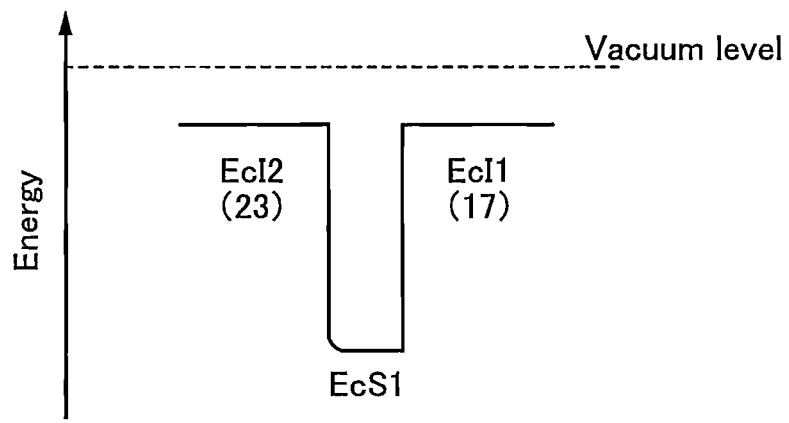

FIG. 8B schematically illustrates a part of the band structure of the multilayer film 20, which is a variation of the band structure shown in FIG. 8A. Here, a structure where silicon oxide films provided in contact with the multilayer film 20 is described. In FIG. 8B, EcI1 denotes the energy of the bottom of the conduction band in the silicon oxide film; EcS1 denotes the energy of the bottom of the conduction band in the oxide semiconductor film 18; and EcI2 denotes the energy of the bottom of the conduction band in the silicon oxide film. Further, EcI1 corresponds to the gate insulating film 17 in FIG. 7B, and EcI2 corresponds to the oxide insulating film 23 in FIG. 7B.

In the transistor illustrated in FIG. 7B, an upper portion of the multilayer film 20, that is, the oxide semiconductor film 19 might be etched in formation of the pair of electrodes 21 and 22. Further, a mixed layer of the oxide semiconductor films 18 and 19 is likely to be formed on the top surface of the oxide semiconductor film 18 in formation of the oxide semiconductor film 19.

For example, when the oxide semiconductor film 18 is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 19 is an oxide semiconductor film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6, the Ga content in the oxide semiconductor film 19 is higher than that in the oxide semiconductor film 18. Thus, a GaOx layer or a mixed layer whose Ga content is higher than that in the oxide semiconductor film 18 can be formed on the top surface of the oxide semiconductor film 18.

For that reason, even in the case where the oxide semiconductor film 19 is etched, the energy of the bottom of the conduction band of EcS1 on the EcI2 side is increased and the band structure shown in FIG. 8B can be obtained in some cases.

As in the band structure shown in FIG. 8B, in observation of a cross section of a channel region, only the oxide semiconductor film 18 in the multilayer film 20 is apparently observed in some cases. However, a mixed layer that contains Ga more than the oxide semiconductor film 18 does is formed over the oxide semiconductor film 18 in fact, and thus the mixed layer can be regarded as a 1.5-th layer. Note that the mixed layer can be confirmed by analyzing a composition in the upper portion of the oxide semiconductor film 18, when the elements contained in the multilayer film 20 are measured by an EDX analysis, for example. The mixed layer can be confirmed, for example, in such a manner that the Ga content in the composition in the upper portion of the oxide semiconductor film 18 is larger than the Ga content in the oxide semiconductor film 18.

Figure 8C:
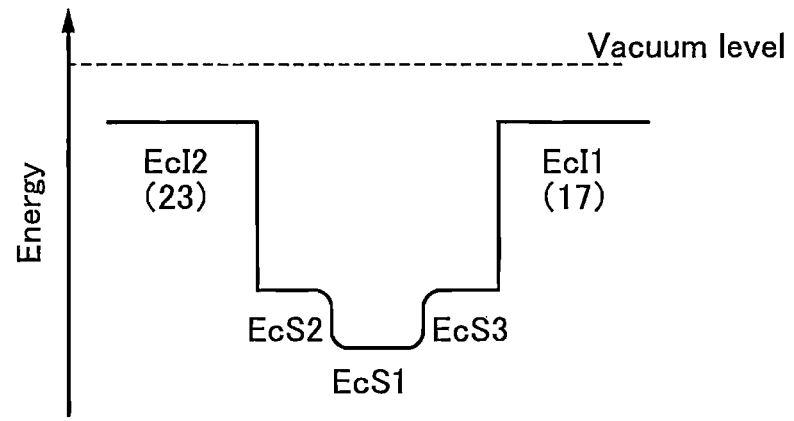

FIG. 8C schematically illustrates a part of the band structure of the multilayer film 34. Here, a structure where silicon oxide films are provided in contact with the multilayer film 34 is described. In FIG. 8C, EcI1 denotes the energy of the bottom of the conduction band in the silicon oxide film; EcS1 denotes the energy of the bottom of the conduction band in the oxide semiconductor film 18; EcS2 denotes the energy of the bottom of the conduction band in the oxide semiconductor film 19; EcS3 denotes the energy of the bottom of the conduction band in the oxide semiconductor film 31; and EcI2 denotes the energy of the bottom of the conduction band in the silicon oxide film. Further, EcI1 and EcI2 correspond to the gate insulating film 17 and the oxide insulating film 23 in FIG. 7D, respectively.

As illustrated in FIG. 8C, there is no energy barrier between the oxide semiconductor films 31 and 19 and between the oxide semiconductor films 18 and 19, and the energy level of the bottom of the conduction band gradually changes therebetween. In other words, the energy level of the bottom of the conduction band is continuously changed. This is because the multilayer film 34 contains an element contained in the oxide semiconductor film 18 and oxygen is transferred between the oxide semiconductor films 31 and 19 and between the oxide semiconductor films 18 and 19, so that a mixed layer is formed.

As shown in FIG. 8C, the oxide semiconductor film 18 in the multilayer film 34 serves as a well and a channel region of the transistor including the multilayer film 34 is formed in the oxide semiconductor film 18. Note that since the energy of the bottom of the conduction band of the multilayer film 34 is continuously changed, it can be said that the oxide semiconductor films 31, 19, and 18 are continuous.

Although trap states due to impurities or defects might be formed in the vicinity of the interface between the oxide semiconductor films 18 and 23 and in the vicinity of the interface between the oxide semiconductor films 18 and 17, the oxide semiconductor film 18 can be distanced from the trap states owing to existence of the oxide semiconductor films 19 and 31 as shown in FIG. 8C. However, when the energy difference between EcS1 and EcS2 and the energy difference between EcS1 and EcS3 are small, an electron in the oxide semiconductor film 18 might reach the trap state across the energy difference. When the electron is captured by the trap state, a negative fixed charge is generated at the interface with the oxide insulating film, whereby the threshold voltage of the transistor is shifted in the positive direction. Therefore, it is preferable that the energy difference between EcS1 and EcS2 and the energy difference between EcS1 and EcS3 each be 0.1 eV or more or 0.15 eV or more, because a change in the threshold voltage of the transistor is reduced and stable electrical characteristics are obtained.

Note that the structures, methods, and the like described in this embodiment can be used as appropriate in combination with any of the structures, methods, and the like described in the other embodiments.

(Embodiment 3)

In this embodiment, electrical characteristics of the transistor having a dual-gate structure described in Embodiment 2 that includes gate electrodes connected to each other and having the same potential are described with reference to FIGS. 7A to 7C and FIG. 26A to FIG. 31C.

Note that here a driving method in which the gate electrodes 15 and 29 in FIGS. 7A to 7C are electrically short-circuited and are supplied with a gate voltage is referred to as dual-gate driving. In other words, in dual-gate driving, the voltage of the gate electrode 15 is always equal to that of the gate electrode 29.

Figure 26A:
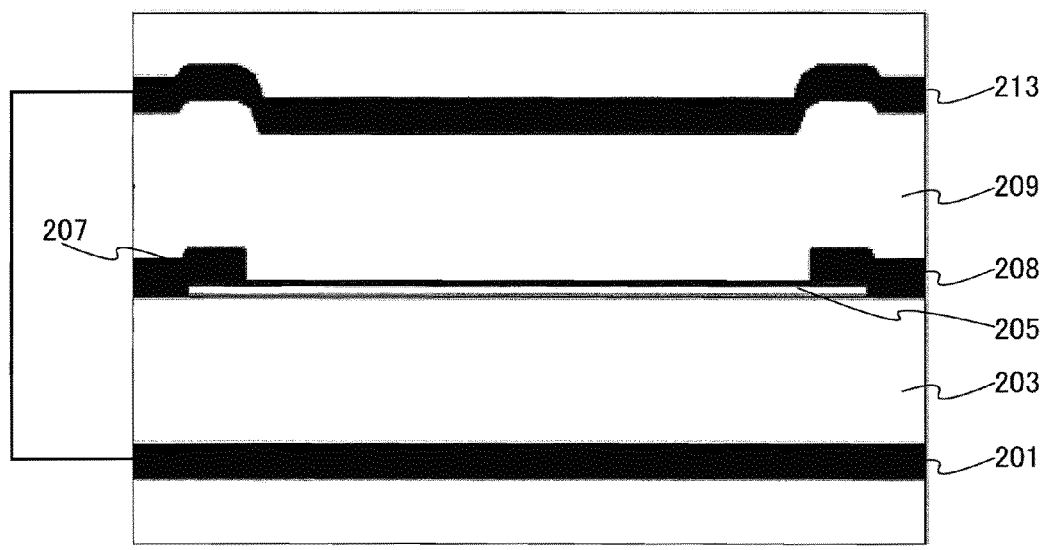
FIGS. 26A and 26B are cross-sectional views illustrating structures of transistors.
Figure 26B:
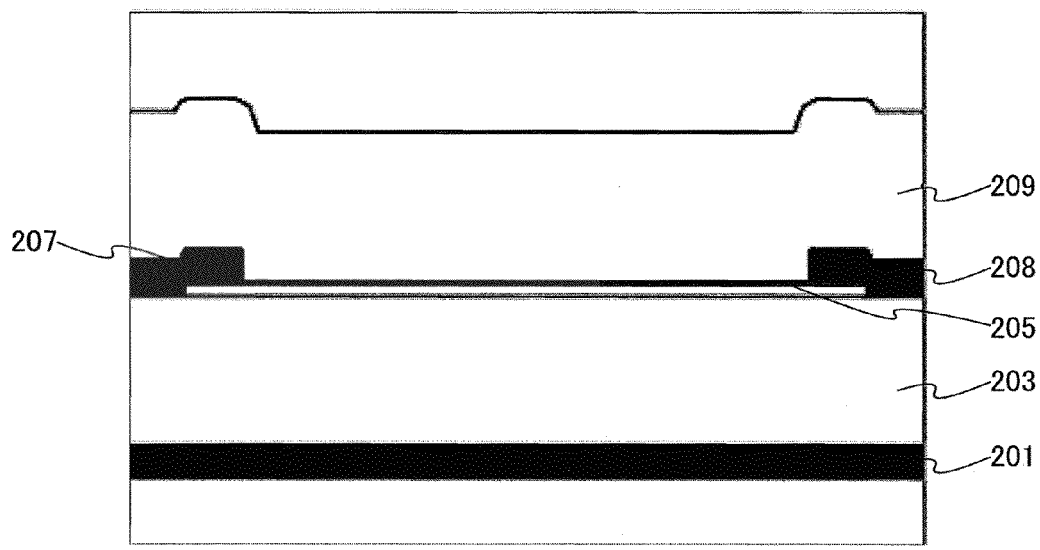

Here, electrical characteristics of the transistor were evaluated. FIGS. 26A and 26B illustrates structures of transistors used for the calculation. Note that device simulation software "Atlas" produced by Silvaco Inc. was used for the calculation.

A transistor having Structure 1 in FIG. 26A is a dual-gate transistor.

In the transistor having Structure 1, an insulating film 203 is formed over a gate electrode 201, and an oxide semiconductor film 205 is formed over the insulating film 203. A pair of electrodes 207 and 208 are formed over the insulating film 203 and the oxide semiconductor film 205, and an insulating film 209 is formed over the oxide semiconductor film 205 and the pair of electrodes 207 and 208. A gate electrode 213 is formed over the insulating film 209. The gate electrode 201 is connected to the gate electrode 213 in an opening (not illustrated) formed in the insulating films 203 and 209.

A transistor having Structure 2 in FIG. 26B is a single-gate transistor.

In the transistor having Structure 2, the insulating film 203 is formed over the gate electrode 201, and the oxide semiconductor film 205 is formed over the insulating film 203. The pair of electrodes 207 and 208 are formed over the insulating film 203 and the oxide semiconductor film 205, and the insulating film 209 is formed over the oxide semiconductor film 205 and the pair of electrodes 207 and 208.

Note that in the calculation, the work function $\phi_M$ of the gate electrode 201 was set to 5.0 eV. The insulating film 203 was a 100-nm-thick film having a dielectric constant of 4.1. The oxide semiconductor film 205 was a single-layer In—Ga—Zn oxide film (In:Ga:Zn=1:1:1). The band gap $E_g$ of the In—Ga—Zn oxide film was 3.15 eV, the electron affinity $\chi$ was 4.6 eV, the dielectric constant was 15, the electron mobility was 10 cm²/Vs, and the donor density $N_d$ was 3×10¹⁷ atoms/cm³. The work function $\phi_{sd}$ of the pair of electrodes 207 and 208 was set to 4.6 eV. Ohmic contact was made between the oxide semiconductor film 205 and each of the pair of electrodes 207 and 208. The insulating film 209 was a 100-nm-thick film having a dielectric constant of 4.1. Note that defect levels, surface scattering, and the like in the oxide semiconductor film 205 were not considered. Further, the channel length and the channel width of the transistor were 10 μm and 100 μm, respectively.

<Reduction in Variation in Initial Characteristics>

As seen in the case of the transistor having Structure 1, by the dual-gate driving, variation in initial characteristics can be reduced. This is because on account of the dual-gate driving, the amount of change in the threshold voltage $V_{th}$, which is one of $I_d$-$V_g$ characteristics, of the transistor having Structure 1 can be small as compared to that of the transistor having Structure 2.

Here, as one example, a negative shift in the threshold voltage of the $I_d$-$V_g$ characteristics that is caused because a semiconductor film becomes n-type is described.

The sum of the amount of charges of donor ions is Q (C), the capacitance formed by the gate electrode 201, the insulating film 203, and the oxide semiconductor film 205 is $C_{Bottom}$, and the capacitance formed by the oxide semiconductor film 205, the insulating film 209, and the gate electrode 213 is $C_{Top}$. The amount of change $\Delta V$ of $V_{th}$ of the transistor having Structure 1 in that case is expressed by Formula 2. The amount of change $\Delta V$ of $V_{th}$ of the transistor having Structure 2 in that case is expressed by Formula 3.

[Formula 2]

$$\Delta V = -\frac{Q}{C_{Bottom} + C_{Top}} \quad (2)$$

[Formula 3]

$$\Delta V = -\frac{Q}{C_{Bottom}} \quad (3)$$

As expressed by Formula 2, by the dual-gate driving performed in the transistor having Structure 1, the capacitance between donor ions and the gate electrode becomes the sum of $C_{Bottom}$ and $C_{Top}$; thus, the amount of change in the threshold voltage is small.

Figure 27A:
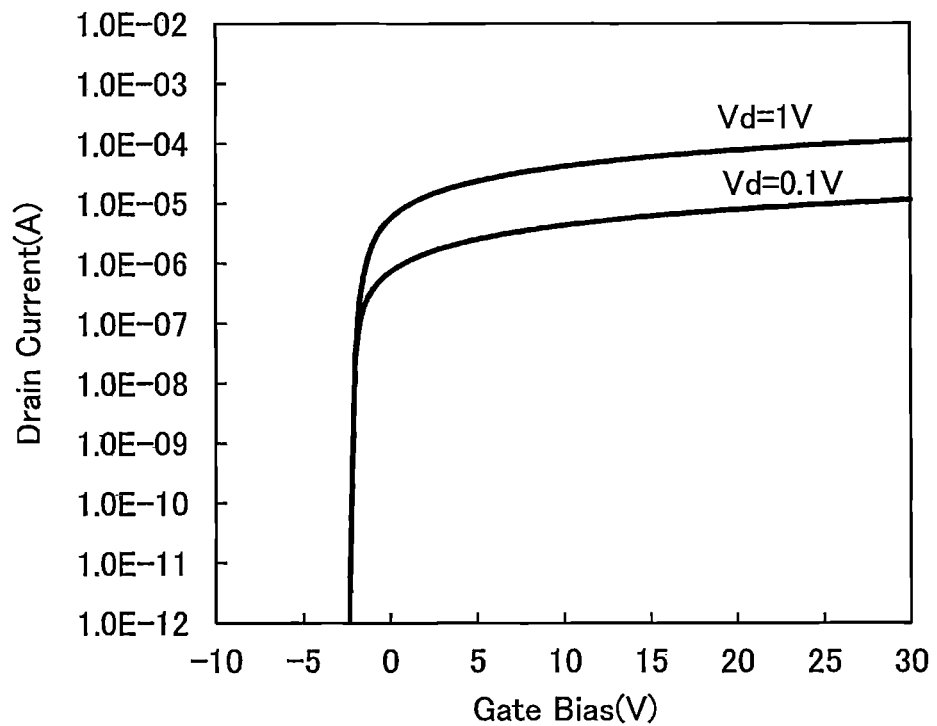
FIGS. 27A and 27B are diagrams for describing the calculation results of current-voltage curves.
Figure 27B:
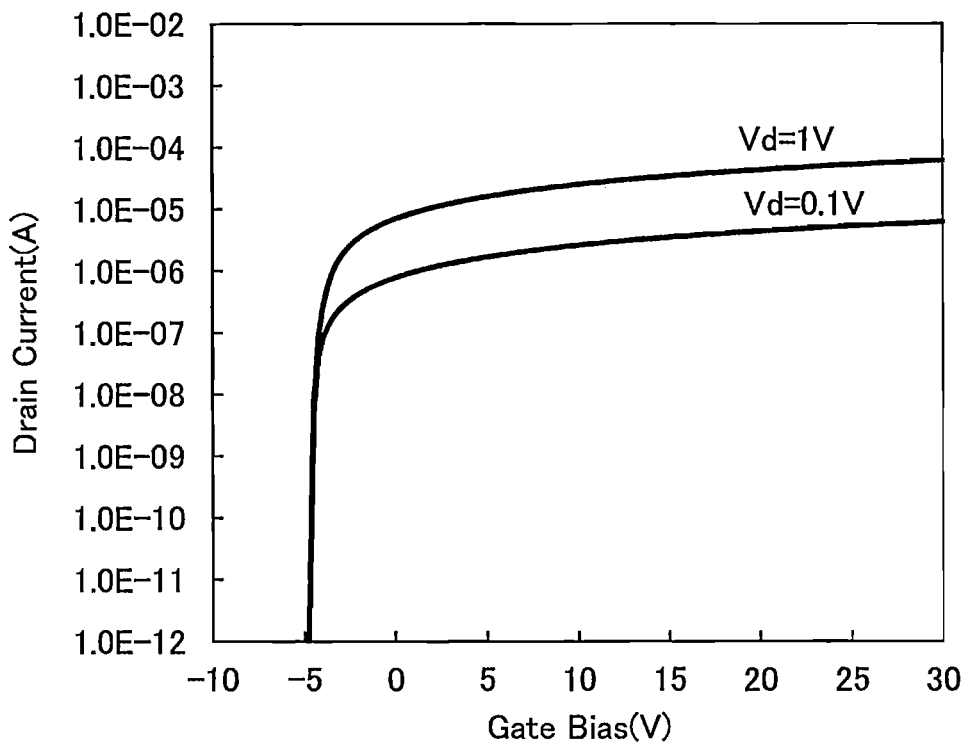

FIG. 27A shows the calculation results of the current-voltage curves at drain voltages of 0.1 V and 1 V of the transistor having Structure 1. FIG. 27B shows the calculation results of the current-voltage curves at drain voltages of 0.1 V and 1 V of the transistor having Structure 2. When the drain voltage $V_d$ is 0.1 V, the threshold voltage of the transistor having Structure 1 is −2.26 V and the threshold voltage of the transistor having Structure 2 is −4.73 V.

As in the case of the transistor having Structure 1, when the dual-gate driving is employed, the amount of change in the threshold voltage can be small. Thus, variation in electrical characteristics among a plurality of transistors can also be small.

Note that although a negative shift in the threshold voltage due to the donor ions is considered here, a positive shift in the threshold voltage due to fixed charges, mobile charges, or negative charges (electrons trapped by acceptor-like states) in the insulating films 203 and 209 is similarly suppressed, which might reduce the variation.

<Reduction in Degradation Due to −GBT Stress Test>

By the dual-gate driving performed in the transistor having Structure 1, degree of degradation due to a −GBT stress test can be low. Some reasons why the degree of degradation due to the −GBT stress test can be low are described below.

Figure 28A:
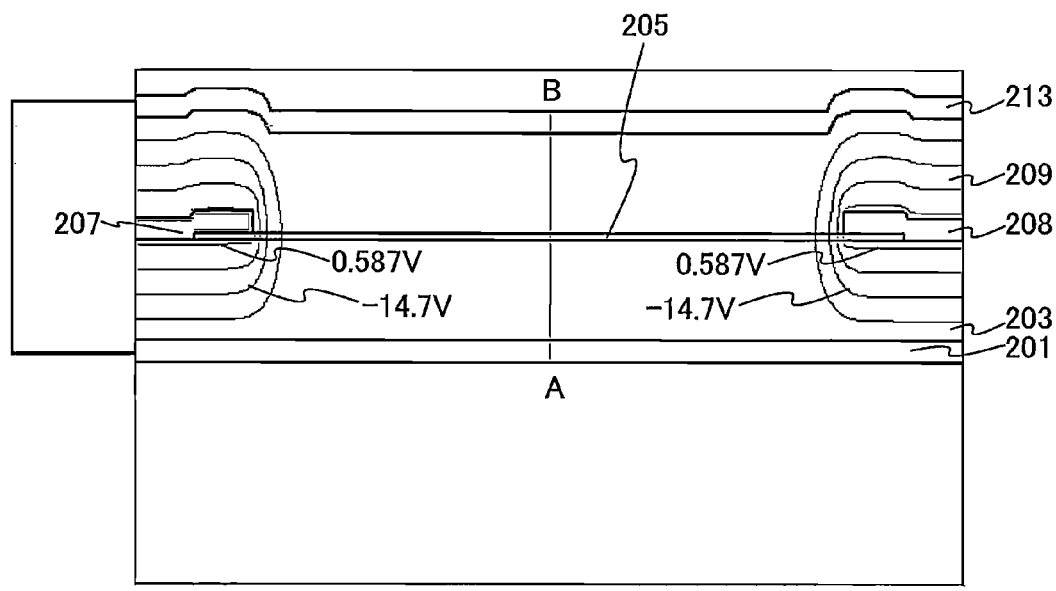
FIGS. 28A and 28B are diagrams for describing the calculation results of potentials of a transistor.
Figure 28B:
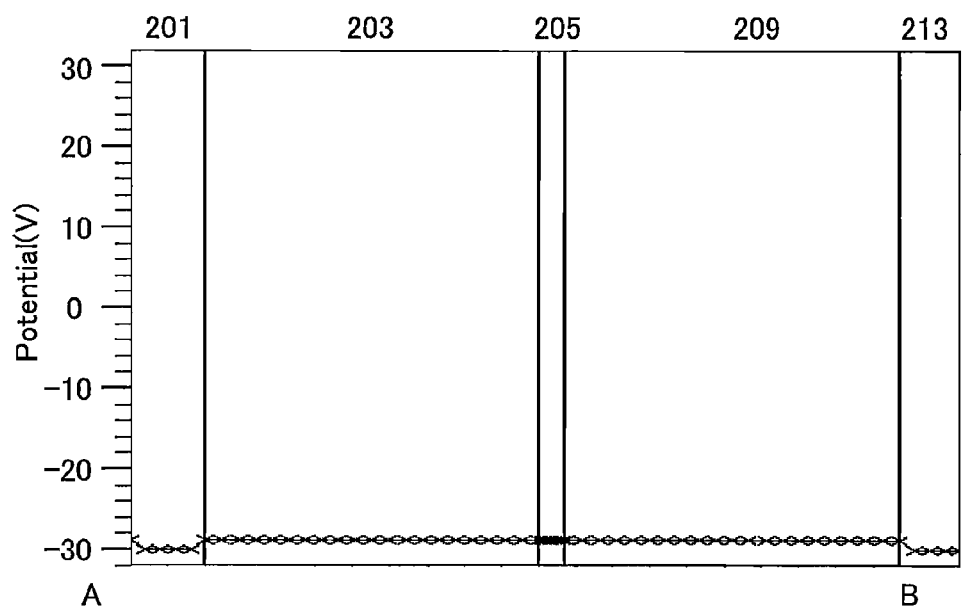

One of the reasons is that electrostatic stress is not caused on account of the dual-gate driving. FIG. 28A is a diagram in which potential contour lines are plotted in the case where −30 V is applied to each of the gate electrodes 201 and 213 in the transistor having Structure 1. FIG. 28B shows potentials at the cross section A-B in FIG. 28A.

The oxide semiconductor film 205 is an intrinsic semiconductor, and when a negative voltage is applied to the gate electrodes 201 and 213 and the oxide semiconductor film 205 is fully depleted, no charge exists between the gate electrodes 201 and 213. With this state, when the same potential is supplied to the gate electrodes 201 and 213, as illustrated in FIG. 28B, the potential of the gate electrode 201 becomes completely equal to that of the gate electrode 213. Since the potentials are equal to each other, electrostatic stress is not caused at the insulating film 203, the oxide semiconductor film 205, and the insulating film 209. As a result, phenomena causing degradation due to the −GBT stress test, such as mobile ions and trap and detrap of carriers in the insulating films 203 and 209, do not occur.

Figure 29A:
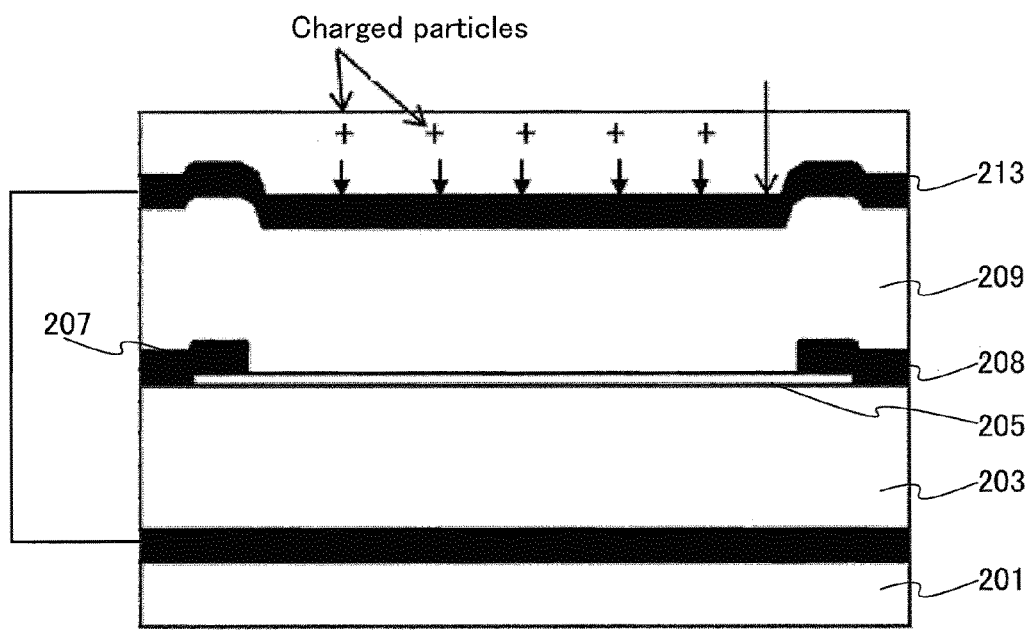
FIGS. 29A and 29B are diagrams for describing models.
Figure 29B:
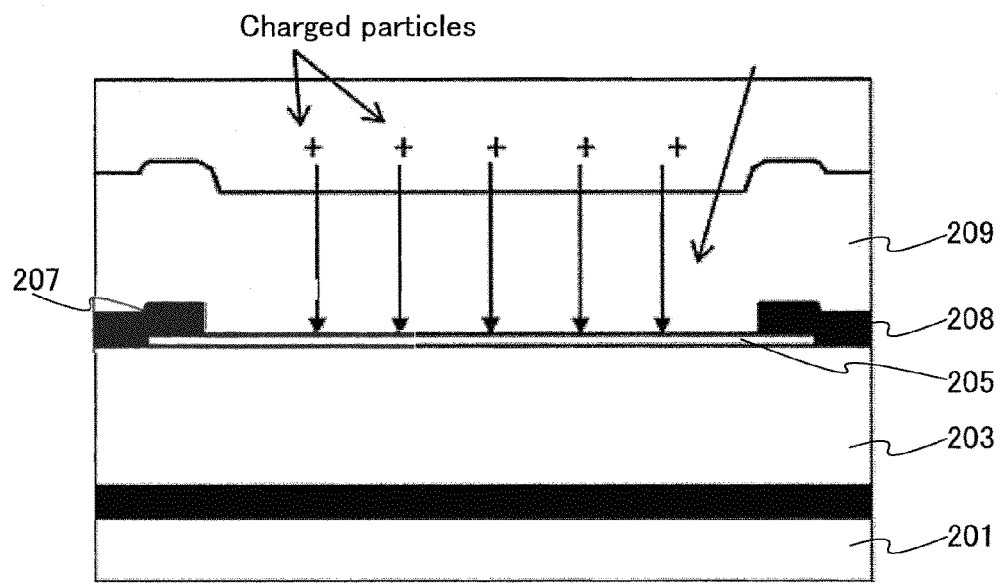

Another reason is that an external electric field of an FET can be blocked in the case of the dual-gate driving. FIG. 29A illustrates a model in which charged particles in the air are adsorbed on the gate electrode 213 in the transistor having Structure 1 illustrated in FIG. 26A. FIG. 29B illustrates a model in which charged particles in the air are adsorbed on the insulating film 209 in the transistor having Structure 2 illustrated in FIG. 26B.

As illustrated in FIG. 29B, in the transistor having Structure 2, positively charged particles in the air are adsorbed on the surface of the insulating film 209. When a negative voltage is applied to the gate electrode 201, positively charged particles are adsorbed on the insulating film 209. As a result, as indicated by arrows in FIG. 29B, an electric field of the positively charged particles affects the interface of the oxide semiconductor film 205 with the insulating film 209, so that a state similar to the state when a positive bias is applied is brought about. As a result, the threshold voltage might shift in the negative direction.

In contrast, even if positively charged particles are adsorbed on the surface of the gate electrode 213 in the transistor having Structure 1 illustrated in FIG. 29A, as indicated by arrows in FIG. 29A, the gate electrode 213 blocks the electric field of the positively charged particles; thus, the positively charged particles do not affect the electrical characteristics of transistor. In sum, the transistor can be electrically protected against external charges by the gate electrode 213, leading to suppression of the degradation due to the −GBT stress test.

For the above two reasons, in the transistor operated by the dual-gate driving, the degradation due to the −GBT stress test can be suppressed.

<Suppression of Changes in the Rising Voltages of on-State Current at Different Drain Voltages>

Here, in the case of Structure 2, changes in the rising voltages of on-state current at different drain voltages and a cause of the change are described.

Figure 30A:
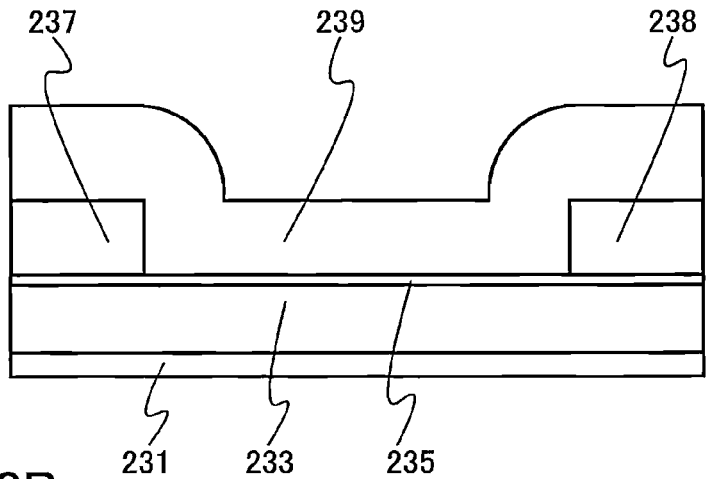
FIGS. 30A to 30C are diagrams for describing models.
Figure 30B:
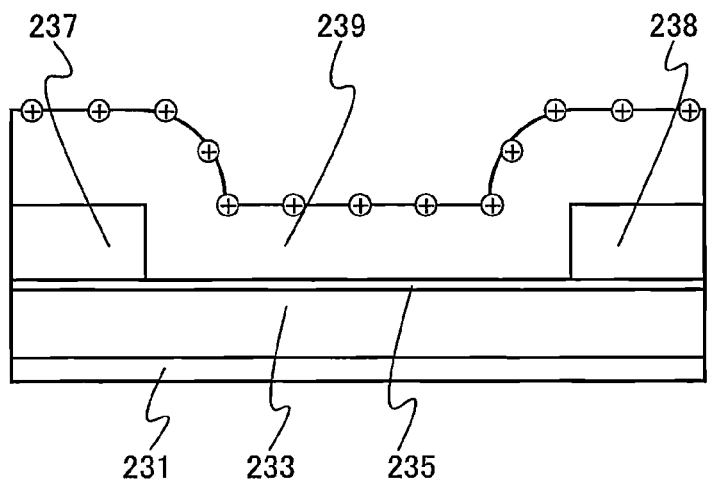
Figure 30C:
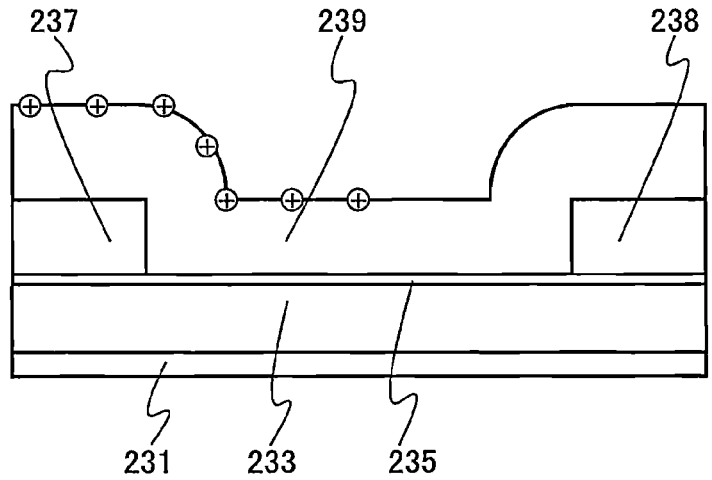

In a transistor illustrated in FIGS. 30A to 30C, a gate insulating film 233 is provided over a gate electrode 231, and an oxide semiconductor film 235 is provided over the gate insulating film 233. A pair of electrodes 237 and 238 are provided over the oxide semiconductor film 235, and an insulating film 239 is provided over the gate insulating film 233, the oxide semiconductor film 235, and the pair of electrodes 237 and 238.

Note that in the calculation, the work function $\phi_M$ of the gate electrode 231 was set to 5.0 eV. The gate insulating film 233 had a stacked-layer structure including a 400-nm-thick film having a dielectric constant of 7.5 and a 50-nm-thick film having a dielectric constant of 4.1. The oxide semiconductor film 235 was a single-layer In—Ga—Zn oxide film (In:Ga:Zn=1:1:1). The band gap $E_g$ of the In—Ga—Zn oxide film was 3.15 eV, the electron affinity $\chi$ was 4.6 eV, the dielectric constant was 15, the electron mobility was 10 cm$^2$/Vs, and the donor density $N_d$ was $1\times10^{13}$/cm$^3$. The work function $\phi_{sd}$ of the pair of electrodes 237 and 238 was set to 4.6 eV. Ohmic contact was made between the oxide semiconductor film 235 and each of the pair of electrodes 237 and 238. The insulating film 239 was a 550-nm-thick film having a dielectric constant of 3.9. Note that defect levels, surface scattering, and the like in the oxide semiconductor film 235 were not considered. Further, the channel length and the channel width of the transistor were 3 μm and 50 μm, respectively.

Next, models of a transistor illustrated in FIG. 30A in which positively charged particles are adsorbed on the surface of the insulating film 239 are illustrated in FIGS. 30B and 30C. FIG. 30B illustrates an assumed structure in which positive fixed charges are uniformly adsorbed on the surface of the insulating film 239. FIG. 30C illustrates an assumed structure in which positive fixed charges are partly adsorbed on the surface of the insulating film 239.

Figure 31A:
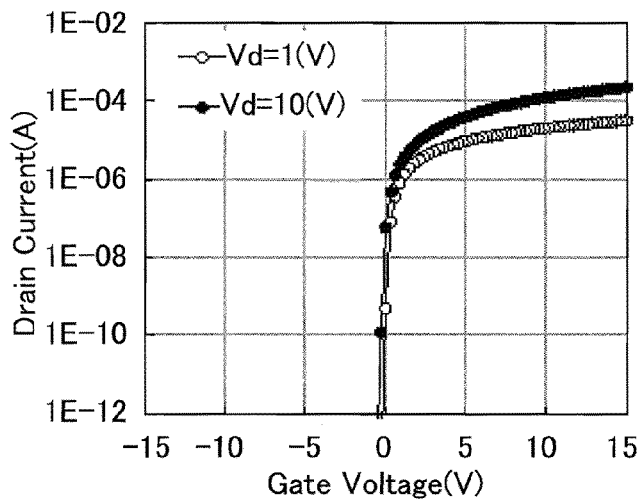
FIGS. 31A to 31C are diagrams for describing the calculation results of current-voltage curves.
Figure 31B:
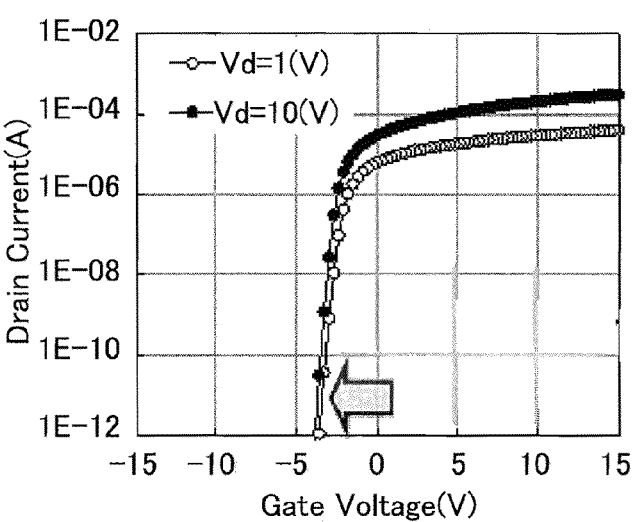
Figure 31C:
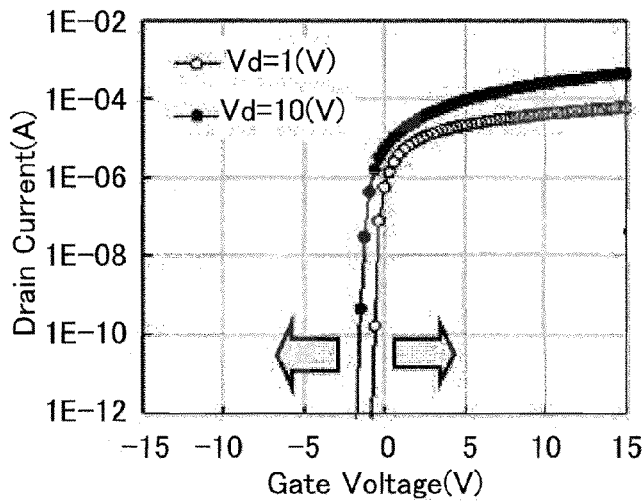

Calculation results of the electrical characteristics of the transistors illustrated in FIGS. 30A to 30C are shown in FIGS. 31A to 31C, respectively.

In the case where it is assumed that no positive fixed charge is adsorbed on the insulating film 239 in the transistor illustrated in FIG. 30A, the rising voltage at a drain voltage $V_d$ of 1 V approximately corresponds to that at a drain voltage $V_d$ of 10 V as shown in FIG. 31A.

In contrast, in the case where it is assumed that positive fixed charges are uniformly adsorbed on the insulating film 239 in the transistor illustrated in FIG. 30B, the threshold voltages shift in the negative direction. The rising voltage at a drain voltage $V_d$ of 1 V approximately corresponds to that at a drain voltage $V_d$ of 10 V as shown in FIG. 31B.

In the case where it is assumed that positive fixed charges are partly adsorbed on the insulating film 239 in the transistor illustrated in FIG. 30C, the rising voltage at a drain voltage $V_d$ of 1 V is different from that at a drain voltage $V_d$ of 10 V as shown in FIG. 31C.

Since the gate electrode 213 is provided in the transistor having Structure 1, as described in <Reduction in degradation due to −GBT stress test>, the gate electrode 213 blocks the electric field of external charged particles; thus, the charged particles do not affect the electrical characteristics of the transistor. In other words, the transistor can be electrically protected against external charges by the gate electrode 213, and changes in the rising voltages of on-state current at different drain voltages can be suppressed.

As described above, in the case where a dual-gate structure is employed and a given voltage is given to each gate electrode, degradation due to a −GBT stress test and changes in the rising voltages of on-state current at different drain voltages can be suppressed. Moreover, in the case where a dual-gate structure is employed and voltages having the same potential are given to each gate electrode, variation in initial characteristics can be reduced, degradation due to a −GBT stress test can be suppressed, and changes in the rising voltages of on-state current at different drain voltages can be suppressed.

<Distance Between End Portion of Gate Electrode and End Portion of Oxide Semiconductor Film in Channel Width Direction and Amount of Change in Threshold Voltage>

Figure 32A:
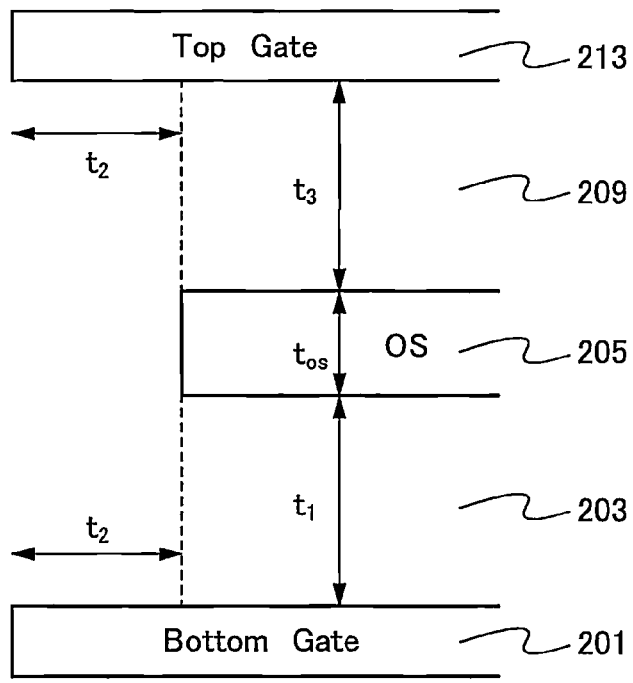
FIGS. 32A and 32B are cross-sectional views illustrating structures of transistors.
Figure 32B:
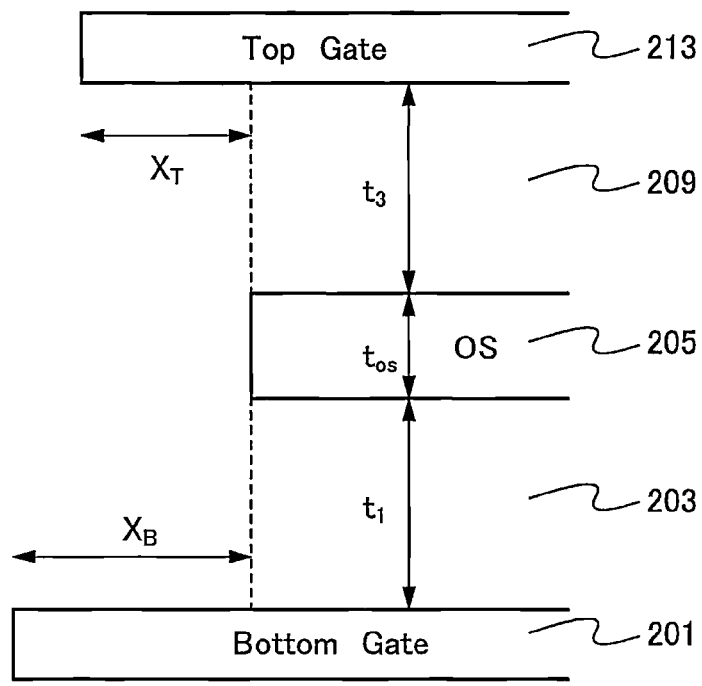

FIGS. 32A and 32B show schematic cross-sectional views of transistors having Structure 1 in the channel width direction. Note that components of the transistors in the schematic cross-sectional views of FIGS. 32A and 32B are in different scales from the respective components of Structure 1 in FIG. 26A.

Here, the following structure is referred to as Structure 3; in the channel width direction of the transistor having Structure 1, the gate electrode 201 and the gate electrode 213 each extend beyond the oxide semiconductor film 205 by $t_2$, and the gate electrodes do not face a side surface of the oxide semiconductor film 205 (see FIG. 32A).

In that case, the amount of change $\Delta V_4$ of $V_{th}$ that depends on the amount of charge Q (C/m$^2$) when a transistor having Structure 3 is driven by a dual gate driving can be represented by Formula 4.

[Formula 4]

$$\Delta V_4 = -\frac{Q}{C_{Bottom} + C_{Top}} \qquad (4)$$

The amount of change in $V_{th}$ of a transistor can be represented by Formula 4 only when the charge at the side surface of the oxide semiconductor film 205 is a main cause of a $V_{th}$ shift. For example, in a structure where the gate electrode 201 or 213 does not extend beyond the oxide semiconductor film 205 in the channel width direction, a parasitic channel is formed by the charge of donor ions at the side surface of the oxide semiconductor film 205 in some cases. In contrast, in the case of Structure 3, the influence of the charge is suppressed according to Formula 4.

Although donor ions at the side surface of the oxide semiconductor film 205 are assumed as a main source of the charge in the above description, the same applies to the case where fixed charge in an insulating film, at the interface of the insulating film, or in an oxide semiconductor film or electrons or holes captured by trap states are the main cause of a $V_{th}$ shift.

As a generalized example of Structure 3, Structure 4 is given. In Structure 4, the gate electrodes 201 and 213 extend beyond the oxide semiconductor film 205 by $X_B$ and $X_T$, respectively, in the channel width direction (see FIG. 32B). In that case, $C_{Bottom}$ and $C_{Top}$ can be expressed by Formulae 5 and 6, respectively.

[Formula 5]

$$C_{Bottom} = \varepsilon \frac{1}{t_1 + t_{os}/2}\left[\frac{1}{2} + \frac{(t_1 + t_{os})X_B}{(t_1 + t_{os})^2 + X_B^2}\right] \qquad (5)$$

[Formula 6]

$$C_{Top} = \varepsilon \frac{1}{t_3 + t_{os}/2}\left[\frac{1}{2} + \frac{(t_3 + t_{os})X_T}{(t_3 + t_{os})^2 + X_T^2}\right] \qquad (6)$$

In the case of varying the values of $X_B$ and $X_T$, when $X_B = t_1 + t_{os}$ in Formula 5, the maximum value $C_{Bottom}^{Max}$ in Formula 7 is obtained, and when $X_T = t_3 + t_{os}$ in Formula 6, the maximum value $C_{Top}^{MAX}$ in Formula 8 is obtained.

[Formula 7]

$$C_{Bottom}^{Max} = \varepsilon \frac{1}{t_1 + t_{os}/2} \quad (7)$$

[Formula 8]

$$C_{Top}^{Max} = \varepsilon \frac{1}{t_3 + t_{os}/2} \quad (8)$$

Thus, according to Formula 4, in order to minimize the amount of change in $V_{th}$, $X_B$ is made to be $t_1 + t_{os}$ and $X_T$ is made to be $t_3 + t_{os}$.

Note that the structures, methods, and the like described in this embodiment can be used as appropriate in combination with any of the structures, methods, and the like described in the other embodiments.

(Embodiment 4)

In this embodiment, a semiconductor device that is one embodiment of the present invention is described with reference to drawings. Note that in this embodiment, a display device is described as an example of a semiconductor device of one embodiment of the present invention.

Figure 9A:
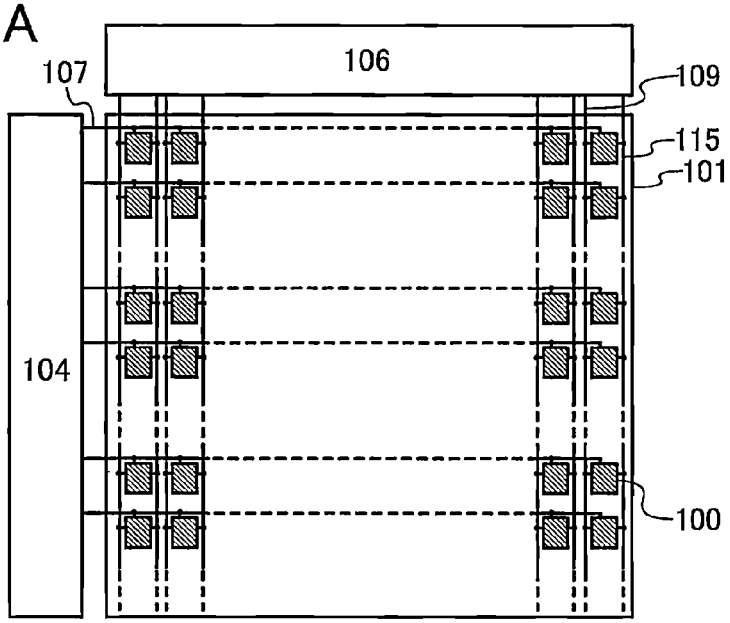
FIGS. 9A to 9C are a block diagram and a circuit diagram illustrating one embodiment of a semiconductor device.

FIG. 9A illustrates an example of a semiconductor device. The semiconductor device in FIG. 9A includes a pixel portion 101, a scan line driver circuit 104, a signal line driver circuit 106, m scan lines 107 that are arranged in parallel or substantially in parallel and whose potentials are controlled by the scan line driver circuit 104, and n signal lines 109 that are arranged in parallel or substantially in parallel and whose potentials are controlled by the signal line driver circuit 106. Further, the pixel portion 101 includes a plurality of pixels 100 arranged in a matrix. Furthermore, capacitor lines 115 arranged in parallel or substantially in parallel are provided along the signal lines 109. Note that the capacitor lines 115 may be arranged in parallel or substantially in parallel along the scan lines 107. The scan line driver circuit 104 and the signal line driver circuit 106 are collectively referred to as a driver circuit portion in some cases.

Each of the scan lines 107 is electrically connected to the n pixels 100 in the corresponding row among the pixels 100 arranged in m rows and n columns in the pixel portion 101. Each of the signal lines 109 is electrically connected to the m pixels 100 in the corresponding column among the pixels 100 arranged in m rows and n columns. Note that m and n are each an integer of 1 or more. Each of the capacitor lines 115 is electrically connected to the n pixels 100 in the corresponding row among the pixels 100 arranged in m rows and n columns. Note that in the case where the capacitor lines 115 are arranged in parallel or substantially in parallel along the signal lines 109, each of the capacitor lines 115 is electrically connected to the m pixels 100 in the corresponding column among the pixels 100 arranged in m rows and n columns.

Figure 9B:
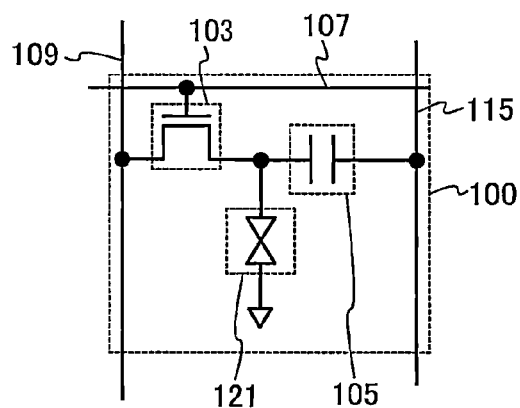
Figure 9C:
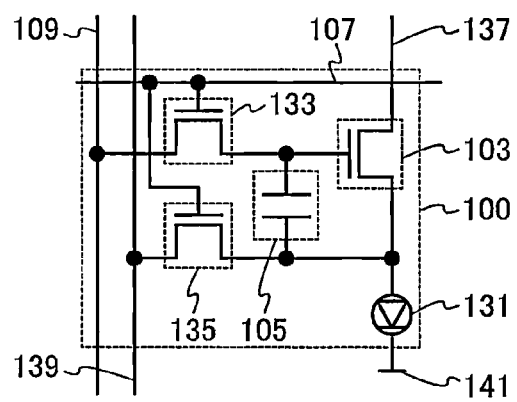

FIGS. 9B and 9C each illustrate an example of a circuit configuration that can be used for the pixels 100 in the display device illustrated in FIG. 9A.

The pixel 100 illustrated in FIG. 9B includes a liquid crystal element 121, a transistor 103, and a capacitor 105.

The potential of one of a pair of electrodes of the liquid crystal element 121 is set according to the specifications of the pixels 100 as appropriate. The alignment state of the liquid crystal element 121 depends on written data. A common potential may be applied to one of the pair of electrodes of the liquid crystal element 121 included in each of the plurality of pixels 100. Further, the potential supplied to one of a pair of electrodes of the liquid crystal element 121 in the pixel 100 in one row may be different from the potential supplied to one of a pair of electrodes of the liquid crystal element 121 in the pixel 100 in another row.

The liquid crystal element 121 is an element that controls transmission or non-transmission of light utilizing an optical modulation action of liquid crystal. Note that optical modulation action of a liquid crystal is controlled by an electric field applied to the liquid crystal (including a horizontal electric field, a vertical electric field, and an oblique electric field). Note that the following can be used for the liquid crystal element 121: a nematic liquid crystal, a cholesteric liquid crystal, a smectic liquid crystal, a thermotropic liquid crystal, a lyotropic liquid crystal, a ferroelectric liquid crystal, an anti-ferroelectric liquid crystal, and the like.

As examples of a driving method of the display device including the liquid crystal element 121, any of the following modes can be given: a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, a transverse bend alignment (TBA) mode, and the like. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 100 illustrated in FIG. 9B, one of a source electrode and a drain electrode of the transistor 103 is electrically connected to the signal line 109, and the other is electrically connected to the other of the pair of electrodes of the liquid crystal element 121. A gate electrode of the transistor 103 is electrically connected to the scan line 107. The transistor 103 has a function of controlling whether to write a data signal by being turned on or off.

In the pixel 100 illustrated in FIG. 9B, one of a pair of electrodes of the capacitor 105 is electrically connected to the capacitor line 115 to which a potential is supplied, and the other is electrically connected to the other of the pair of electrodes of the liquid crystal element 121. The potential of the capacitor line 115 is set in accordance with the specifications of the pixel 100 as appropriate. The capacitor 105 serves as a storage capacitor for storing written data.

For example, in the display device including the pixel 100 in FIG. 9B, the pixels 100 are sequentially selected row by row by the scan line driver circuit 104, whereby the transistors 103 is turned on and a data signal is written.

When the transistors 103 is turned off, the pixels 100 in which the data have been written are brought into a holding state. This operation is sequentially performed row by row; thus, an image is displayed.

The pixel 100 illustrated in FIG. 9C includes a transistor 133 for switching a display element, the transistor 103 for controlling driving of a pixel, a transistor 135, the capacitor 105, and a light-emitting element 131.

One of a source electrode and a drain electrode of the transistor 133 is electrically connected to the signal line 109 to which a data signal is supplied. A gate electrode of the transistor 103 is electrically connected to the scan line 107 to which a gate signal is supplied.

The transistor 133 has a function of controlling whether to write data of a data signal by being turned on or off.

One of source and drain electrodes of the transistor 103 is electrically connected to a wiring 137 serving as an anode line. The other of the source and drain electrodes of the transistor 103 is electrically connected to one of electrodes of the light-emitting element 131. A gate electrode of the transistor 103 is electrically connected to the other of the source and drain electrodes of the transistor 133 and one of electrodes of the capacitor 105.

The transistor 103 has a function of controlling current flowing through the light-emitting element 131 by being turned on or off.

One of source and drain electrodes of the transistor 135 is connected to a wiring 139 to which a data reference potential is supplied. The other of the source and drain electrodes of the transistor 135 is electrically connected to the one of the electrodes of the light-emitting element 131 and the other of the electrodes of the capacitor 105. A gate electrode of the transistor 135 is electrically connected to a scan line 107 to which a gate signal is supplied.

The transistor 135 has a function of controlling current flowing through the light-emitting element 131. For example, in the case where internal resistance of the light-emitting element 131 is increased by degradation or the like, by monitoring current flowing through the wiring 139 that is connected to the one of the source and drain electrodes of the transistor 135, current flowing through the light-emitting element 131 can be corrected. A potential that is supplied to the wiring 139 can be 0 V, for example.

The one of the electrodes of the capacitor 105 is electrically connected to the other of the source and drain electrodes of the transistor 103 and a gate electrode of the transistor 133. The other of the electrodes of the capacitor 105 is electrically connected to the other of the source and drain electrodes of the transistor 135 and the one of the electrodes of the light-emitting element 131.

In the configuration of the pixel 100 in FIG. 9C, the capacitor 105 serves as a storage capacitor storing written data.

The one of the electrodes of the light-emitting element 131 is electrically connected to the other of the source and drain electrodes of the transistor 135, the other of the electrodes of the capacitor 105, and the other of the source and drain electrodes of the transistor 103. The other of the electrodes of the light-emitting element 131 is electrically connected to a wiring 141 serving as a cathode.

As the light-emitting element 131, an organic electroluminescent element (also referred to as an organic EL element) or the like can be used, for example. Note that the light-emitting element 131 is not limited to organic EL elements; an inorganic EL element including an inorganic material can be used.

A high power supply potential VDD is supplied to one of the wirings 137 and 141, and a low power supply potential VSS is supplied to the other. In the configuration illustrated in FIG. 9C, a high power supply potential VDD is supplied to the wiring 137 and a low power supply potential VSS is supplied to the wiring 141.

In the display device including the pixel 100 in FIG. 9C, the pixels 100 are sequentially selected row by row by the scan line driver circuit 104, whereby transistors 102 are turned on and a data signal is written.

When the transistors 103 is turned off, the pixels 100 in which the data have been written are brought into a holding state. The transistor 103 is connected to the capacitor 105, and thus written data can be stored for a long period. The amount of current flowing between the source and drain electrodes is controlled by the transistor 133. The light-emitting element 131 emits light with a luminance corresponding to the amount of flowing current. This operation is sequentially performed row by row; thus, an image is displayed.

Figure 10:
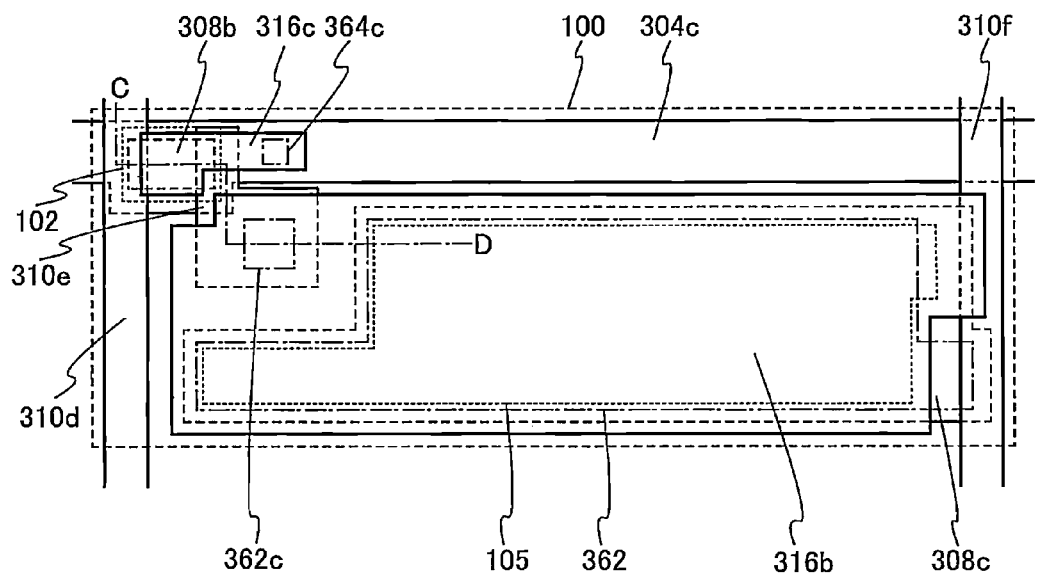
FIG. 10 is a top view illustrating one embodiment of a semiconductor device.

Next, a specific example of a liquid crystal display device including a liquid crystal element in the pixel 100 is described. FIG. 10 is a top view of the pixel 100 illustrated in FIG. 9B. Note that in FIG. 10, a counter electrode and a liquid crystal element are omitted.

In FIG. 10, a conductive film 304c serving as a scan line extends substantially perpendicularly to the signal line (in the horizontal direction in the drawing). A conductive film 310d serving as a signal line extends substantially perpendicularly to the scan line (in the vertical direction in the drawing). A conductive film 310f serving as a capacitor line extends in parallel to the signal line. Note that the conductive film 304c serving as a scan line is electrically connected to the scan line driver circuit 104 (see FIG. 9A), and the conductive film 310d serving as a signal line and the conductive film 310f serving as a capacitor line are electrically connected to the signal line driver circuit 106 (see FIG. 9A).

The transistor 103 is provided at a region where the scan line and the signal line cross each other. The transistor 103 includes the conductive film 304c serving as a gate electrode; a gate insulating film (not illustrated in FIG. 10); an oxide semiconductor film 308b which is over the gate insulating film and in which a channel region is formed; the conductive film 310d and a conductive film 310e that serve as a source electrode and a drain electrode; a protective film (not illustrated in FIG. 10) over the oxide semiconductor film 308b; and a conductive film 316c serving as a gate electrode. The conductive film 304c also serves as a scan line, and a region of the conductive film 304c that overlaps with the oxide semiconductor film 308b serves as the gate electrode of the transistor 102. In addition, the conductive film 310d also serves as a signal line, and a region of the conductive film 310d that overlaps with the oxide semiconductor film 308b serves as the source electrode or drain electrode of the transistor 102. Further, in the top view of FIG. 10, an end portion of the scan line is located on the outer side of an end portion of the oxide semiconductor film 308b. Thus, the scan line serves as a light-blocking film for blocking light from a light source such as a backlight. For this reason, the oxide semiconductor film 308b included in the transistor is not irradiated with light, so that variation in electrical characteristics of the transistor can be suppressed. The conductive films 304c and 316c each serving as the gate electrode are connected to each other in an opening 364c.

The conductive film 310e is electrically connected to a light-transmitting conductive film 316b that serves as a pixel electrode, through the opening 364c.

The capacitor 105 is connected to the conductive film 310f serving as a capacitor line through an opening 362. The capacitor 105 includes a film 308c having conductivity formed over the gate insulating film, a dielectric film formed of a nitride insulating film formed over the transistor 103, and the light-transmitting conductive film 316c that serves as the pixel electrode. The film 308c having conductivity has a light-transmitting property. That is, the capacitor 105 has a light-transmitting property.

Thanks to the light-transmitting property of the capacitor 105, the capacitor 105 can be formed large (covers a large area) in the pixel 100. Thus, a semiconductor device with increased charge capacity and an increased aperture ratio of, typically, 50% or more, 55% or more, or 60% or more can be obtained. For example, in a semiconductor device with a high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be increased. Typically, the capacitor 105 can be favorably used in a high-resolution semiconductor device with a pixel density of 200 ppi or more, furthermore, 300 ppi or more, still furthermore, 500 ppi or more.

The pixel 100 illustrated in FIG. 10 has a shape in which a side parallel to the conductive film 304c serving as a scan line is longer than a side parallel to the conductive film 310d serving as a signal line and the conductive film 310f serving as a capacitor line extends in parallel to the conductive film 310d serving as a signal line. As a result, the area where the conductive film 310f occupies in the pixel 100 can be decreased, thereby increasing the aperture ratio. In addition, the conductive film 310f serving as a capacitor line does not use a connection electrode and is in direct contact with the film 308c having conductivity, and thus the aperture ratio can be further increased.

Further, according to one embodiment of the present invention, the aperture ratio can be improved even in a display device with a high resolution, which makes it possible to use light from a light source such as a backlight efficiently, so that power consumption of the display device can be reduced.

Figure 11:
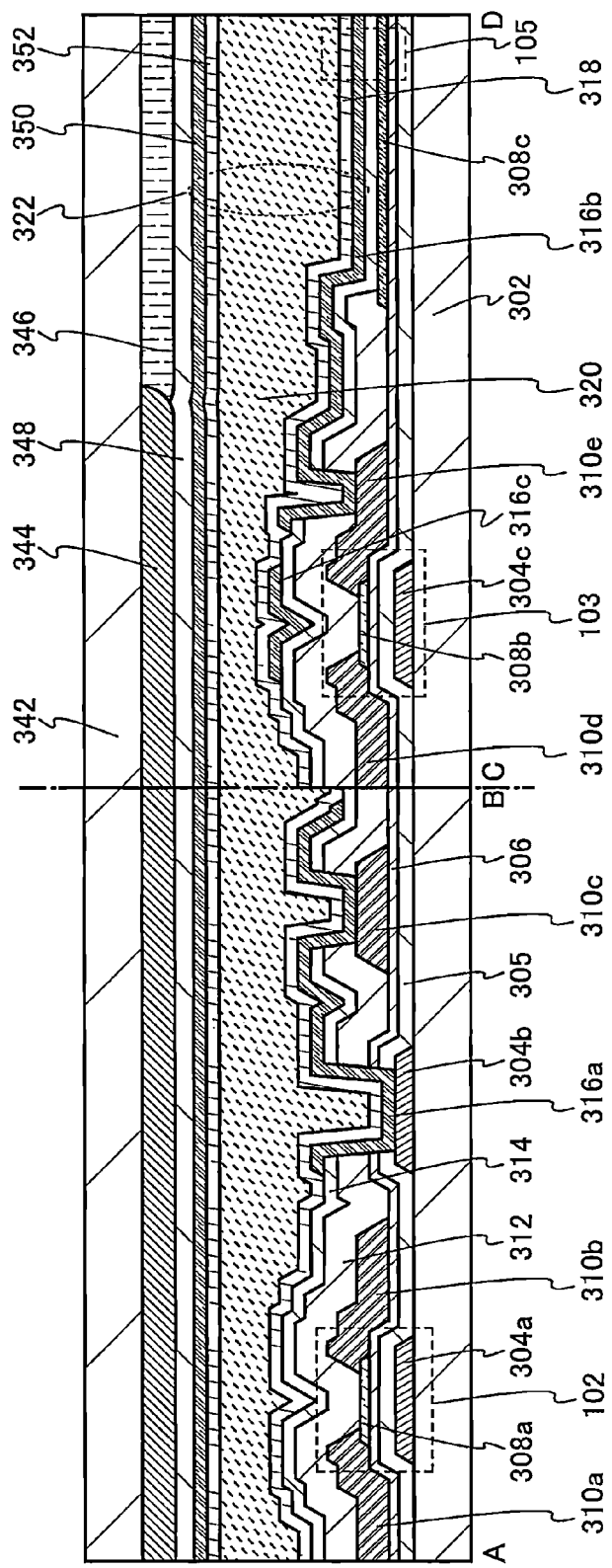
FIG. 11 is a cross-sectional view illustrating one embodiment of a semiconductor device.

FIG. 11 shows a cross section taken along dashed-dotted line C-D in FIG. 10. Note that a cross section A-B in FIG. 11 is a cross-sectional view of a driver circuit portion (a top view thereof is omitted) including the scan line driver circuit 104 and the signal line driver circuit 106. In this embodiment, a liquid crystal display device of a vertical electric field mode is described.

In the display device described in this embodiment, a liquid crystal element 322 is provided between a pair of substrates (a substrate 302 and a substrate 342).

The liquid crystal element 322 includes the light-transmitting conductive film 316b over the substrate 302, films controlling alignment (hereinafter referred to as alignment films 318 and 352), a liquid crystal layer 320, and a conductive film 350. Note that the light-transmitting conductive film 316b serves as one electrode of the liquid crystal element 322, and the conductive film 350 serves as the other electrode of the liquid crystal element 322.

Thus, a "liquid crystal display device" refers to a device including a liquid crystal element. Note that the liquid crystal display device includes a driver circuit for driving a plurality of pixels, and the like. The liquid crystal display device may also be referred to as a liquid crystal module including a control circuit, a power supply circuit, a signal generation circuit, a backlight module, and the like provided over another substrate.

In the driver circuit portion, a transistor 102 includes a conductive film 304a serving as a gate electrode, insulating films 305 and 306 collectively serving as a gate insulating film, a semiconductor film 308a in which a channel region is formed, and conductive films 310a and 310b serving as a source electrode and a drain electrode. The oxide semiconductor film 308a is provided over the gate insulating film.

In the pixel portion, the transistor 103 includes the conductive film 304c serving as a gate electrode, the insulating films 305 and 306 collectively serving as a gate insulating film, the oxide semiconductor film 308b that is formed over the gate insulating film and in which a channel region is formed, the conductive films 310d and 310e serving as a source electrode and a drain electrode, insulating films 312 and 314, and the conductive film 316c serving as a gate electrode. The oxide semiconductor film 308b is provided over the gate insulating film. The insulating films 312 and 314 are provided as protective films over the conductive films 310d and 310e.

The light-transmitting conductive film 316b serving as a pixel electrode is connected to the conductive film 310e through an opening provided in the insulating film 312 and the insulating film 314.

Further, the capacitor 105 includes the film 308c having conductivity serving as one electrode, the insulating film 314 serving as a dielectric film, and the light-transmitting conductive film 316b serving as the other electrode. The film 308c having conductivity is provided over the gate insulating film.

In the driver circuit portion, a conductive film 304b formed at the same time as the conductive films 304a and 304c and a conductive film 310c formed at the same time as the conductive films 310a, 310b, 310d, and 310e are connected to each other via a light-transmitting conductive film 316a formed at the same time as the light-transmitting conductive film 316b.

The conductive film 304b and the light-transmitting conductive film 316a are connected to each other through an opening provided in the insulating film 306 and the insulating film 312. Further, the conductive film 310c and the light-transmitting conductive film 316a are connected to each other through an opening provided in the insulating film 312 and the insulating film 314.

Here, components of the display device illustrated in FIG. 11 are described below.

The conductive films 304a, 304b, and 304c are formed over the substrate 302. The conductive film 304a serves as a gate electrode of the transistor in the driver circuit portion. The conductive film 304c is formed in the pixel portion 101 and serves as a gate electrode of the transistor in the pixel portion. The conductive film 304b is formed in the scan line driver circuit 104 and connected to the conductive film 310c.

The substrate 302 can be formed using the material of the substrate 11 that is given in Embodiment 1, as appropriate.

The conductive films 304a, 304b, and 304c can be formed using the material and the formation method of the gate electrode 15 that are described in Embodiment 1, as appropriate.

The insulating films 305 and 306 are formed over the substrate 302 and the conductive films 304a, 304c, and 304b. The insulating films 305 and 306 serve as a gate insulating film of the transistor in the driver circuit portion and a gate insulating film of the transistor in the pixel portion 101.

The insulating film 305 is preferably formed using the nitride insulating film that is described as the gate insulating film 17 in Embodiment 1. The insulating film 306 is preferably formed using the oxide insulating film that is described as the gate insulating film 17 in Embodiment 1.

The oxide semiconductor films 308a and 308b and the film 308c having conductivity are formed over the insulating film 306. The oxide semiconductor film 308a is formed in a position overlapping with the conductive film 304a and serves as a channel region of the transistor in the driver circuit portion. The oxide semiconductor film 308b is formed in a position overlapping with the conductive film 304c and serves as a channel region of the transistor in the pixel portion. The film 308c having conductivity serves as one electrode of the capacitor 105.

The oxide semiconductor films 308a and 308b and the film 308c having conductivity can be formed using the material and the formation method of the semiconductor film 18 that are described in Embodiment 1, as appropriate.

The film 308c having conductivity is an oxide semiconductor film as well as the oxide semiconductor films 308a and 308b and contains impurities. An example of the impurities is hydrogen. Instead of hydrogen, as the impurity, boron, phosphorus, tin, antimony, a rare gas element, alkali metal, alkaline earth metal, or the like may be included.

Both the oxide semiconductor films 308a and 308b and the film 308c having conductivity are formed over the gate insulating film but differ in impurity concentration. Specifically, the film 308c having conductivity has a higher impurity concentration than the oxide semiconductor films 308a and 308b. For example, the concentration of hydrogen contained in each of the oxide semiconductor films 308a and 308b is lower than or equal to $5\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$. The concentration of hydrogen contained in the film 308c having conductivity is higher than or equal to $8\times10^{19}$ atoms/cm$^3$, higher than or equal to $1\times10^{20}$ atoms/cm$^3$, or higher than or equal to $5\times10^{20}$ atoms/cm$^3$. The concentration of hydrogen contained in the film 308c having conductivity is greater than or equal to twice, or greater than or equal to 10 times those in the oxide semiconductor films 308a and 308b.

The film 308c having conductivity has lower resistivity than the oxide semiconductor films 308a and 308b. The resistivity of the film 308c having conductivity is preferably greater than or equal to $1\times10^{-8}$ times and less than or equal to $1\times10^{-1}$ times the resistivity of the oxide semiconductor films 308a and 308b. The resistivity of the film 308c having conductivity is typically greater than or equal to $1\times10^{-3}$ Ωcm and less than $1\times10^{4}$ Ωcm, or greater than or equal to $1\times10^{-3}$ Ωcm and less than $1\times10^{-1}$ Ωcm.

The oxide semiconductor films 308a and 308b are in contact with the films each formed using a material that can improve characteristics of the interface with the semiconductor film, such as the insulating film 306 and the insulating film 312. Thus, the oxide semiconductor films 308a and 308b serve as semiconductors, so that the transistors including the oxide semiconductor films 308a and 308b have excellent electrical characteristics.

Figure 14A:
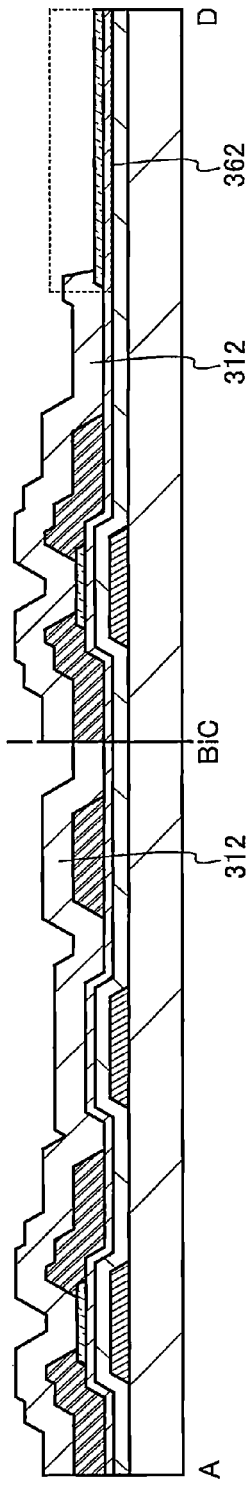
FIGS. 14A to 14C are cross-sectional views illustrating one embodiment of a method for manufacturing a semiconductor device.

The film 308c having conductivity is in contact with the insulating film 314 in the opening 362 (see FIG. 14A). The insulating film 314 is formed using a material that prevents diffusion of impurities from the outside, such as water, alkali metal, and alkaline earth metal, into the semiconductor film, and the material further includes hydrogen. Thus, when hydrogen in the insulating film 314 is diffused into the semiconductor film formed at the same time as the oxide semiconductor films 308a and 308b, hydrogen is bonded to oxygen and electrons serving as carriers are generated in the semiconductor film. Further, when the insulating film 314 is formed by a plasma CVD method or a sputtering method, a semiconductor film is exposed to plasma, so that oxygen vacancies are generated. When hydrogen contained in the insulating film 314 enters the oxygen vacancies, electrons serving as carriers are generated. As a result, the conductivity of the oxide semiconductor film is increased, so that the oxide semiconductor film serves as a conductor. In other words, the film 308c having conductivity can be referred to as an oxide semiconductor film with high conductivity. Here, a metal oxide that contains a material similar to those of the oxide semiconductor films 308a and 308b as a main component and has higher conductivity because hydrogen concentration of the metal oxide is higher than those of the oxide semiconductor films 308a and 308b is referred to as the "film 308c having conductivity".

Note that one embodiment of the present invention is not limited thereto, and it is possible that the film 308c having conductivity be not in contact with the insulating film 314 depending on circumstances.

Further, one embodiment of the present invention is not limited thereto, and the film 308c having conductivity may be formed by a different process from that of the oxide semiconductor film 308a or the oxide semiconductor film 308b depending on circumstances. In that case, the film 308c having conductivity may include a different material from that of the oxide semiconductor film 308a or the oxide semiconductor film 308b. For example, the film 308c having conductivity may be formed using ITO or indium zinc oxide, or the like.

In the semiconductor device illustrated in this embodiment, one electrode of the capacitor is formed at the same time as the semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes have a light-transmitting property, the capacitor has a light-transmitting property. As a result, the area occupied by the capacitor can be increased and the aperture ratio in a pixel can be increased.

The conductive films 310a, 310b, 310c, 310d, and 310e can be formed using the material and the formation method of the pair of electrodes 21 and 22 that are described in Embodiment 1, as appropriate.

The insulating films 312 and 314 are formed over the insulating film 306, the oxide semiconductor films 308a and 308b, the film 308c having conductivity, and the conductive films 310a, 310b, 310c, 310d, and 310e. For the insulating film 312, in a manner similar to that of the insulating film 306, a material that can improve characteristics of the interface with the oxide semiconductor films 308a and 308b is preferably used. The insulating film 312 can be formed using a material and a formation method that are similar to those of the oxide insulating film 24 that are described in at least Embodiment 1, as appropriate. Further, as described in Embodiment 1, the oxide insulating films 23 and 24 may be stacked.

For the insulating film 314, in a manner similar to that of the insulating film 305, a material that prevents diffusion of impurities from the outside, such as water, alkali metal, and alkaline earth metal, into the oxide semiconductor film is preferably used. The insulating film 314 can be formed using the material and the formation method of the nitride insulating film 25 that are described in Embodiment 1, as appropriate.

Further, the light-transmitting conductive films 316a and 316b and the conductive film 316c that serves as a gate electrode are provided over the insulating film 314. The light-transmitting conductive film 316a is electrically connected to the conductive film 304b through an opening 364a (see FIG. 14C) and electrically connected to the conductive film 310c through an opening 364b (see FIG. 14C). That is, the light-transmitting conductive film 316a serves as a connection electrode that connects the conductive film 304b and the conductive film 310c. The light-transmitting conductive film 316b is electrically connected to the conductive film 310e through the opening 364c (see FIG. 14C) and serves as the pixel electrode of a pixel. Further, the light-transmitting conductive film 316b can serve as one of the pair of electrodes of the capacitor. The conductive film 316c is electrically connected to the conductive film 304c through the opening 364c (see FIG. 10).

In order to form a connection structure in which the conductive film 304b is in direct contact with the conductive film 310c, it is necessary to form a mask by patterning for forming an opening in the insulating films 305 and 306 before the conductive film 310c is formed. However, the photomask is not needed to obtain the connection structure in FIG. 11. When the conductive film 304b is connected to the conductive film 310c with the light-transmitting conductive film 316b as illustrated in FIG. 11, it is not necessary to form a connection portion where the conductive film 304b is in direct contact with the conductive film 310c. Thus, the number of photomasks can be reduced by one. That is, steps for manufacturing a semiconductor device can be reduced.

For the light-transmitting conductive films 316a and 316b and the conductive film 316c, a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added can be used.

A film having a coloring property (hereinafter referred to as a coloring film 346) is formed on the substrate 342. The coloring film 346 serves as a color filter. Further, a light-blocking film 344 adjacent to the coloring film 346 is formed on the substrate 342. The light-blocking film 344 serves as a black matrix. The coloring film 346 is not necessarily provided in the case where the display device is a monochrome display device, for example.

The coloring film 346 is a coloring film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the coloring film 346. The insulating film 348 serves as a planarization layer or suppresses diffusion of impurities in the coloring film 346 to the liquid crystal element side.

The conductive film 350 is formed on the insulating film 348. The conductive film 350 serves as the other of the pair of electrodes of the liquid crystal element in the pixel portion. Note that an insulating film that serves as an alignment film may be additionally formed on the light-transmitting conductive films 316a and 316b and the conductive film 350.

The liquid crystal layer 320 is formed between the conductive films 316a to 316c and the conductive film 350. The liquid crystal layer 320 is sealed between the substrate 302 and the substrate 342 with the use of a sealant (not illustrated). The sealant is preferably in contact with an inorganic material to prevent entry of moisture and the like from the outside.

A spacer may be provided between the conductive films 316a to 316c and the conductive film 350 to maintain the thickness of the liquid crystal layer 320 (also referred to as a cell gap).

A method for manufacturing an element portion over the substrate 302 in the semiconductor device illustrated in FIG. 11 is described with reference to FIGS. 12A to 12C, FIGS. 13A to 13C, FIGS. 14A to 14C, and FIGS. 15A and 15B.

First, the substrate 302 is prepared. Here, a glass substrate is used as the substrate 302.

Next, a conductive film is formed over the substrate 302 and processed into desired regions, so that the conductive films 304a, 304b, and 304c are formed. The conductive films 304a, 304b, and 304c can be formed in such a manner that a mask is formed in the desired regions by first patterning and regions not covered with the mask are etched (see FIG. 12A).

The conductive films 304a, 304b, and 304c can be typically formed by an evaporation method, a CVD method, a sputtering method, a spin coating method, or the like.

Next, the insulating film 305 is formed over the substrate 302 and the conductive films 304a, 304b, and 304c, and then the insulating film 306 is formed over the insulating film 305 (see FIG. 12A).

The insulating films 305 and 306 can be formed by a sputtering method, a CVD method, or the like. Note that it is preferable that the insulating films 305 and 306 be formed in succession in a vacuum, in which case entry of impurities is suppressed.

Next, an oxide semiconductor film 307 is formed over the insulating film 306 (see FIG. 12B).

The oxide semiconductor film 307 can be formed by a sputtering method, a coating method, a pulsed laser deposition method, a laser ablation method, or the like.

Next, the oxide semiconductor film 307 is processed into desired regions, so that the island-shaped oxide semiconductor films 308a and 308b and an island-shaped oxide semiconductor films 308d are formed. The semiconductor films 308a, 308b, and 308d can be formed in such a manner that a mask is formed in the desired regions by second patterning and regions not covered with the mask are etched. For the etching, dry etching, wet etching, or a combination of dry etching and wet etching can be employed (see FIG. 12C).

Figure 13A:
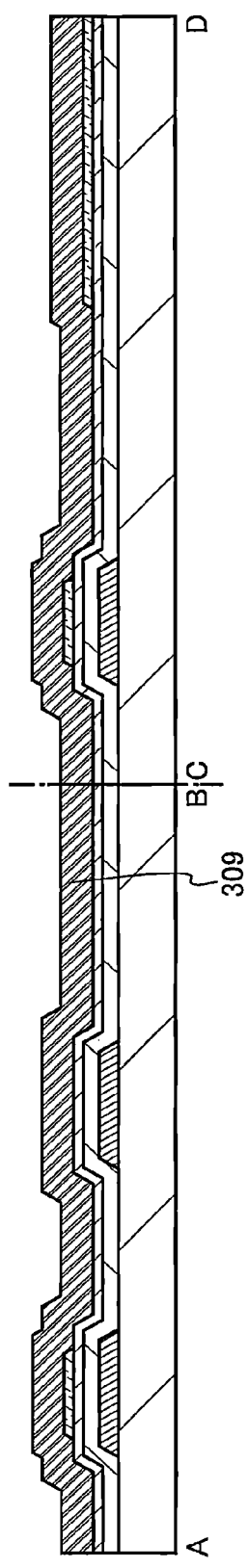
FIGS. 13A to 13C are cross-sectional views illustrating one embodiment of a method for manufacturing a semiconductor device.
Figure 13B:
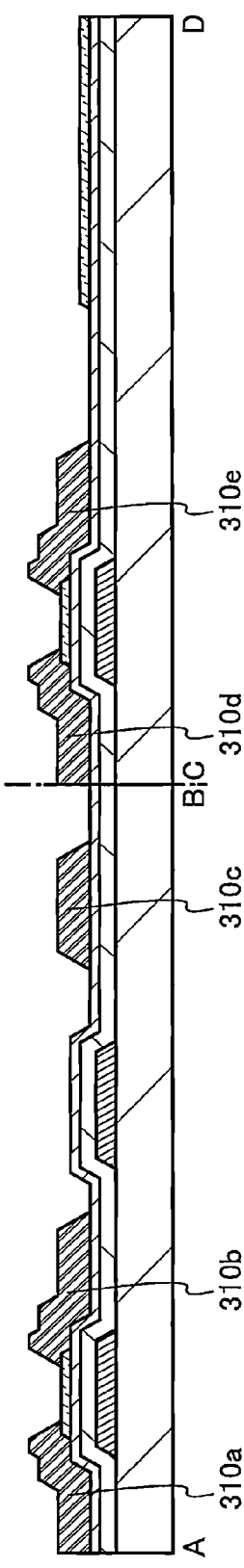

Next, a conductive film 309 is formed over the insulating film 306 and the oxide semiconductor films 308a, 308b, and 308d (see FIG. 13A).

The conductive film 309 can be formed by a sputtering method, for example.

Next, the conductive film 309 is processed into desired regions, so that the conductive films 310a, 310b, 310c, 310d and 310e are formed. The conductive films 310a, 310b, 310c, 310d, and 310e can be formed in such a manner that a mask is formed in the desired regions by third patterning and regions not covered with the mask are etched (see FIG. 13B).

Figure 13C:
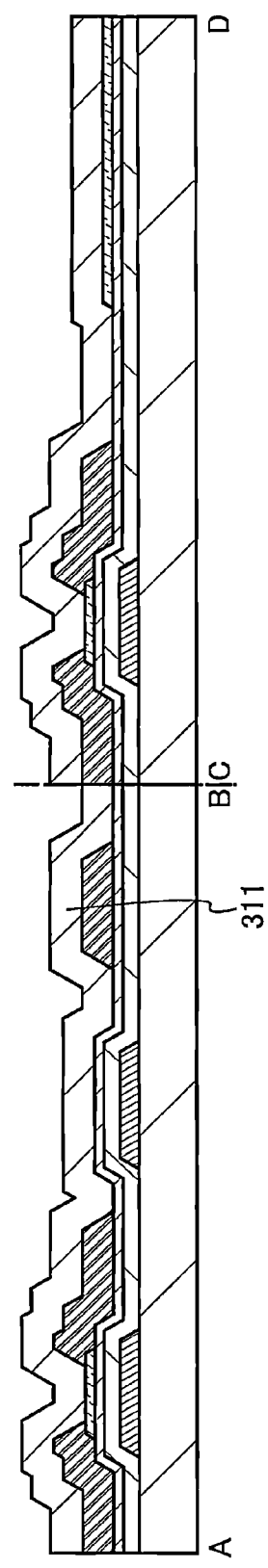

Next, an insulating film 311 is formed to cover the insulating film 306, the oxide semiconductor films 308a, 308b, and 308d, and the conductive films 310a, 310b, 310c, 310d, and 310e (see FIG. 13C).

The insulating film 311 can be formed with a stacked-layer structure under conditions similar to those for the oxide insulating films 23 and 24 in Embodiment 1. When the oxide insulating film 23 is formed while heating is performed as described in Embodiment 1, hydrogen, water, or the like in the oxide semiconductor films 308a, 308b, and 308d can be released; thus, highly purified oxide semiconductor films can be formed.

Next, the insulating film 311 is processed into desired regions so that the insulating film 312 and the opening 362 are formed. The insulating film 311 and the opening 362 can be formed in such a manner that a mask is formed in a desired region by fourth patterning and regions not covered with the mask are etched (see FIG. 14A).

The opening 362 is formed so as to expose the surface of the oxide semiconductor film 308d. An example of a formation method of the opening 362 includes, but not limited to, a dry etching method. Alternatively, a wet etching method or a combination of dry etching and wet etching can be employed for formation of the opening 362.

After that, in a manner similar to Embodiment 1, heat treatment can be performed to move part of oxygen in the insulating film 311 to the oxide semiconductor films 308a and 308b and reduce the amount of oxygen vacancies included in the oxide semiconductor films 308a and 308b.

Figure 14B:
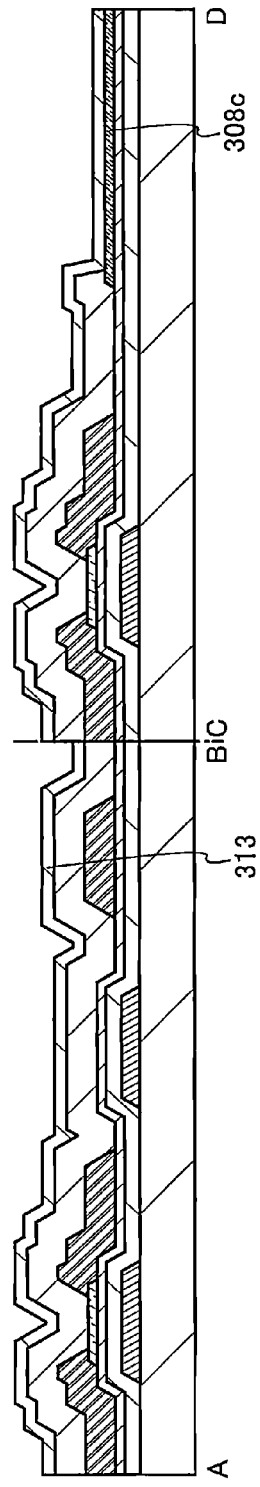

Next, an insulating film 313 is formed over the insulating film 312 and the oxide semiconductor film 308d (see FIG. 14B).

The insulating film 313 is preferably formed using a material that can prevent an external impurity such as oxygen, hydrogen, water, alkali metal, or alkaline earth metal, from diffusing into the oxide semiconductor film, more preferably formed using the material including hydrogen, and typically an inorganic insulating material containing nitrogen, such as a nitride insulating film, can be used. The insulating film 313 can be formed by a CVD method, for example.

The insulating film 314 is a film formed using a material that prevents diffusion of impurities from the outside, such as water, alkali metal, and alkaline earth metal, into the oxide semiconductor film, and the material further includes hydrogen. Thus, when hydrogen in the insulating film 314 is diffused into the oxide semiconductor film 308d, hydrogen is bonded to oxygen and electrons serving as carriers are generated in the oxide semiconductor film 308d. As a result, the conductivity of the oxide semiconductor film 308d is increased, so that the oxide semiconductor film 308d becomes the film 308c having conductivity.

The silicon nitride film is preferably formed at a high temperature to have an improved blocking property; for example, the silicon nitride film is preferably formed at a temperature in the range from the substrate temperature of 100° C. to 400° C., or at a temperature in the range from 300° C. to 400° C. When the silicon nitride film is formed at a high temperature, a phenomenon in which oxygen is released from the oxide semiconductor used for the oxide semiconductor films 308a and 308b and the carrier density is increased is caused in some cases; therefore, the upper limit of the temperature is a temperature at which the phenomenon is not caused.

Then, the insulating film 313 is processed into desired regions so that the insulating film 314 and the openings 364a, 364b, and 364c and an opening 364d are formed (see FIG. 10). The insulating film 314 and the openings 364a, 364b, and 364c can be formed in such a manner that a mask is formed in a desired region by fifth patterning and regions not covered by the mask are etched (see FIG. 14C).

The opening 364a is formed so as to expose a surface of the conductive film 304b. The opening 364b is formed so as to expose the conductive film 310c. The opening 364c is formed so as to expose the conductive film 310e. The opening 364d is formed so as to expose the conductive film 304c.

An example of a formation method of the openings 364a, 364b, 364c, and 364d includes, but not limited to, a dry etching method. Alternatively, a wet etching method or a combination of dry etching and wet etching can be employed for formation of the openings 364a, 364b, 364c, and 364d.

Then, a conductive film 315 is formed over the insulating film 314 so as to cover the openings 364a, 364b, 364c, and 364d (see FIG. 15A).

The conductive film 315 can be formed by a sputtering method, for example.

Then, the conductive film 315 is processed into desired regions so that the light-transmitting conductive films 316a and 316b and the conductive film 316c are formed. The light-transmitting conductive films 316a and 316b and the conductive film 316c are formed in such a manner that a mask is formed in the desired regions by sixth patterning and regions not covered with the mask are etched (see FIG. 15B).

Through the above process, the pixel portion and the driver circuit portion that include transistors can be formed over the substrate 302. In the manufacturing process described in this embodiment, the transistors and the capacitor can be formed at the same time by the first to sixth patterning, that is, with the six masks.

In this embodiment, the conductivity of the oxide semiconductor film 308d is increased by diffusing hydrogen contained in the insulating film 314 into the oxide semiconductor film 308d; however, the conductivity of the oxide semiconductor film 308d may be increased by covering the oxide semiconductor films 308a and 308b with a mask and adding impurities, typically, hydrogen, boron, phosphorus, tin, antimony, a rare gas element, alkali metal, alkaline earth metal, or the like to the oxide semiconductor film 308d. Hydrogen, boron, phosphorus, tin, antimony, a rare gas element, or the like is added to the oxide semiconductor film 308d by an ion doping method, an ion implantation method, or the like. Further, alkali metal, alkaline earth metal, or the like may be added to the oxide semiconductor film 308d by a method in which the oxide semiconductor film 308d is exposed to a solution that contains the impurity.

Next, a structure that is formed over the substrate 342 provided so as to face the substrate 302 is described below.

First, the substrate 342 is prepared. For materials of the substrate 342, the materials that can be used for the substrate 302 can be referred to. Then, the light-blocking film 344 and the colored film 346 are formed over the substrate 342 (see FIG. 16A).

The light-blocking film 344 and the colored film 346 each are formed in a desired position with any of various materials by a printing method, an inkjet method, an etching method using a photolithography technique, or the like.

Then, the insulating film 348 is formed over the light-blocking film 344 and the colored film 346 (see FIG. 16B).

For the insulating film 348, an organic insulating film of an acrylic resin, an epoxy resin, polyimide, or the like can be used. With the insulating film 348, an impurity or the like contained in the colored film 346 can be prevented from diffusing into the liquid crystal layer 320, for example. Note that the insulating film 348 is not necessarily formed.

Then, the conductive film 350 is formed over the insulating film 348 (see FIG. 16C). As the conductive film 350, a material that can be used for the conductive film 315 can be used.

Through the above process, the structure formed over the substrate 342 can be formed.

Next, the alignment film 318 and the alignment film 352 are formed over the substrate 302 and the substrate 342 respectively, specifically, over the insulating film 314 and the light-transmitting conductive films 316a and 316b formed over the substrate 302 and over the conductive film 350 formed over the substrate 342. The alignment films 318 and 352 can be formed by a rubbing method, an optical alignment method, or the like. After that, the liquid crystal layer 320 is formed between the substrate 302 and the substrate 342. The liquid crystal layer 320 can be formed by a dispenser method (a dropping method), or an injecting method by which a liquid crystal is injected using a capillary phenomenon after the substrate 302 and the substrate 342 are bonded to each other.

Through the above process, the display device illustrated in FIG. 11 can be fabricated.

This embodiment can be combined with another embodiment in this specification as appropriate.

MODIFICATION EXAMPLE 1

Figure 14C:
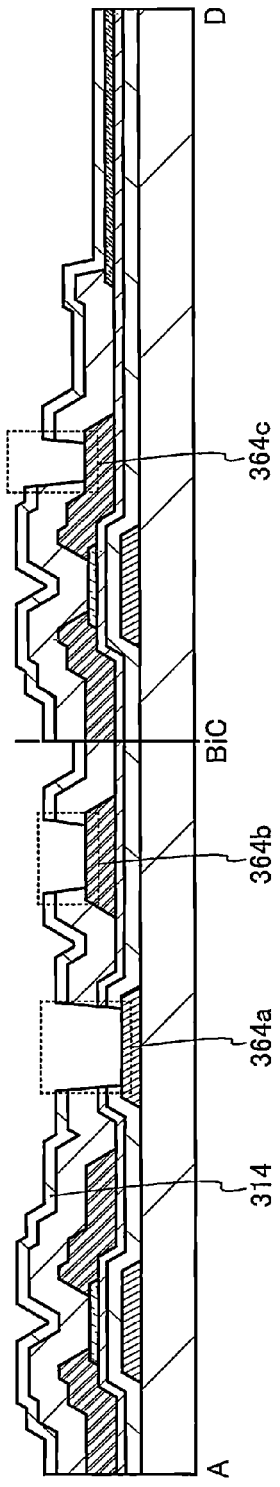

A modification example of the liquid crystal display device including a liquid crystal element in the pixel 100 is described. In the liquid crystal display device illustrated in FIG. 11, the light-transmitting film 308c having conductivity is in contact with the insulating film 314, but may be in contact with the insulating film 305. In this case, since the opening 362 illustrated in FIGS. 14A to 14C is not necessarily provided, the unevenness of the surfaces of the conductive films 316a and 316b can be reduced. Thus, alignment disorder of the liquid crystal materials contained in the liquid crystal layer 320 can be reduced. Further, a high-contrast semiconductor device can be fabricated.

Such a structure can be obtained as follows: in FIG. 12B, before the oxide semiconductor film 307 is formed, the insulating film 306 is selectively etched, so that part of the insulating film 305 is exposed.

MODIFICATION EXAMPLE 2

In this embodiment or the modification example, an organic insulating film of an acrylic resin, an epoxy resin, polyimide, or the like may be formed between the alignment film 318 and any of the insulating film 314, the light-transmitting conductive films 316a and 316b, and the conductive film 316c. The organic insulating film of an acrylic-based resin or the like can reduce unevenness of the surface of the light-transmitting conductive film 316b because of its high planarity. Thus, alignment disorder of the liquid crystal materials contained in the liquid crystal layer 320 can be reduced. Further, a high-contrast semiconductor device can be fabricated.

(Embodiment 5)

In this embodiment, one embodiment that can be applied to the oxide semiconductor film in any of the transistors included in the semiconductor device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed using a CAAC-OS film. Furthermore, the oxide semiconductor film may include an amorphous oxide semiconductor and an oxide semiconductor having a crystal grain. Described below are the single-crystal oxide semiconductor, the CAAC-OS, the polycrystalline oxide semiconductor, the microcrystalline oxide semiconductor, and the amorphous oxide semiconductor.

<Single-Crystal Oxide Semiconductor>

The single-crystal oxide semiconductor film has a lower impurity concentration and a lower density of defect states (few number of oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has higher density than the CAAC-OS film. The CAAC-OS film has higher density than the microcrystalline oxide semiconductor film. The polycrystalline oxide semiconductor film has higher density than the microcrystalline oxide semiconductor film. The microcrystalline oxide semiconductor film has higher density than the amorphous oxide semiconductor film.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC oxide film is greater than or equal to 2500 nm$^2$, greater than or equal to 5 µm$^2$, or greater than or equal to 1000 µm$^2$. Further, in a cross-sectional TEM image, when the proportion of the crystal parts is greater than or equal to 50%, greater than or equal to 80%, or greater than or equal to 95% of the CAAC-OS film, the CAAC-OS film is a thin film having physical properties similar to those of a single crystal.

In a transmission electron microscope (TEM) image of the CAAC-OS film, a boundary between crystals, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is derived from the (00x) plane (x is an integer) of the InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of 2θ may also be observed at around 36°, in addition to the peak of 2θ at around 31°. The peak of 2θ at around 36° indicates that a crystal part having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor that includes the oxide semiconductor film having high impurity concentration and a high density of defect states has unstable electrical characteristics in some cases.

With the use of the CAAC-OS film in a transistor, variation in electrical characteristics of the transistor due to irradiation with visible light or ultraviolet light is small.

<Polycrystalline Oxide Semiconductor>

In an image obtained with a TEM, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystals can be found in the polycrystalline oxide semiconductor film in some cases.

The polycrystalline oxide semiconductor film may include a plurality of crystal grains, and alignment of crystals may be different in the plurality of crystal grains. When the polycrystalline oxide semiconductor film is analyzed by, for example, an out-of-plane method with an XRD apparatus, one or plural peaks appear in some cases. For example, in the case of a polycrystalline IGZO film, a peak at 2θ of around 31° that shows alignment or plural peaks that show plural kinds of alignment appear in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor using the polycrystalline oxide semiconductor film has larger variation in electrical characteristics and lower reliability than a transistor using a CAAC-OS film in some cases.

<Microcrystalline Oxide Semiconductor>

In an image obtained with the TEM, crystal parts cannot be found clearly in the microcrystalline oxide semiconductor in some cases. In most cases, the size of a crystal part in a microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Further, a halo pattern is shown in a selected-area electron diffraction pattern of the nc-OS film obtained by using an electron beam having a diameter larger than the diameter of a crystal part (e.g., larger than or equal to 50 nm). Meanwhile, spots are shown in a nanobeam electron diffraction pattern of the nc-OS film obtained by using an electron beam having a diameter (e.g., larger than or equal to 1 nm and smaller than or equal to 30 nm) close to, or smaller than or equal to that of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

Figure 17:
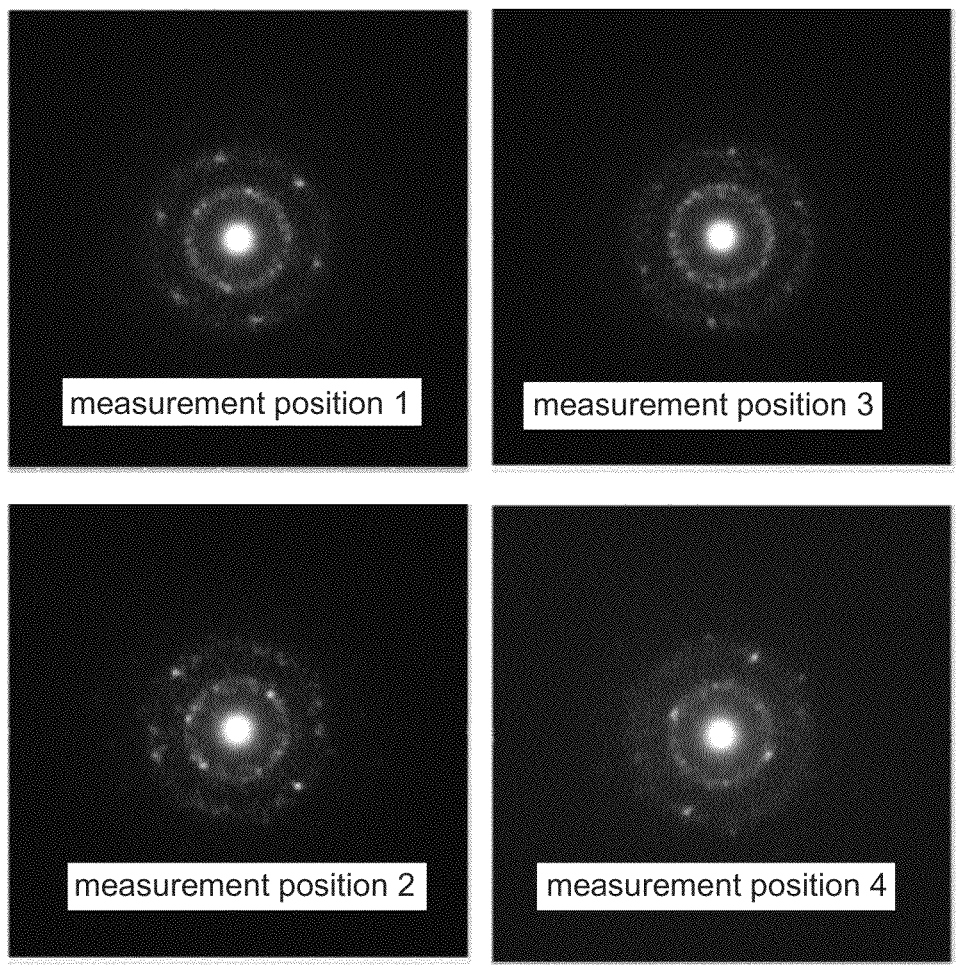
FIG. 17 shows nanobeam electron diffraction patterns of an oxide semiconductor.

FIG. 17 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 17 shows that, when a nanobeam electron diffraction is performed on the sample including the nc-OS film, a diffraction pattern exhibiting a crystal plane is obtained, but orientation along a crystal plane in a particular direction is not observed.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that the structures, methods, and the like described in this embodiment can be used as appropriate in combination with any of the structures, methods, and the like described in the other embodiments.

(Embodiment 6)

Although the oxide semiconductor film described in the above embodiment can be formed by sputtering, such a film may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film that are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas that is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

Note that the structures, methods, and the like described in this embodiment can be used as appropriate in combination with any of the structures, methods, and the like described in the other embodiments.

EXAMPLE 1

In this example, measurement results of $V_g$-$I_d$ characteristics and a GBT stress test of a transistor are described.

In this example, Samples 1 to 3 that are embodiments of the present invention and Samples 4 to 6 for comparison were fabricated. First, a process for fabricating Sample 1 is described. Samples 1 to 3, which are embodiments of the present invention, are described with reference to FIGS. 18A to 18C, and Samples 4 to 6 for comparison are described with reference to FIGS. 19A to 19C.

(Sample 1)

Figure 18A:
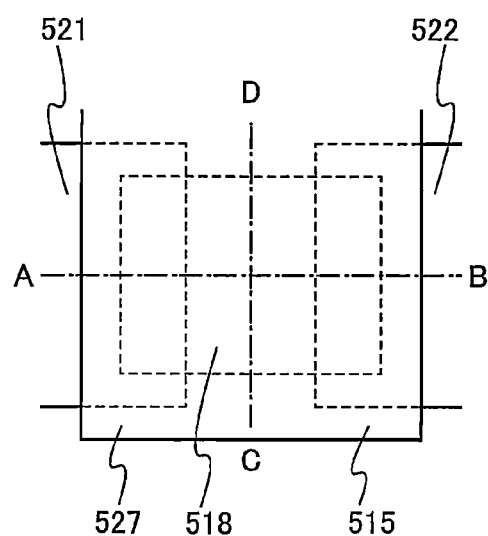
FIGS. 18A to 18C are a top view and cross-sectional views illustrating one embodiment of a transistor.
Figure 18C:
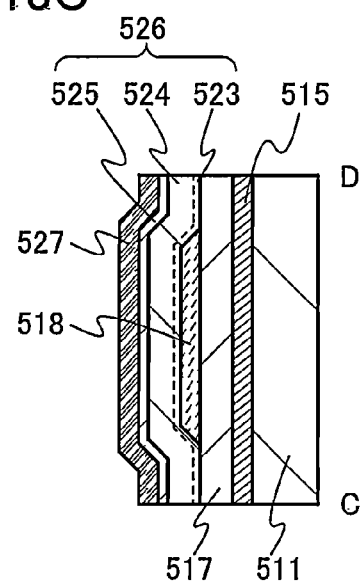
Figure 18B:
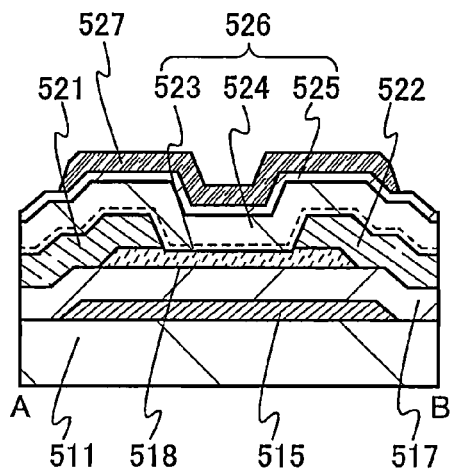

Sample 1 includes a substrate 511; a gate electrode 515 over the substrate 511; a gate insulating film 517 over the substrate 511 and the gate electrode 515; an oxide semiconductor film 518 that is over the gate insulating film 517 and in a region overlapping with the gate electrode 515; a pair of electrodes 521 and 522 over the gate insulating film 517 and the oxide semiconductor film 518; a protective film 526 over the oxide semiconductor film 518 and the pair of electrodes 521 and 522; and a back gate electrode 527 that is over the protective film 526 and in a region overlapping with the gate electrode 515 (see FIGS. 18A to 18C).

Note that the protective film 526 has a three-layer structure of an oxide insulating film 523, an oxide insulating film 524, and a nitride insulating film 525. As illustrated in FIG. 18B, the both end portions of the back gate electrode 527 are substantially aligned with those of the gate electrode 515. As illustrated in FIG. 18C, the back gate electrode 527 is formed to cover the oxide semiconductor film 518 with the protective film 526 positioned therebetween.

Next, a fabrication method of the sample 1 illustrated in FIGS. 18A to 18C is described below.

First, a glass substrate was used as the substrate 511, and the gate electrode 515 was formed over the substrate 511.

A 200-nm-thick tungsten film was formed by a sputtering method, a mask was formed over the tungsten film by a photolithography process, and part of the tungsten film was etched with the use of the mask, so that the gate electrode 515 was formed.

Next, the gate insulating film 517 was formed over the gate electrode 515.

As the gate insulating film 517, a stacked layer including a 400-nm-thick silicon nitride film and a 50-nm-thick silicon oxynitride film was formed.

Note that the silicon nitride film has a three-layer structure of a first silicon nitride film, a second silicon nitride film, and a third silicon nitride film.

The first silicon nitride film was formed to have a thickness of 50 nm under the following conditions: silane with a flow rate of 200 sccm, nitrogen with a flow rate of 2000 sccm, and an ammonia gas with a flow rate of 100 sccm were supplied to a treatment chamber of a plasma CVD apparatus as the source gas; the pressure in the treatment chamber was controlled to 100 Pa, and a power of 2000 W was supplied with the use of a 27.12 MHz high-frequency power source. The second silicon nitride film was formed to have a thickness of 300 nm under the following conditions: silane with a flow rate of 200 sccm, nitrogen with a flow rate of 2000 sccm, and an ammonia gas with a flow rate of 2000 sccm were supplied to a treatment chamber of a plasma CVD apparatus as the source gas; the pressure in the treatment chamber was controlled to 100 Pa, and a power of 2000 W was supplied with the use of a 27.12 MHz high-frequency power source. Next, the third silicon nitride film was formed to have a thickness of 50 nm under the following conditions: silane with a flow rate of 200 sccm and nitrogen with a flow rate of 5000 sccm were supplied to the treatment chamber of the plasma CVD apparatus as the source gas; the pressure in the treatment chamber was controlled to 100 Pa, and a power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane with a flow rate of 20 sccm and dinitrogen monoxide with a flow rate of 3000 sccm were supplied to the treatment chamber of the plasma CVD apparatus as the source gas; the pressure in the treatment chamber was controlled to 40 Pa, and a power of 100 W was supplied with the use of a 27.12 MHz high-frequency power source. Note that the silicon oxynitride film was formed at a substrate temperature of 350° C.

Next, the oxide semiconductor film 518 was formed to overlap with the gate electrode 515 with the gate insulating film 517 interposed therebetween.

Here, a 35-nm-thick oxide semiconductor film was formed over the gate insulating film 517 by a sputtering method.

The oxide semiconductor film was formed under the following conditions: a sputtering target where In:Ga:Zn=3:1:2 (atomic ratio) was used; oxygen with a flow rate of 100 sccm was supplied as a sputtering gas into a treatment chamber of a sputtering apparatus; the pressure in the treatment chamber was controlled to 0.6 Pa; and a direct-current power of 5 kW was supplied. Note that the oxide semiconductor film was formed at a substrate temperature of 170° C.

Next, the pair of electrodes 521 and 522 in contact with the oxide semiconductor film 518 were formed.

Here, a conductive film was formed over the gate insulating film 517 and the oxide semiconductor film 518. Note that as the conductive film, a 400-nm-thick aluminum film was formed over a 50-nm-thick tungsten film, and a 200-nm-thick titanium film was formed over the aluminum film. Then, a mask was formed over the conductive film by a photolithography process, and part of the conductive film was etched with the use of the mask, whereby the pair of electrodes 521 and 522 were formed.

Next, after the substrate was transferred to a treatment chamber in a reduced pressure and heated at 350° C., the oxide semiconductor film 518 was exposed to oxygen plasma that was generated in a dinitrogen monoxide atmosphere by supply of a high-frequency power of 150 W to an upper electrode provided in the treatment chamber with the use of a 27.12 MHz high-frequency power source.

Next, the protective film 526 was formed over the oxide semiconductor film 518 and the pair of electrodes 521 and 522. Here, as the protective film 526, the oxide insulating film 523, the oxide insulating film 524, and the nitride insulating film 525 were formed.

First, after the above oxygen plasma treatment, the oxide insulating films 523 and 524 were formed in succession without exposure to the atmosphere. A 50-nm-thick silicon oxynitride film was formed as the oxide insulating film 523, and a 400-nm-thick silicon oxynitride film was formed as the oxide insulating film 524.

The oxide insulating film 523 was formed by a plasma CVD method under the following conditions: silane with a flow rate of 20 sccm and dinitrogen monoxide with a flow rate of 3000 sccm were used as the source gas; the pressure in the treatment chamber was 200 Pa; the substrate temperature was 350° C.; and a high-frequency power of 100 W was supplied to parallel-plate electrodes.

The oxide insulating film 524 was formed by a plasma CVD method under the following conditions: silane with a flow rate of 160 sccm and dinitrogen monoxide with a flow rate of 4000 sccm were used as the source gas, the pressure in the treatment chamber was 200 Pa, the substrate temperature was 220° C., and the high-frequency power of 1500 W was supplied to the parallel-plate electrodes. Under the above conditions, it is possible to form a silicon oxynitride film containing a higher proportion of oxygen than that of oxygen in the stoichiometric composition and from which part of oxygen is released by heating.

Next, by heat treatment, water, nitrogen, hydrogen, or the like was released from the oxide insulating films 523 and 524 and part of oxygen contained in the oxide insulating film 524 was supplied to the oxide semiconductor film 518. Here, the heat treatment was performed at 350° C. in a mixed atmosphere of nitrogen and oxygen for one hour.

Then, a 100-nm-thick nitride insulating film 525 was formed over the oxide insulating film 524. The nitride insulating film 525 was formed by a plasma CVD method under the following conditions: silane with a flow rate of 50 sccm, nitrogen with a flow rate of 5000 sccm, and an ammonia gas with a flow rate of 100 sccm were used as the source gas, the pressure in the treatment chamber was 100 Pa, the substrate temperature was 350° C., and a high-frequency power of 1000 W was supplied to the parallel-plate electrodes.

Next, an oxide insulating film (not illustrated) was formed over the protective film 526. The oxide insulating film was formed by a plasma CVD method under the following conditions: tetraethoxysilane (TEOS: $Si(OC_2H_5)_4$), which is an organosilane gas, with a flow rate of 200 sccm and oxygen with a flow rate of 10000 sccm were used as the source gas, the pressure in the treatment chamber was 175 Pa, the substrate temperature was 350° C., and a high-frequency power of 3300 W was supplied to the parallel-plate electrodes.

Then, the back gate electrode 527 was formed over the oxide insulating film that was over the protective film 526. Here, as the back gate electrode 527, a 100-nm-thick conductive film of an indium oxide-tin oxide compound (ITO—$SiO_2$) was formed by a sputtering method. Note that the composition of a target used for forming the conductive film was $In_2O_3:SnO_2:SiO_2=85:10:5$ [wt %]. After that, heat treatment was performed at 250° C. in a nitrogen atmosphere for one hour.

Through the above process, Sample 1 of this example was fabricated.

(Sample 2)

Sample 2 differs from Sample 1 in the structure of the oxide semiconductor film 518. Specifically, the oxide semiconductor film 518 in Sample 2 has a stacked-layer structure of a first oxide semiconductor film and a second oxide semiconductor film.

The first oxide semiconductor film was formed under the following conditions: a sputtering target where In:Ga:Zn=3:1:2 (atomic ratio) was used; oxygen with a flow rate of 100 sccm was supplied as a sputtering gas into a treatment chamber of a sputtering apparatus; the pressure in the treatment chamber was controlled to 0.6 Pa; and a direct-current power of 5 kW was supplied.

The second oxide semiconductor film was formed in succession over the first oxide semiconductor film in a vacuum. The second oxide semiconductor film was formed under the following conditions: a sputtering target where In:Ga:Zn=1:3:2 (atomic ratio) was used; oxygen with a flow rate of 30 sccm and argon with a flow rate of 270 sccm were supplied as a sputtering gas into a treatment chamber of a sputtering apparatus; the pressure in the treatment chamber was controlled to 0.6 Pa; and a direct-current power of 5 kW was supplied. Note that the first and second oxide semiconductor films were each formed at a substrate temperature of 170° C.

Since Sample 2 has the same structure as that of Sample 1 except the structure of the oxide semiconductor film 518, Sample 1 can be referred to for the formation of Sample 2.

(Sample 3)

Sample 3 differs from Sample 1 in the structure of the oxide semiconductor film 518. Specifically, the oxide semiconductor film 518 in Sample 3 has a stacked-layer structure of a first oxide semiconductor film, a second oxide semiconductor film, and a third oxide semiconductor film.

First, the first oxide semiconductor film was formed in such a manner that a sputtering target where In:Ga:Zn=1:3:2 (atomic ratio) was used, oxygen with a flow rate of 30 sccm and argon with a flow rate of 270 sccm were supplied as sputtering gases into a treatment chamber of a sputtering apparatus, the pressure in the treatment chamber was adjusted to 0.6 Pa, and a direct-current power of 5 kW was supplied.

The second oxide semiconductor film was formed in succession over the first oxide semiconductor film in a vacuum. The second oxide semiconductor film was formed under the following conditions: a sputtering target where In:Ga:Zn=3:1:2 (atomic ratio) was used; oxygen with a flow rate of 100 sccm and argon with a flow rate of 100 sccm were supplied as a sputtering gas into a treatment chamber of a sputtering apparatus; the pressure in the treatment chamber was controlled to 0.6 Pa; and a direct-current power of 5 kW was supplied.

The third oxide semiconductor film was formed in succession over the second oxide semiconductor film in a vacuum. The third oxide semiconductor film was formed under the following conditions: a sputtering target where In:Ga:Zn=1:3:2 (atomic ratio) was used; oxygen with a flow rate of 30 sccm and argon with a flow rate of 270 sccm were supplied as a sputtering gas into a treatment chamber of a sputtering apparatus; the pressure in the treatment chamber was controlled to 0.6 Pa; and a direct-current power of 5 kW was supplied. Note that the first, second, and third oxide semiconductor films were each formed at a substrate temperature of 170° C.

Since Sample 3 has the same structure as that of Sample 1 except the structure of the oxide semiconductor film 518, Sample 1 can be referred to for the formation of Sample 3.

(Sample 4)

Figure 19A:
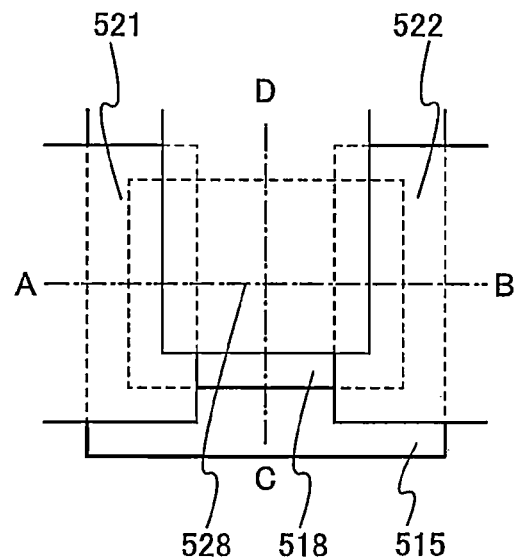
FIGS. 19A to 19C are a top view and cross-sectional views illustrating one embodiment of a transistor.
Figure 19C:
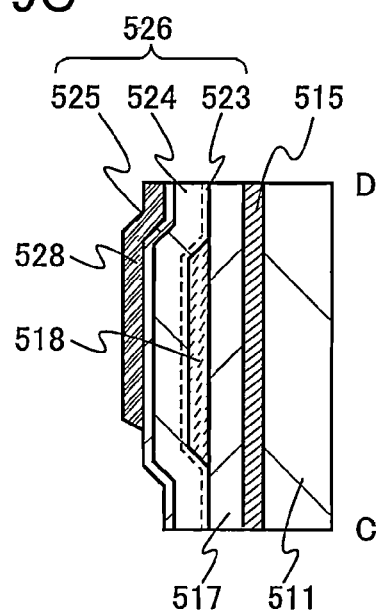
Figure 19B:
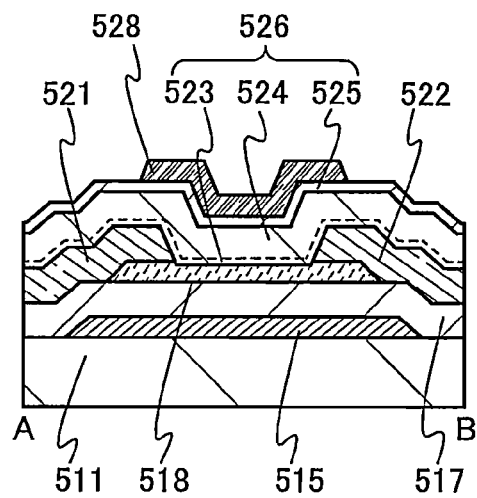
Figure 20A:
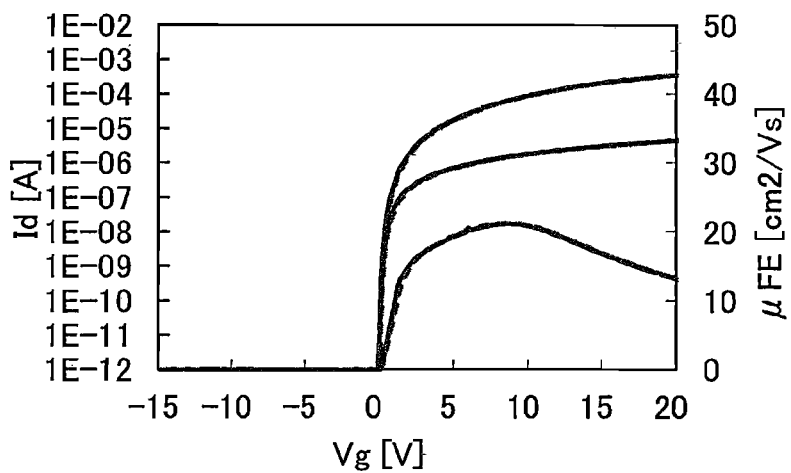
FIGS. 20A to 20C each show $V_g$-$I_d$ characteristics of a transistor.
Figure 20B:
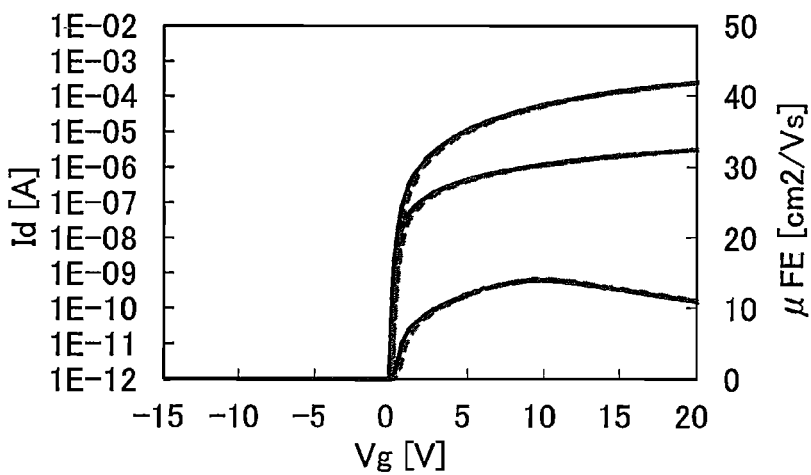
Figure 20C:
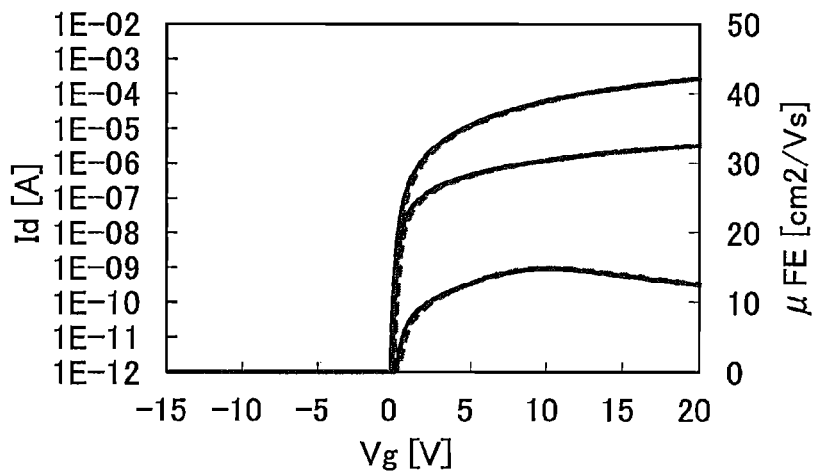
Figure 21A:
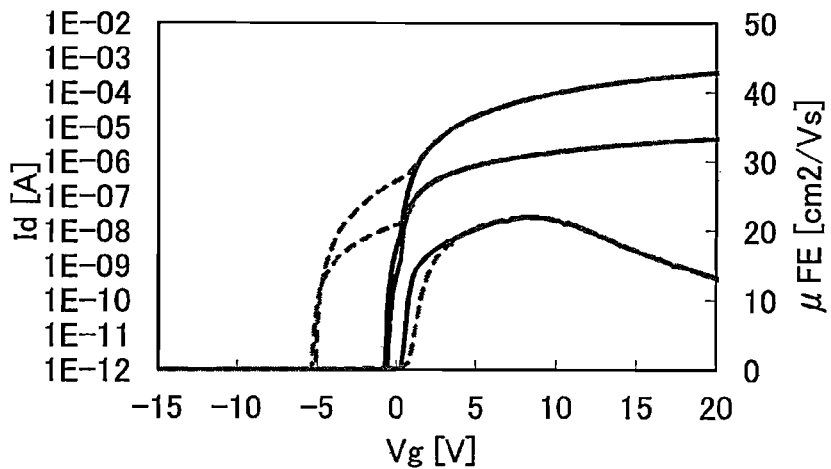
FIGS. 21A to 21C each show $V_g$ $I_d$ characteristics of a transistor after a GBT test.
Figure 21B:
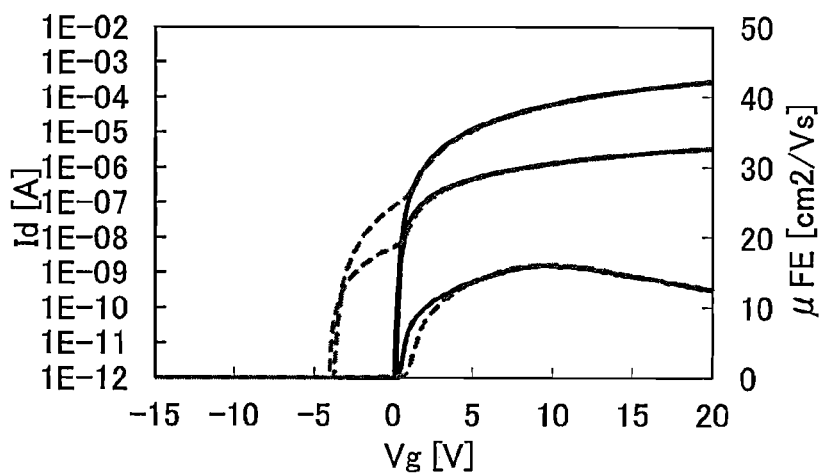
Figure 21C:
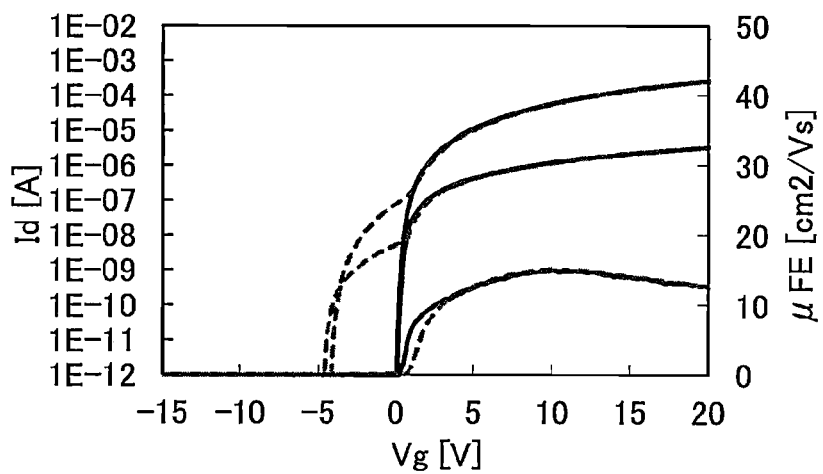

Sample 4 includes the substrate 511; the gate electrode 515 over the substrate 511; the gate insulating film 517 over the substrate 511 and the gate electrode 515; the oxide semiconductor film 518 that is over the gate insulating film 517 and in a region overlapping with the gate electrode 515; the pair of electrodes 521 and 522 over the gate insulating film 517 and the oxide semiconductor film 518; the protective film 526 over the oxide semiconductor film 518 and the pair of electrodes 521 and 522; and a back gate electrode 528 that is over the protective film 526 and in a region overlapping with the gate electrode 515 (see FIGS. 19A to 19C).

Note that the protective film 526 has a three-layer structure of the oxide insulating film 523, the oxide insulating film 524, and the nitride insulating film 525. As illustrated in FIG. 19B, the back gate electrode 528 was formed so as to be positioned on the inner side of end portions of the oxide semiconductor film 518. As illustrated in FIG. 19C, the back gate electrode 528 was formed so as to be positioned on the inner side of the oxide semiconductor film 518 with the protective film 526 positioned therebetween. Note that in FIG. 19C, an end portion of the back gate electrode 528 extends beyond the oxide semiconductor film 518.

Next, a fabrication method of the sample 4 illustrated in FIGS. 19A to 19C is described below.

Up to the step of forming the protective film 526, the same manufacturing process as that of Sample 1 described above was performed.

Next, an oxide insulating film (not illustrated) was formed over the protective film 526. The oxide insulating film was formed by a plasma CVD method under the following conditions: tetraethoxysilane (TEOS: $Si(OC_2H_5)_4$), which is an organosilane gas, with a flow rate of 200 sccm and oxygen with a flow rate of 10000 sccm were used as the source gas, the pressure in the treatment chamber was 175 Pa, the substrate temperature was 350° C., and a high-frequency power of 3300 W was supplied to the parallel-plate electrodes.

Then, the back gate electrode 527 was formed over the oxide insulating film that was over the protective film 526. Here, as the back gate electrode 527, a 100-nm-thick conductive film of an indium oxide-tin oxide compound (ITO—$SiO_2$) was formed by a sputtering method. Note that the composition of a target used for forming the conductive film was $In_2O_3$:$SnO_2$:$SiO_2$=85:10:5 [wt %]. After that, heat treatment was performed at 250° C. in a nitrogen atmosphere for one hour.

Through the above process, Sample 4 of this example was fabricated.

(Sample 5)

Sample 5 differs from Sample 4 in the structure of the oxide semiconductor film 518. Specifically, the oxide semiconductor film 518 in Sample 5 has a stacked-layer structure of a first oxide semiconductor film and a second oxide semiconductor film.

First, the first oxide semiconductor film was formed under the following conditions: a sputtering target where In:Ga:Zn=3:1:2 (atomic ratio) was used; oxygen with a flow rate of 100 sccm and argon with a flow rate of 100 sccm were supplied as a sputtering gas into a treatment chamber of a sputtering apparatus; the pressure in the treatment chamber was controlled to 0.6 Pa; and a direct-current power of 5 kW was supplied.

The second oxide semiconductor film was formed in succession over the first oxide semiconductor film in a vacuum. The second oxide semiconductor film was formed in such a manner that a sputtering target where In:Ga:Zn=1:3:2 (atomic ratio) was used, oxygen with a flow rate of 30 sccm and argon with a flow rate of 270 sccm were supplied as sputtering gases into a treatment chamber of a sputtering apparatus, the pressure in the treatment chamber was adjusted to 0.6 Pa, and a direct-current power of 5 kW was supplied. Note that the first and second oxide semiconductor films were each formed at a substrate temperature of 170° C.

Since Sample 5 has the same structure as that of Sample 4 except the structure of the oxide semiconductor film 518, Sample 4 can be referred to for the formation of Sample 5.

(Sample 6)

Sample 6 differs from Sample 4 in the structure of the oxide semiconductor film 518. Specifically, the oxide semiconductor film 518 in Sample 6 has a stacked-layer structure of a first oxide semiconductor film, a second oxide semiconductor film, and a third oxide semiconductor film.

First, the first oxide semiconductor film was formed in such a manner that a sputtering target where In:Ga:Zn=1:3:2 (atomic ratio) was used, oxygen with a flow rate of 30 sccm and argon with a flow rate of 270 sccm were supplied as sputtering gases into a treatment chamber of a sputtering apparatus, the pressure in the treatment chamber was adjusted to 0.6 Pa, and a direct-current power of 5 kW was supplied.

The second oxide semiconductor film was formed in succession over the first oxide semiconductor film in a vacuum. The second oxide semiconductor film was formed under the following conditions: a sputtering target where In:Ga:Zn=3:1:2 (atomic ratio) was used; oxygen with a flow rate of 100 sccm and argon with a flow rate of 100 sccm were supplied as a sputtering gas into a treatment chamber of a sputtering apparatus; the pressure in the treatment chamber was controlled to 0.6 Pa; and a direct-current power of 5 kW was supplied.

The third oxide semiconductor film was formed in succession over the first oxide semiconductor film in a vacuum. The third oxide semiconductor film was formed under the following conditions: a sputtering target where In:Ga:Zn=1:3:2 (atomic ratio) was used; oxygen with a flow rate of 30 sccm and argon with a flow rate of 270 sccm were supplied as a sputtering gas into a treatment chamber of a sputtering apparatus; the pressure in the treatment chamber was controlled to 0.6 Pa; and a direct-current power of 5 kW was supplied. Note that the first, second, and third oxide semiconductor films were each formed at a substrate temperature of 170° C.

Since Sample 6 has the same structure as that of Sample 4 except the structure of the oxide semiconductor film 518, Sample 4 can be referred to for the formation of Sample 6.

Note that in each of the fabricated Samples 1 to 6, the channel length (L) is 6 μm and the channel width (W) is 50 μm.

<$V_g$-$I_d$ Characteristics>

Next, initial $V_g$-$I_d$ characteristics of the transistors included in Samples 1 to 6 were measured. Here, change in characteristics of current flowing between a source electrode and a drain electrode (hereinafter referred to as the drain current), that is, $V_g$ $I_d$ characteristics were measured under the following conditions: the substrate temperature was 25° C., the potential difference between the source and drain electrodes (hereinafter referred to as the drain voltage) was 1 V or 10 V, and the potential difference between the source electrode and the gate electrode (hereinafter referred to as the gate voltage) were changed from −15 V to +20 V.

<GBT Stress Test>

Next, Samples 1 to 6 that have been subjected to the measurement of initial characteristics were each subjected to a GBT stress test (hereinafter, a GBT test). The conditions of the GBT test were as follows: the substrate temperature was 60° C.; the measurement environment was a dark room (dark environment); the gate voltage was +30 V; and stress was applied to Samples 1 to 6 for 1 hour. Note that the GBT test is one kind of accelerated test and can evaluate, in a short time, a change in characteristics (i.e., change over time) of a transistor, which is caused by long-term use. The amount of change in characteristics of the transistor between before and after the GBT test is an important indicator when examining the reliability of the transistor.

FIG. 20A, FIG. 20B, FIG. 20C, FIG. 21A, FIG. 21B, and FIG. 21C show initial $V_g$-$I_d$ characteristics and $V_g$-$I_d$ characteristics after the GBT test of transistors of Sample 1, Sample 2, Sample 3, Sample 4, Sample 5, and Sample 6, respectively.

In each of graphs in FIGS. 20A to 20C and FIGS. 21A to 21C, the horizontal axis indicates a gate voltage $V_g$, the first vertical axis indicates drain current $I_d$, and the second vertical axis indicates field-effect mobility μFE.

Note that a voltage range of −15 V to 20 V is represented along the horizontal axis. Further, the solid lines indicate the initial $V_g$-$I_d$ characteristics at the drain voltages $V_g$ of 1 V and 10 V and the initial field-effect mobility with respect to the gate voltage at a gate voltage $V_g$ of 10 V. Further, the dashed lines indicate the $V_g$-$I_d$ characteristics after the GBT test at the drain voltages $V_d$ of 1 V and 10 V and the field-effect mobility after the GBT test with respect to the gate voltage at a gate voltage $V_g$ of 10 V. Note that the field-effect mobility was obtained by operation of each sample in a saturation region.

Further, in each of the samples, 20 transistors having the same structure were formed on the substrate. Thus, in each of graphs in FIGS. 20A to 20C and FIGS. 21A to 21C, data of the 20 transistors were shown together.

FIGS. 20A to 20C and FIGS. 21A to 21C show that Samples 1 to 6 have favorable initial switching characteristics shown by the solid lines. Characteristics after the GBT test shown by the dashed lines in Samples 1 to 3 are hardly changed from the initial characteristics, or the change is extremely small (that is, the dashed lines overlap with the solid lines). In contrast, in Samples 4 to 6 shown in FIGS. 21A to 21C, there are big changes between the initial characteristics shown by the solid lines and the characteristics after the GBT test shown by the dashed lines. Specifically, the rising voltages are shifted in the negative direction after the GBT test. Further, in each of FIGS. 21A to 21C, there are two peaks when the gate voltage $V_g$ is increased from a negative voltage to a positive voltage.

Samples 1 to 3, which are embodiments of the present invention, differ from Samples 4 to 6 for comparison mainly in the shape of the back gate electrodes (the back gate electrodes 527 and 528). In Samples 1 to 3, which are embodiments of the present invention, the back gate electrode 527 covers the oxide semiconductor film 518 and overlaps with end portions of the gate electrode 515. In other words, side surfaces of a channel portion of the oxide semiconductor film 518 are covered with upper and lower gate electrodes (the gate electrode 515 and the back gate electrode 527). Further, in other words, the upper gate electrode (the back gate electrode 527) faces the lower gate electrode (the gate electrode 515) with dielectrics (the gate insulating film 517 and the protective film 526) positioned therebetween at the outer side of the side surfaces of the channel portion of the oxide semiconductor film 518.

In contrast, in Samples 4 to 6 for comparison, the back gate electrode 528 is formed on the inner side of the end portions of the oxide semiconductor film 518.

After the GBT test, a parasitic channel tends to be formed at the outer side of the side surfaces of the channel portion of the oxide semiconductor film 518. In Samples 1 to 3, which are embodiments of the present invention, portions that are on the outer side of the side surfaces of the channel portion of the oxide semiconductor film 518 are covered with the upper and lower gate electrodes (the gate electrode 515 and the back gate electrode 527). Thus, with the upper and lower gate electrodes, a parasitic channel that can be formed at the outer side of the side surfaces of the channel portion of the oxide semiconductor film 518 can be prevented from being formed or an influence of the parasitic channel can be reduced.

EXAMPLE 2

In this example, life estimation of a device based on degradation characteristics after the GBT test is described.

In this example, Sample 7 that is one embodiment of the present invention was fabricated, and Samples 8 to 10 were used for comparison. Sample 7, which is one embodiment of the present invention, is described with reference to FIGS. 22A to 22C, and Samples 8 to 10 for comparison are described with reference to FIGS. 23A to 23C and FIGS. 24A to 24C.

(Sample 7)

Figure 22A:
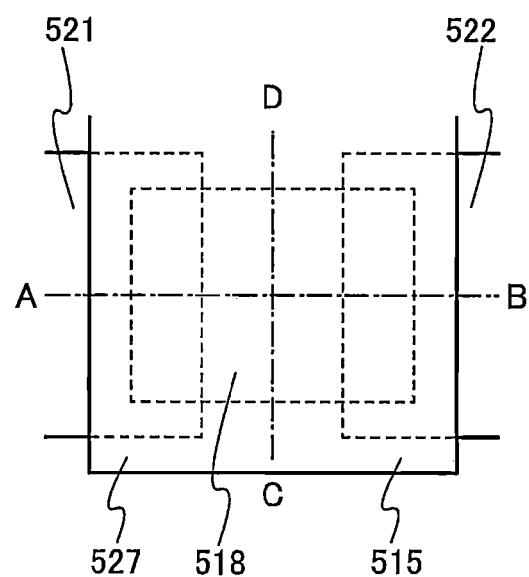
FIGS. 22A to 22C are a top view and cross-sectional views illustrating one embodiment of a transistor.
Figure 22C:
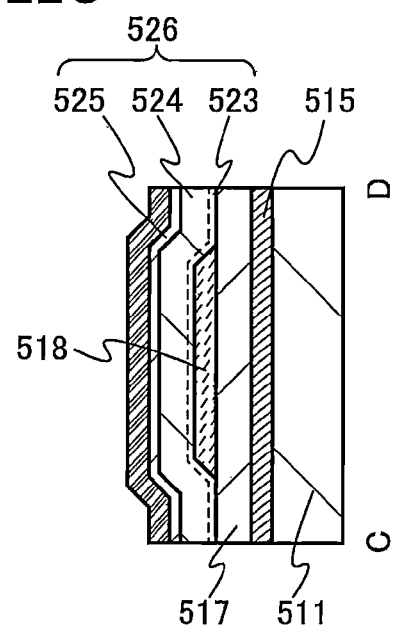
Figure 22B:
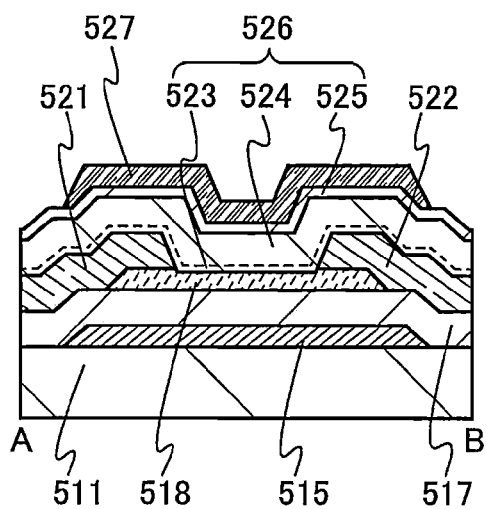

Sample 7 includes the substrate 511; the gate electrode 515 over the substrate 511; the gate insulating film 517 over the substrate 511 and the gate electrode 515; the oxide semiconductor film 518 that is over the gate insulating film 517 and in a region overlapping with the gate electrode 515; the pair of electrodes 521 and 522 over the gate insulating film 517 and the oxide semiconductor film 518; the protective film 526 over the oxide semiconductor film 518 and the pair of electrodes 521 and 522; and the back gate electrode 527 that is over the protective film 526 and in a region overlapping with the gate electrode 515 (see FIGS. 22A to 22C).

Note that the protective film 526 has a three-layer structure of the oxide insulating film 523, the oxide insulating film 524, and the nitride insulating film 525. As illustrated in FIG. 22B, the both end portions of the back gate electrode 527 are substantially aligned with those of the gate electrode 515. As illustrated in FIG. 22C, the back gate electrode 527 is formed to cover the oxide semiconductor film 518 with the protective film 526 positioned therebetween.

Note that a fabrication method of Sample 7 in FIGS. 22A to 22C is the same as that as Sample 1 described in Example 1. Thus, Sample 1 can be referred to for the formation of Sample 7.

(Sample 8)

Figure 23A:
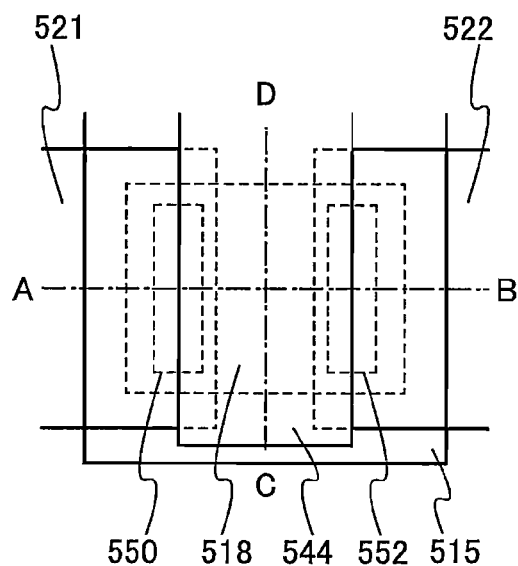
FIGS. 23A to 23C are a top view and cross-sectional views illustrating one embodiment of a transistor.
Figure 23C:
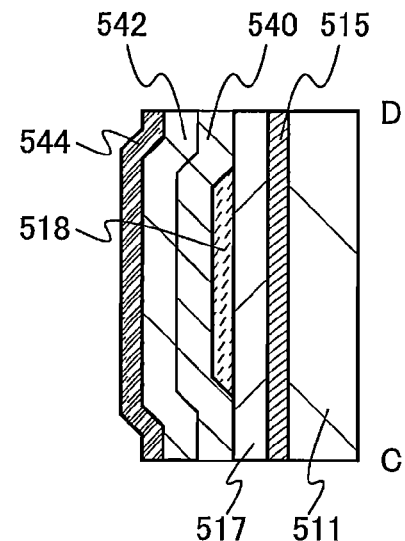
Figure 23B:
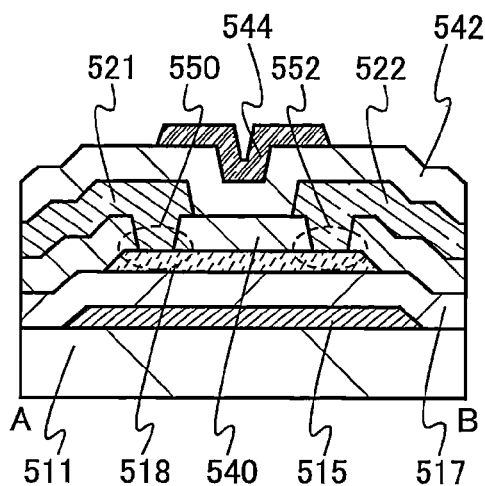

Sample 8 includes the substrate 511; the gate electrode 515 over the substrate 511; the gate insulating film 517 over the substrate 511 and the gate electrode 515; the oxide semiconductor film 518 that is over the gate insulating film 517 and in a region overlapping with the gate electrode 515; a protective film 540 that is over the oxide semiconductor film 518 and has a pair of openings 550 and 552 reaching the oxide semiconductor film 518; the pair of electrodes 521 and 522 that are over the protective film 540 and in contact with the oxide semiconductor film 518; a protective film 542 over the protective film 540 and the pair of electrodes 521 and 522; and a back gate electrode 544 that is over the protective film 542 and in a region overlapping with the gate electrode 515 (see FIGS. 23A to 23C).

As illustrated in FIG. 23B, the back gate electrode 544 was formed so that end portions of the back gate electrode 544 were positioned on the inner side of end portions of the gate electrode 515. As illustrated in FIG. 23C, the back gate electrode 544 was formed so as to cover the oxide semiconductor film 518 with the protective films 540 and 542 positioned therebetween.

The structure of Sample 8 in FIGS. 23A to 23C is described below.

The gate electrode 515 is positioned over the substrate 511. The gate electrode 515 is a stacked layer including a 30-nm-thick Mo—Ti film and a 315-nm-thick Cu film.

The gate insulating film 517 is positioned over the gate electrode 515. The gate insulating film 517 is a stacked layer including a 30-nm-thick silicon nitride film and a 400-nm-thick silicon oxide film.

The oxide semiconductor film 518 is positioned over the gate insulating film 517. The oxide semiconductor film 518 is a 50-nm-thick IGZO film.

The protective film 540 having the openings 550 and 552 is positioned over the oxide semiconductor film 518. The protective film 540 is a 100-nm-thick silicon oxide film.

The pair of electrodes 521 and 522 are positioned over the protective film 540 to cover the openings 550 and 552. The electrodes 521 and 522 are each a stacked layer including a 30-nm-thick Mo—Ti film and a 425-nm-thick Cu film.

The protective film 542 is positioned over the protective film 540 and the electrodes 521 and 522. The protective film 542 is a 325-nm-thick silicon oxide film.

The back gate electrode 544 is positioned over the protective film 542. The back gate electrode 544 is a stacked layer including a 30-nm-thick Mo—Ti film and a 10-nm-thick ITO film.

(Sample 9)

Figure 24A:
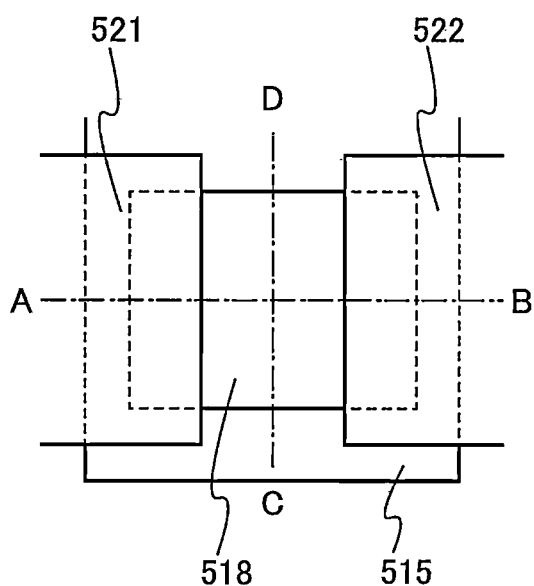
FIGS. 24A to 24C are a top view and cross-sectional views illustrating one embodiment of a transistor.
Figure 24C:
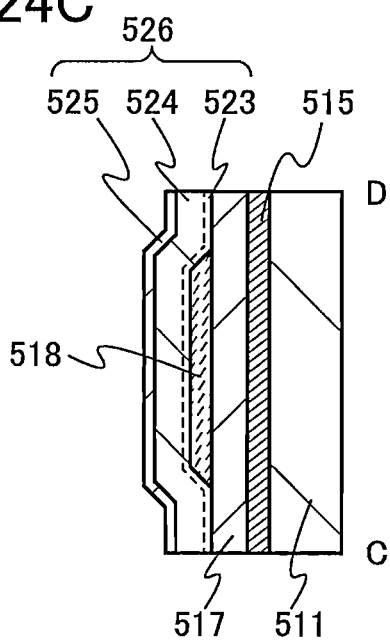
Figure 24B:
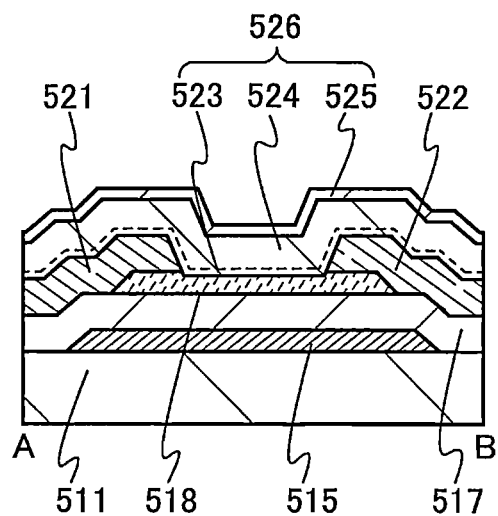

Sample 9 includes the substrate 511; the gate electrode 515 over the substrate 511; the gate insulating film 517 over the substrate 511 and the gate electrode 515; the oxide semiconductor film 518 that is over the gate insulating film 517 and in a region overlapping with the gate electrode 515; the pair of electrodes 521 and 522 over the gate insulating film 517 and the oxide semiconductor film 518; and the protective film 526 over the oxide semiconductor film 518 and the pair of electrodes 521 and 522 (see FIGS. 24A to 24C).

Note that the protective film 526 has a three-layer structure of the oxide insulating film 523, the oxide insulating film 524, and the nitride insulating film 525.

Sample 9 differs from Sample 7 in that no back gate electrode is provided.

Next, a fabrication method of the sample 9 illustrated in FIGS. 24A to 24C is described below.

The gate electrode 515 was formed over the substrate 511. A 10-nm-thick tungsten film was used as the gate electrode 515.

Next, the gate insulating film 517 was formed over the gate electrode 515. As the gate insulating film 517, a stacked layer including a 400-nm-thick silicon nitride film and a 50-nm-thick silicon oxynitride film was formed.

Then, the oxide semiconductor film 518 was formed over the gate insulating film 517. The oxide semiconductor film 518 was formed using a 35-nm-thick IGZO film. The IGZO film was formed using a target having an atomic ratio of In:Ga:Zn=1:1:1.

Next, the pair of electrodes 521 and 522 were formed over the oxide semiconductor film 518. The electrodes 521 and 522 were formed using a stacked layer of a 50-nm-thick tungsten film, a 400-nm-thick aluminum film, and a 200-nm-thick titanium film.

Next, the protective film 526 was formed over the oxide semiconductor film 518 and the electrodes 521 and 522. The protective film 526 was formed using a 50-nm-thick silicon oxynitride film, a 400-nm-thick silicon oxynitride film, and a 100-nm-thick silicon nitride film. The 50-nm-thick silicon oxynitride film was formed at a substrate temperature of 350° C. The 400-nm-thick silicon oxynitride film and the 100-nm-thick silicon nitride film were formed at a substrate temperature of 220° C.

Through the above process, Sample 9 was fabricated.

(Sample 10)

Sample 10 differs from Sample 9 described above in the structure of the oxide semiconductor film 518 and in heat treatment after the formation of the oxide semiconductor film 518.

Specifically, the oxide semiconductor film 518 in Sample 10 has a stacked-layer structure of a first oxide semiconductor film and a second oxide semiconductor film. The first oxide semiconductor film was formed using a 35-nm-thick IGZO film. The first oxide semiconductor film was formed using a target having an atomic ratio of In:Ga:Zn=1:1:1. The second oxide semiconductor film was formed using a 20-nm-thick IGZO film. The second oxide semiconductor film was formed using a target having an atomic ratio of In:Ga:Zn=1:3:2.

After the oxide semiconductor film 518 of Sample 10 was formed, heat treatment was performed at 450° C. for 1 hour in a nitrogen atmosphere.

Through the above process, Sample 10 was formed. The steps except the above-described steps of Sample 10 are the same as those of Sample 9. Thus, in order to fabricate Sample 10, the above description can be referred to.

Note that in each of the transistors of Samples 7, 9, and 10, the channel length (L) is 6 μm and the channel width (W) is 50 μm. In the transistor of Sample 8, the channel length (L) is 10.2 μm and the channel width (W) is 82.6 μm.

<Life Estimation of Device Based on Positive GBT Test>

Next, a positive GBT test was performed on Samples 7 to 10 that were fabricated in the above-described manner. Here, the conditions of the GBT stress test were as follows: the substrate temperature was 60° C.; the measurement environment was a dark room (dark environment); the gate voltage was +30 V; and stress time was varied.

Note that in each of Sample 7, Sample 9, and Sample 10, the amount of change in the threshold voltage was measured with a stress time of 100 seconds, 500 seconds, 1500 seconds, 2000 seconds, and 3600 seconds. In Sample 8, the amount of change in the threshold voltage was measured with a stress time of 100 seconds, 300 seconds, 600 seconds, 1000 seconds, 1800 seconds, and 3600 seconds.

Figure 25:
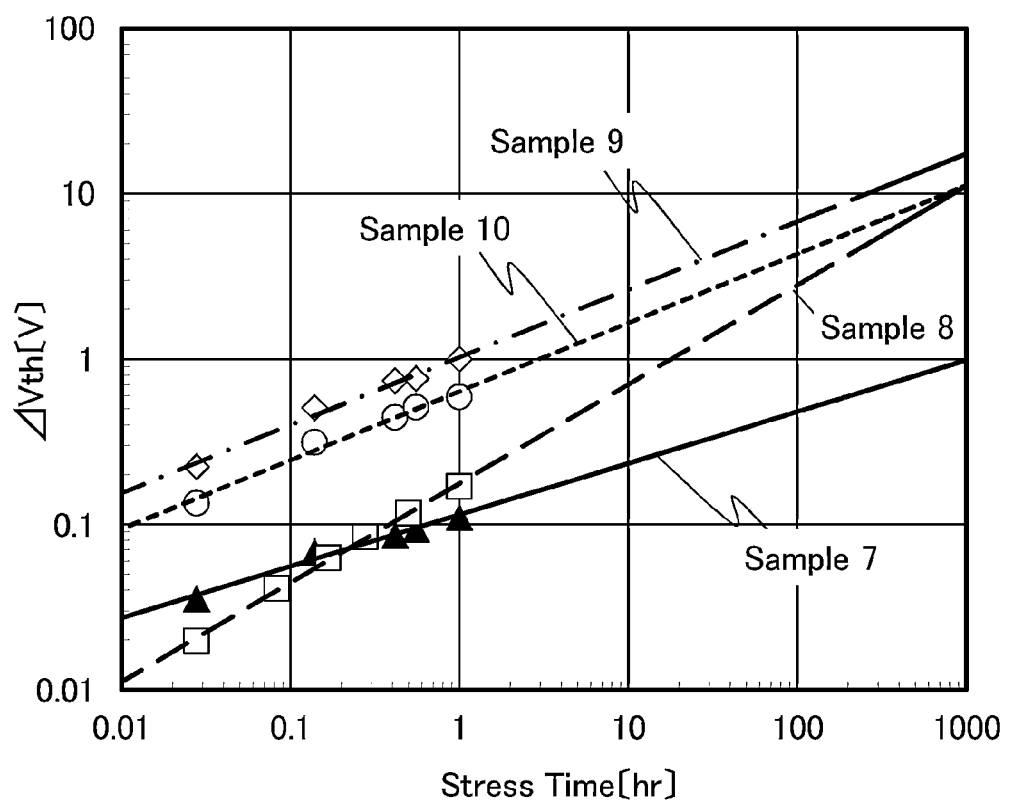
FIG. 25 is a graph for describing $\Delta V_{th}$ of a transistor with respect to stress time.

FIG. 25 shows the amounts of change in threshold voltage in each stress time and approximate lines obtained from the amounts of change of Samples 7 to 10. Note that all of the approximate lines in FIG. 25 are power approximate lines. FIG. 25 is a log-log graph. In FIG. 25, the horizontal axis indicates stress time and the vertical axis indicates the amount of change in the threshold voltage ($\Delta V_{th}$). In the log-log graph of FIG. 25, the interval of the logarithmic scale on the horizontal axis is equal to that on the vertical axis.

As seen from the results shown in the log-log graph of FIG. 25, in Sample 7, which is one embodiment of the present invention, the angle between the power approximate line of the amount of change in the threshold voltage with respect to stress time and a straight line indicating that the amount of change in the threshold voltage is 0 V is approximately 17 degrees. Further, the amount of change in the threshold voltage when the stress time is 0.1 hours is approximately 0.06 V. The slope of the power approximate line of Sample 7 is 0.3119 V/hr.

In Sample 8 for comparison, in the log-log graph, the angle between the power approximate line of the amount of change in the threshold voltage with respect to stress time and a straight line indicating that the amount of change in the threshold voltage is 0 V is approximately 31 degrees. Further, the amount of change in the threshold voltage when the stress time is 0.1 hours is approximately 0.05 V. The slope of the power approximate line of Sample 8 is 0.5993 V/hr.

In Sample 9 for comparison, in the log-log graph, the angle between the power approximate line of the amount of change in the threshold voltage with respect to stress time and a straight line indicating that the amount of change in the threshold voltage is 0 V is approximately 24 degrees. Further, the amount of change in the threshold voltage when the stress time is 0.1 hours is approximately 0.4 V. The slope of the power approximate line of Sample 9 is 0.41 V/hr.

In Sample 10 for comparison, in the log-log graph, the angle between the power approximate line of the amount of change in the threshold voltage with respect to stress time and a straight line indicating that the amount of change in the threshold voltage is 0 V is approximately 27 degrees. Further, the amount of change in the threshold voltage when the stress time is 0.1 hours is approximately 0.02 V. The slope of the power approximate line of Sample 10 is 0.4153 V/hr.

As illustrated in the log-log graph of FIG. 25, in Sample 7, which is one embodiment of the present invention, the angle between the power approximate line of the amount of change in the threshold voltage with respect to stress time and a straight line indicating that the amount of change in the threshold voltage is 0 V is less than 30 degrees, and the amount of change in the threshold voltage when the stress time is 0.1 hours is smaller than 0.02 V. In a semiconductor device having such an angle and such an amount of change in the threshold voltage, the amount of change in the threshold voltage becomes small. It is confirmed that the amount of change in transistor characteristics can be reduced in Sample 7, which is one embodiment of the present invention, with a structure in which side surfaces of a channel formation region of the oxide semiconductor film are covered with the upper and lower gate electrodes.

This application is based on Japanese Patent Application serial no. 2013-104583 filed with Japan Patent Office on May 16, 2013, the entire contents of which are hereby incorporated by reference.

What is claimed is:

1. A semiconductor device comprising:
   a transistor comprising:
      a first gate electrode over an insulating surface;
      an oxide semiconductor film overlapping with the first gate electrode;
      a first gate insulating film between the first gate electrode and the oxide semiconductor film;
      a pair of electrodes electrically connected to the oxide semiconductor film;
      a second gate insulating film over and in contact with a top surface of the oxide semiconductor film; and
      a second gate electrode overlapping with the oxide semiconductor film with the second gate insulating film positioned therebetween,
   wherein in a log-log graph of an amount of change in a threshold voltage of the transistor with respect to a time during which a load is applied to the transistor, an interval of a logarithmic scale on a horizontal axis is equal to an interval of a logarithmic scale on a vertical axis,
   wherein in the log-log graph, an angle between a power approximate line of the amount of change in the threshold voltage with respect to the time and a straight line of the amount of change in the threshold voltage with respect to the time is 0 V is less than or equal to 30 degrees, and
   wherein in the log-log graph, the amount of change in the threshold voltage when the time is 0.1 hours is smaller than 0.2 V.

2. The semiconductor device according to claim 1, wherein in a channel width direction of the transistor, a side surface of each of the first gate electrode and the second gate electrode extends beyond a side surface of the oxide semiconductor film.

3. The semiconductor device according to claim 1, wherein the second gate electrode faces a side surface of the oxide semiconductor film with the second gate insulating film positioned therebetween.

4. The semiconductor device according to claim 1, wherein in a region where the oxide semiconductor film does not overlap with both of the first gate electrode and the second gate electrode, the first gate electrode faces the second gate electrode with the first gate insulating film and the second gate insulating film positioned between the first gate electrode and the second gate electrode.

5. The semiconductor device according to claim 1, wherein the first gate electrode is electrically connected to the second gate electrode.

6. The semiconductor device according to claim 1,
   wherein the oxide semiconductor film comprises a first portion below one of the pair of electrodes, a second portion below the other of the pair of electrodes, and a recessed portion between the first portion and the second portion,
   wherein a thickness of the first portion is larger than a thickness of the recessed portion, and
   wherein a thickness of the second portion is larger than the thickness of the recessed portion.

7. The semiconductor device according to claim 1, wherein a distance between the pair of electrodes is greater than or equal to 1 µm and less than 4 µm.

8. The semiconductor device according to claim 1, wherein the oxide semiconductor film comprises an oxide containing In, Zn, and an element selected from the group consisting of Al, Ga, Y, Zr, La, Ce, and Nd, and
   wherein the oxide semiconductor film is formed using a sputtering target in which a proportion of In is higher than a proportion of the element in an atomic ratio.

9. The semiconductor device according to claim 1, wherein the pair of electrodes are positioned between the first gate insulating film and the oxide semiconductor film.

10. The semiconductor device according to claim 1, wherein the pair of electrodes are positioned between the second gate insulating film and the oxide semiconductor film.

11. The semiconductor device according to claim 1,
   wherein the load includes a gate voltage of +30V and a substrate temperature of 60° C., and
   wherein the transistor is formed over the substrate.

12. A semiconductor device comprising:
   a transistor comprising:
   a first gate electrode over an insulating surface;
   an oxide semiconductor film overlapping with the first gate electrode;
   a first gate insulating film between the first gate electrode and the oxide semiconductor film;
   a pair of electrodes electrically connected to the oxide semiconductor film;
   a second gate insulating film over and in contact with a top surface of the oxide semiconductor film; and
   a second gate electrode overlapping with the oxide semiconductor film with the second gate insulating file positioned therebetween,
   wherein in a log-log graph of an amount of change in a threshold voltage of the transistor with respect to a time during which a load is applied to the transistor, a slope of a power approximate line of the amount of change in the threshold voltage with respect to the time is less than or equal to 0.5, and
   wherein in the log-log graph, the amount of change in the threshold voltage when the time is 0.1 hours is smaller than 0.2 V.

13. The semiconductor device according to claim 12, wherein in a channel width direction of the transistor, a side surface of each of the first gate electrode and the second gate electrode extends beyond a side surface of the oxide semiconductor film.

14. The semiconductor device according to claim 12, wherein the second gate electrode faces a side surface of the oxide semiconductor film with the second gate insulating film positioned therebetween.

15. The semiconductor device according to claim 12, wherein in a region where the oxide semiconductor film does not overlap with both of the first gate electrode and the second gate electrode, the first gate electrode faces the second gate electrode with the first gate insulating film and the second gate insulating film positioned between the first gate electrode and the second gate electrode.

16. The semiconductor device according to claim 12, wherein the first gate electrode is electrically connected to the second gate electrode.

17. The semiconductor device according to claim 12,
wherein the oxide semiconductor film comprises a first portion below one of the pair of electrodes, a second portion below the other of the pair of electrodes, and a recessed portion between the first portion and the second portion,
wherein a thickness of the first portion is larger than a thickness of the recessed portion, and
wherein a thickness of the second portion is larger than the thickness of the recessed portion.

18. The semiconductor device according to claim 12, wherein a distance between the pair of electrodes is greater than or equal to 1 µm and less than 4 µm.

19. The semiconductor device according to claim 12, wherein the oxide semiconductor film comprises an oxide containing In, Zn, and an element selected from the group consisting of Al, Ga, Y, Zr, La, Ce, and Nd, and
wherein the oxide semiconductor film is formed using a sputtering target in which a proportion of In is higher than a proportion of the element in an atomic ratio.

20. The semiconductor device according to claim 12, wherein the pair of electrodes are positioned between the first gate insulating film and the oxide semiconductor film.

21. The semiconductor device according to claim 12, wherein the pair of electrodes are positioned between the second gate insulating film and the oxide semiconductor film.

22. The semiconductor device according to claim 12,
wherein the load includes a gate voltage of +30V and a substrate temperature of 60° C., and
wherein the transistor is formed over the substrate.

* * * * *